United States Patent [19]
Kanno

[11] Patent Number: 5,495,409
[45] Date of Patent: Feb. 27, 1996

[54] CONSTRUCTING METHOD OF FINITE-STATE MACHINE PERFORMING TRANSITIONS ACCORDING TO A PARTIAL TYPE OF SUCCESS FUNCTION AND A FAILURE FUNCTION

[75] Inventor: Yuji Kanno, Tokyo, Japan

[73] Assignee: Matsushita Electric Industrial Co., Ltd., Osaka, Japan

[21] Appl. No.: 331,260

[22] Filed: Oct. 28, 1994

[30] Foreign Application Priority Data

Oct. 29, 1993 [JP] Japan .................................. 5-272304

[51] Int. Cl.[6] ........................... G06F 17/10; G06F 19/00
[52] U.S. Cl. ............... 364/184; 364/419.19; 364/551.01; 395/600
[58] Field of Search .............................. 364/184, 419.01, 364/419.11, 419.13, 419.19, 578, DIG. 1, 253.1, 259.4, 225.4, DIG. 2, 956.1, 963.1, 963.3, 550, 551.01, 167.01, 140–147; 382/229–231, 305; 395/600

[56] References Cited

U.S. PATENT DOCUMENTS

| | | | |
|---|---|---|---|
| 4,799,141 | 1/1989 | Drusinsky et al. | 364/141 |
| 4,985,863 | 1/1991 | Fujisawa et al. | 364/900 |
| 5,051,886 | 9/1991 | Kawaguchi et al. | 364/200 |
| 5,163,016 | 11/1992 | Har'El | 364/578 |
| 5,265,242 | 11/1993 | Fujisawa et al. | 364/DIG. 1 |
| 5,278,981 | 1/1994 | Kawaguchi et al. | 364/DIG. 1 |
| 5,388,234 | 2/1995 | Kanno et al. | 364/DIG. 2 |
| 5,406,480 | 4/1995 | Kanno | 364/419.11 X |

OTHER PUBLICATIONS

Computation: Finite and Infinite Machines; by Minsky: 1967.
"Regular Expressions and State Graphs for Automata" by McNaughton et al; 1960.
"Automata and Theory of Languages", E. Tomita et al., Morikita Press; May 1992.
"Theory of Automata", Arto Salomaa, Pergamon Press, 1969.
"Theory of Automata", Toshio Kitagawa et al., 1974, Kyoritsu Press.
"Formal Languages and Their Relation to Automata", John Hopcroft et al., 1964.
"Language Theory and Automa", translated by Akihiro Nozaki et al., Science Inc., 1971.
"Fast Pattern Matching in Strings", Donald Knuth et al., Siam J. Comput., vol. 6, No. 2, Jun. 1977.
"High Speed Pattern Matching Algorithm for Processing All Sentences of a Text", Masayuki Takeda, 1991 Information Study Symposium.

*Primary Examiner*—Joseph Ruggiero
*Attorney, Agent, or Firm*—Lowe, Price, LeBlanc & Becker

[57] ABSTRACT

A constructing method of a finite state machine with failure transitions FFM is disclosed. The machine FFM is constructed from a nondeterministic finite-state machine and a string of external inputs. States <p,q> in the machine FFM is formed of a state set q included in the nondeterministic finite-state machine and a set p defined as a subset of the state set q, and the number of states <p,q> is finite. Also, an external input c takes the machine FFM from a current state s to a next state g(s,c) and an output μ(s) is output from the next state g(s,c) in cases where a value g(s,c) of a success function g is defined, and an external input c takes the machine FFM from the current state s to a state g(f(f...f(s)...)) determined by repeatedly calculating a value f(s) of a failure function f until a value g(f(f...f(s)...)) defined is found out in cases where the value g(s,c) of the success function g is not defined. Because all of transitions from the current state s for all external inputs c are not defined by the success function g, a storage capacity for storing the machine FFM is considerably reduced.

21 Claims, 35 Drawing Sheets

| STATES OF DETERMINISTIC MOORE MACHINE | VALUES OF STATE-TRANSITION FUNCTION δ' | | | | OUTPUTS λ(P) OF MACHINE DM0 |
|---|---|---|---|---|---|
| | A0B1 | A1B0 | A1B1 | A0B0 | |
| t0={S0} | {S2} | {S1, S2} | φ | φ | φ |
| t1=φ | φ | φ | φ | φ | φ |
| t2={S1, S2} | φ | {S1, S2, S3, S4} | {S4} | φ | φ |
| t3={S2} | φ | {S4} | {S4} | φ | φ |
| t4={S1, S2, S3, S4} | {S3} | {S1, S2, S3, S4} | {S4, S5} | φ | φ |
| t5={S4} | {S3} | φ | {S4} | φ | φ |
| t6={S3} | φ | φ | {S5} | φ | φ |
| t7={S4, S5} | {S3} | φ | {S4} | φ | {A} |
| t8={S5} | φ | φ | φ | φ | {A} |

FIG. 6
PRIOR ART ((abcd|[^a]bcd|a[^b]cd|ab[^c]d|abc[^d]/A))

FIG. 7
PRIOR ART

| | | VALUES OF STATE-TRANSITION FUNCTION δ IN NMO | | | | |
|---|---|---|---|---|---|---|
| state | output | $ | a | b | c | d |
| 1 | [ ] | 1, 6 | 1, 3, 9, 12, 15 | 1, 6 | 1, 6 | 1, 6 |
| 2 | [ A] | – | – | – | – | – |
| 3 | [ ] | – | – | 4 | – | – |
| 4 | [ ] | – | – | – | 5 | – |
| 5 | [ ] | – | – | – | – | 2 |
| 6 | [ ] | – | – | 7 | – | – |
| 7 | [ ] | – | – | – | 8 | – |
| 8 | [ ] | – | – | – | – | 2 |
| 9 | [ ] | 10 | 10 | – | 10 | 10 |
| 10 | [ ] | – | – | – | 11 | – |
| 11 | [ ] | – | – | – | – | 2 |
| 12 | [ ] | – | – | 13 | – | – |
| 13 | [ ] | 14 | 14 | 14 | – | 14 |
| 14 | [ ] | – | – | – | – | 2 |
| 15 | [ ] | – | – | 16 | – | – |
| 16 | [ ] | – | – | – | 17 | – |
| 17 | [ ] | 2 | 2 | 2 | 2 | – |

SYMBOL "Σ" DENOTES ALL CHARACTERS
SYMBOL "X" DENOTES ALL CHARACTERS OTHER THAN "X"

FIG. 9(a)
PRIOR ART

DM0_state (1): {1}
    DM0_goto({1}, "$") = {1, 6} (2)
    DM0_goto({1}, "a") = {1, 3, 9, 12, 15} (3)
    DM0_goto({1}, "b") = {1, 6} (2)
    DM0_goto({1}, "c") = {1, 6} (2)
    DM0_goto({1}, "d") = {1, 6} (2)

DM0_state (2): {1, 6}
    DM0_goto({1, 6}, "$") = {1, 6} (2)
    DM0_goto({1, 6}, "a") = {1, 3, 9, 12, 15} (3)
    DM0_goto({1, 6}, "b") = {1, 6, 7} (4)
    DM0_goto({1, 6}, "c") = {1, 6} (2)
    DM0_goto({1, 6}, "d") = {1, 6} (2)

DM0_state (3): {1, 3, 9, 12, 15}
    DM0_goto({1, 3, 9, 12, 15}, "$") = {1, 6, 10} (5)
    DM0_goto({1, 3, 9, 12, 15}, "a") = {1, 3, 9, 10, 12, 15} (6)
    DM0_goto({1, 3, 9, 12, 15}, "b") = {1, 4, 6, 13, 16} (7)
    DM0_goto({1, 3, 9, 12, 15}, "c") = {1, 6, 10} (5)
    DM0_goto({1, 3, 9, 12, 15}, "d") = {1, 6, 10} (5)

DM0_state (4): {1, 6, 7}
    DM0_goto({1, 6, 7}, "$") = {1, 6} (2)
    DM0_goto({1, 6, 7}, "a") = {1, 3, 9, 12, 15} (3)
    DM0_goto({1, 6, 7}, "b") = {1, 6, 7} (4)
    DM0_goto({1, 6, 7}, "c") = {1, 6, 8} (8)
    DM0_goto({1, 6, 7}, "d") = {1, 6} (2)

DM0_state (5): {1, 6, 10}
    DM0_goto({1, 6, 10}, "$") = {1, 6} (2)
    DM0_goto({1, 6, 10}, "a") = {1, 3, 9, 12, 15} (3)
    DM0_goto({1, 6, 10}, "b") = {1, 6, 7} (4)
    DM0_goto({1, 6, 10}, "c") = {1, 6, 11} (9)
    DM0_goto({1, 6, 10}, "d") = {1, 6} (2)

DM0_state (6): {1, 3, 9, 10, 12, 15}
    DM0_goto({1, 3, 9, 10, 12, 15}, "$") = {1, 6, 10} (5)
    DM0_goto({1, 3, 9, 10, 12, 15}, "a") = {1, 3, 9, 10, 12, 15} (6)
    DM0_goto({1, 3, 9, 10, 12, 15}, "b") = {1, 4, 6, 13, 16} (7)
    DM0_goto({1, 3, 9, 10, 12, 15}, "c") = {1, 6, 10, 11} (10)
    DM0_goto({1, 3, 9, 10, 12, 15}, "d") = {1, 6, 10} (5)

DM0_state (7): {1, 4, 6, 13, 16}
    DM0_goto({1, 4, 6, 13, 16}, "$") = {1, 6, 14} (11)
    DM0_goto({1, 4, 6, 13, 16}, "a") = {1, 3, 9, 12, 14, 15} (12)
    DM0_goto({1, 4, 6, 13, 16}, "b") = {1, 6, 7, 14} (13)
    DM0_goto({1, 4, 6, 13, 16}, "c") = {1, 5, 6, 17} (14)
    DM0_goto({1, 4, 6, 13, 16}, "d") = {1, 6, 14} (11)

DM0_state (8): {1, 6, 8}
    DM0_goto({1, 6, 8}, "$") = {1, 6} (2)
    DM0_goto({1, 6, 8}, "a") = {1, 3, 9, 12, 15} (3)
    DM0_goto({1, 6, 8}, "b") = {1, 6, 7} (4)
    DM0_goto({1, 6, 8}, "c") = {1, 6} (2)
    DM0_goto({1, 6, 8}, "d") = {1, 2, 6} (15)

DM0_state (9): {1, 6, 11}
    DM0_goto({1, 6, 11}, "$") = {1, 6} (2)
    DM0_goto({1, 6, 11}, "a") = {1, 3, 9, 12, 15} (3)
    DM0_goto({1, 6, 11}, "b") = {1, 6, 7} (4)
    DM0_goto({1, 6, 11}, "c") = {1, 6} (2)
    DM0_goto({1, 6, 11}, "d") = {1, 2, 6} (15)

DM0_state (10): {1, 6, 10, 11}
    DM0_goto({1, 6, 10, 11}, "$") = {1, 6} (2)
    DM0_goto({1, 6, 10, 11}, "a") = {1, 3, 9, 12, 15} (3)
    DM0_goto({1, 6, 10, 11}, "b") = {1, 6, 7} (4)
    DM0_goto({1, 6, 10, 11}, "c") = {1, 6, 11} (9)
    DM0_goto({1, 6, 10, 11}, "d") = {1, 2, 6} (15)

DM0_state (11): {1, 6, 14}
    DM0_goto({1, 6, 14}, "$") = {1, 6} (2)
    DM0_goto({1, 6, 14}, "a") = {1, 3, 9, 12, 15} (3)
    DM0_goto({1, 6, 14}, "b") = {1, 6, 7} (4)
    DM0_goto({1, 6, 14}, "c") = {1, 6} (2)
    DM0_goto({1, 6, 14}, "d") = {1, 2, 6} (15)

DM0_state (12): {1, 3, 9, 12, 14, 15}
    DM0_goto({1, 3, 9, 12, 14, 15}, "$") = {1, 6, 10} (5)
    DM0_goto({1, 3, 9, 12, 14, 15}, "a") = {1, 3, 9, 10, 12, 15} (6)
    DM0_goto({1, 3, 9, 12, 14, 15}, "b") = {1, 4, 6, 13, 16} (7)
    DM0_goto({1, 3, 9, 12, 14, 15}, "c") = {1, 6, 10} (5)
    DM0_goto({1, 3, 9, 12, 14, 15}, "d") = {1, 2, 6, 10} (16)

FIG. 9(b) PRIOR ART

DM0_state (13): {1, 6, 7, 14}
 DM0_goto({1, 6, 7, 14}, "$") = {1, 6} (2)
 DM0_goto({1, 6, 7, 14}, "a") = {1, 3, 9, 12, 15} (3)
 DM0_goto({1, 6, 7, 14}, "b") = {1, 6, 7} (4)
 DM0_goto({1, 6, 7, 14}, "c") = {1, 6, 8} (8)
 DM0_goto({1, 6, 7, 14}, "d") = {1, 2, 6} (15)

DM0_state (14): {1, 5, 6, 17}
 DM0_goto({1, 5, 6, 17}, "$") = {1, 2, 6} (15)
 DM0_goto({1, 5, 6, 17}, "a") = {1, 2, 3, 9, 12, 15} (17)
 DM0_goto({1, 5, 6, 17}, "b") = {1, 2, 6, 7} (18)
 DM0_goto({1, 5, 6, 17}, "c") = {1, 2, 6} (15)
 DM0_goto({1, 5, 6, 17}, "d") = {1, 2, 6} (15)

DM0_state (15): {1, 2, 6}
 DM0_goto({1, 2, 6}, "$") = {1, 6} (2)
 DM0_goto({1, 2, 6}, "a") = {1, 3, 9, 12, 15} (3)
 DM0_goto({1, 2, 6}, "b") = {1, 6, 7} (4)
 DM0_goto({1, 2, 6}, "c") = {1, 6} (2)
 DM0_goto({1, 2, 6}, "d") = {1, 6} (2)

DM0_state (16): {1, 2, 6, 10}
 DM0_goto({1, 2, 6, 10}, "$") = {1, 6} (2)
 DM0_goto({1, 2, 6, 10}, "a") = {1, 3, 9, 12, 15} (3)
 DM0_goto({1, 2, 6, 10}, "b") = {1, 6, 7} (4)
 DM0_goto({1, 2, 6, 10}, "c") = {1, 6, 11} (9)
 DM0_goto({1, 2, 6, 10}, "d") = {1, 6} (2)

DM0_state (17): {1, 2, 3, 9, 12, 15}
 DM0_goto({1, 2, 3, 9, 12, 15}, "$") = {1, 6, 10} (5)
 DM0_goto({1, 2, 3, 9, 12, 15}, "a") = {1, 3, 9, 10, 12, 15} (6)
 DM0_goto({1, 2, 3, 9, 12, 15}, "b") = {1, 4, 6, 13, 16} (7)
 DM0_goto({1, 2, 3, 9, 12, 15}, "c") = {1, 6, 10} (5)
 DM0_goto({1, 2, 3, 9, 12, 15}, "d") = {1, 6, 10} (5)

DM0_state (18): {1, 2, 6, 7}
 DM0_goto({1, 2, 6, 7}, "$") = {1, 6} (2)
 DM0_goto({1, 2, 6, 7}, "a") = {1, 3, 9, 12, 15} (3)
 DM0_goto({1, 2, 6, 7}, "b") = {1, 6, 7} (4)
 DM0_goto({1, 2, 6, 7}, "c") = {1, 6, 8} (8)
 DM0_goto({1, 2, 6, 7}, "d") = {1, 6} (2)

FIG. 10 PRIOR ART

| VALUES OF STATE-TRANSITION FUNCTION $\delta'$ IN DM0 | | | | | | |
|---|---|---|---|---|---|---|
| state | output | $ | a | b | c | d |
| 1 | [ ] | 2 | 3 | 2 | 2 | 2 |
| 2 | [ ] | 2 | 3 | 4 | 2 | 2 |
| 3 | [ ] | 5 | 6 | 7 | 5 | 5 |
| 4 | [ ] | 2 | 3 | 4 | 8 | 2 |
| 5 | [ ] | 2 | 3 | 4 | 9 | 2 |
| 6 | [ ] | 5 | 6 | 7 | 10 | 5 |
| 7 | [ ] | 11 | 12 | 13 | 14 | 11 |
| 8 | [ ] | 2 | 3 | 4 | 2 | 15 |
| 9 | [ ] | 2 | 3 | 4 | 2 | 15 |
| 10 | [ ] | 2 | 3 | 4 | 9 | 15 |
| 11 | [ ] | 2 | 3 | 4 | 2 | 15 |
| 12 | [ ] | 5 | 6 | 7 | 5 | 16 |
| 13 | [ ] | 2 | 3 | 4 | 8 | 15 |
| 14 | [ ] | 15 | 17 | 18 | 15 | 15 |
| 15 | [ A] | 2 | 3 | 4 | 2 | 2 |
| 16 | [ A] | 2 | 3 | 4 | 9 | 2 |
| 17 | [ A] | 5 | 6 | 7 | 5 | 5 |
| 18 | [ A] | 2 | 3 | 4 | 8 | 2 |

TOTAL 67 TRANSITIONS

FIG. 15

| STATES IN MOORE MACHINE WITH FAILURE TRANSITIONS FM0 | VALUES OF SUCCESS FUNCTION g FOR EACH OF EXTERNAL INPUTS | | | | VALUES OF FAILURE FUNCTION f | OUTPUTS OF THE MACHINE FM0 |
|---|---|---|---|---|---|---|
| | A0B1 | A1B0 | A1B1 | A0B0 | | |
| t0=⟨{S0},{S0}⟩ | ⟨{S1},{S1,S2}⟩ | ⟨{S2},{S1,S2}⟩ | ... | ... | ⟨φ,φ⟩ | φ |
| t1=⟨{S1},{S1,S2}⟩ | ... | ⟨{S1},{S1,S2,S3}⟩ | ... | ... | ⟨{S2},{S2}⟩ | φ |
| t2=⟨{S2},{S2}⟩ | ... | ⟨{S4},{S4}⟩ | ⟨{S4},{S4}⟩ | ... | ⟨φ,φ⟩ | φ |
| t3=⟨φ,φ⟩ | ⟨φ,φ⟩ | ⟨φ,φ⟩ | ⟨φ,φ⟩ | ⟨φ,φ⟩ | ... | φ |
| t4=⟨{S1},{S1,S2,S3}⟩ | ... | ⟨{S1},{S1,S2,S3,S4}⟩ | ... | ... | ⟨{S3},{S2,S3}⟩ | φ |
| t5=⟨{S4},{S4}⟩ | ⟨{S3},{S3}⟩ | ... | ⟨{S4},{S4}⟩ | ... | ⟨φ,φ⟩ | φ |
| t6=⟨{S1},{S1,S2,S3,S4}⟩ | ... | ⟨{S1},{S1,S2,S3,S4}⟩ | ... | ... | ⟨{S3},{S2,S3,S4}⟩ | φ |
| t7=⟨{S3},{S3},{S2,S3}⟩ | ... | ... | ⟨{S4},{S4,S5}⟩ | ... | ⟨{S2},{S2}⟩ | φ |
| t8=⟨{S3},{S3}⟩ | ... | ... | ⟨{S5},{S5}⟩ | ... | ⟨φ,φ⟩ | φ |
| t9=⟨{S3},{S2,S3,S4}⟩ | ... | ... | ⟨{S4},{S4,S5}⟩ | ... | ⟨{S4},{S2,S4}⟩ | φ |
| t10=⟨{S4},{S4,S5}⟩ | ⟨{S3},{S3}⟩ | ... | ⟨{S4},{S4}⟩ | ... | ⟨{S5},{S5}⟩ | {A} |
| t11=⟨{S5},{S5}⟩ | ... | ... | ... | ... | ⟨φ,φ⟩ | {A} |
| t12=⟨{S4},{S2,S4}⟩ | ⟨{S3},{S3}⟩ | ... | ⟨{S4},{S4}⟩ | ... | ⟨{S2},{S2}⟩ | φ |

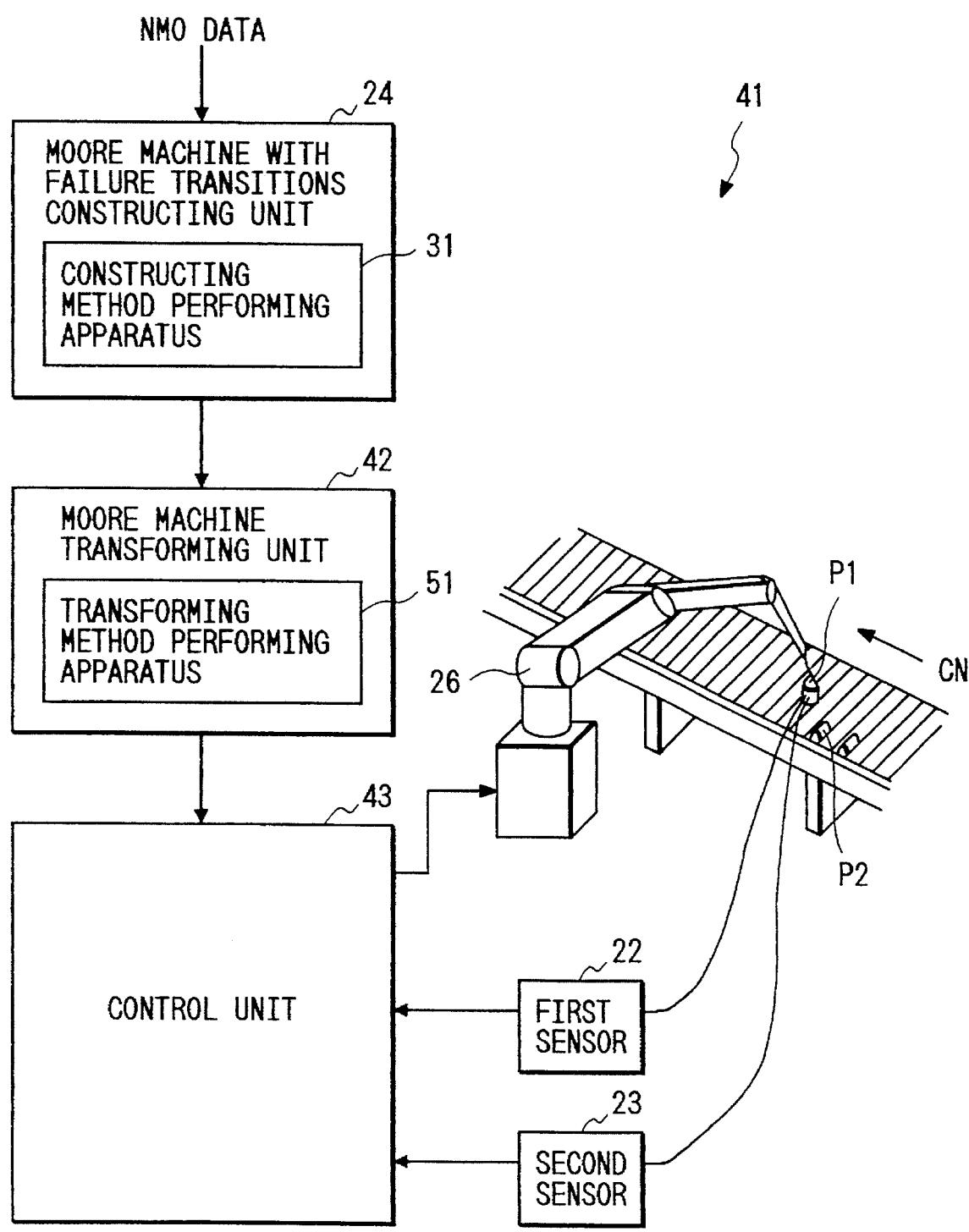

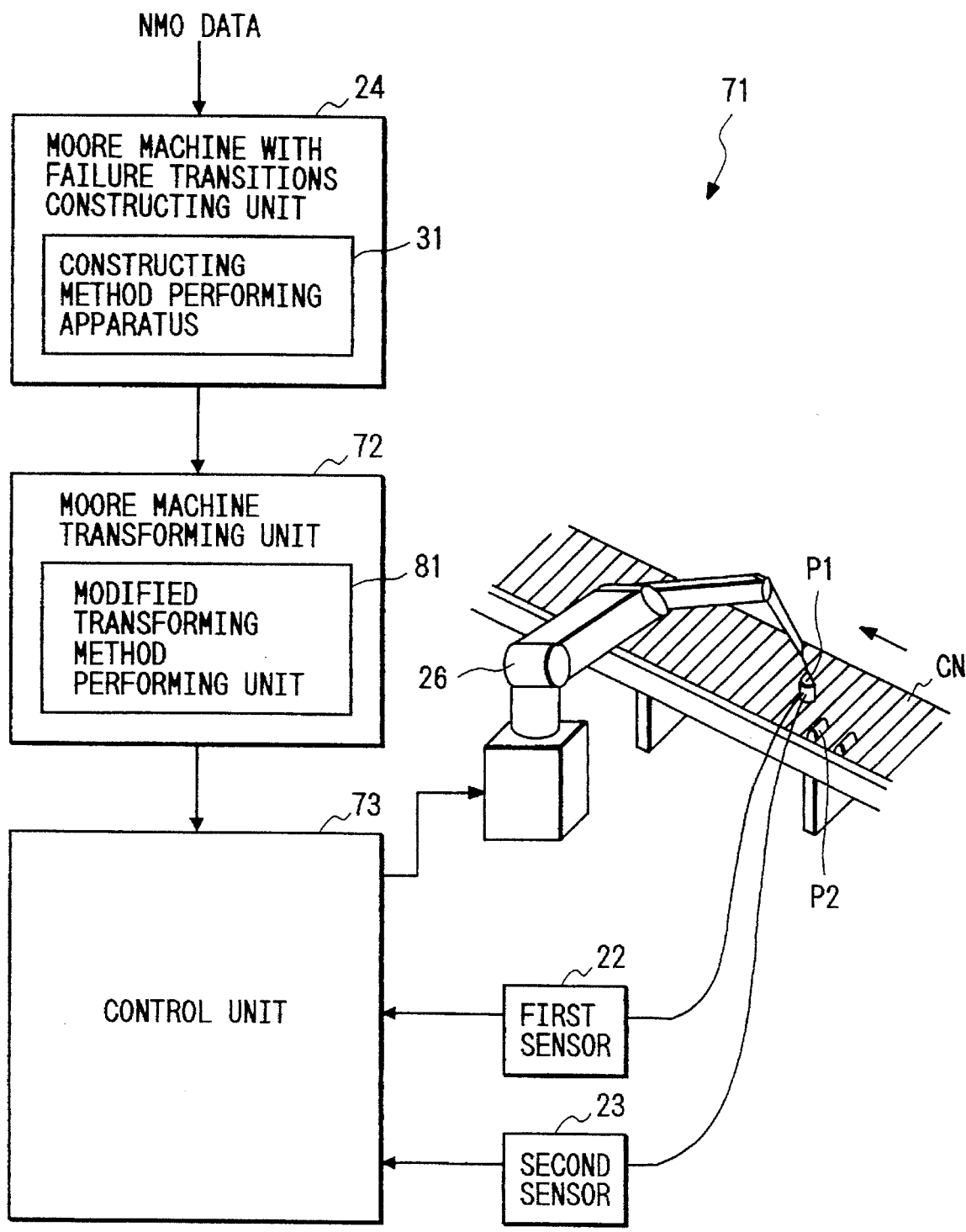

FIG. 28(a)

```
FM0_state (1): ⟨{1},1⟩
  NM0_goto({1},"$")={1,6}
  FM0_goto(⟨{1},1⟩,"$")=⟨{6},1⟩  (2)
  NM0_goto({1},"a")={1,3,9,12,15}
  FM0_goto(⟨{1},1⟩,"a")=⟨{3,9,12,15},1⟩  (3)
  NM0_goto({1},"b")={1,6}
  FM0_goto(⟨{1},1⟩,"b")=⟨{6},1⟩  (2)
  NM0_goto({1},"c")={1,6}
  FM0_goto(⟨{1},1⟩,"c")=⟨{6},1⟩  (2)
  NM0_goto({1},"d")={1,6}
  FM0_goto(⟨{1},1⟩,"d")=⟨{6},1⟩  (2)

FM0_state (2): ⟨{6},1⟩
  NM0_goto({6},"$")={}
  FM0_fail(⟨{6},1⟩,"$")=⟨{1},1⟩  (1)
  NM0_goto({6},"a")={}
  NM0_goto({6},"b")={7}
  FM0_goto(⟨{6},1⟩,"b")=⟨{7},2⟩  (4)
  NM0_goto({6},"c")={}
  NM0_goto({6},"d")={}

FM0_state (3): ⟨{3,9,12,15},1⟩
  NM0_goto({3,9,12,15},"$")={10}
  FM0_goto(⟨{3,9,12,15},1⟩,"$")=⟨{10},2⟩  (5)
  NM0_goto({3,9,12,15},"a")={10}
  FM0_goto(⟨{3,9,12,15},1⟩,"a")=⟨{10},3⟩  (6)
  NM0_goto({3,9,12,15},"b")={4,13,16}
  FM0_goto(⟨{3,9,12,15},1⟩,"b")=⟨{4,13,16},2⟩  (7)
  NM0_goto({3,9,12,15},"c")={10}
  FM0_goto(⟨{3,9,12,15},1⟩,"c")=⟨{10},2⟩  (5)
  NM0_goto({3,9,12,15},"d")={10}
  FM0_goto(⟨{3,9,12,15},1⟩,"d")=⟨{10},2⟩  (5)

FM0_state (4): ⟨{7},2⟩
  NM0_goto({7},"$")={}
  FM0_fail(⟨{7},2⟩,"$")=⟨{6},1⟩  (2)
  NM0_goto({7},"a")={}
  NM0_goto({7},"b")={}
  NM0_goto({7},"c")={8}
  FM0_goto(⟨{7},2⟩,"c")=⟨{8},2⟩  (8)
  NM0_goto({7},"d")={}

FM0_state (5): ⟨{10},2⟩
  NM0_goto({10},"$")={}
  FM0_fail(⟨{10},2⟩,"$")=⟨{6},1⟩  (2)
  NM0_goto({10},"a")={}
  NM0_goto({10},"b")={}
  NM0_goto({10},"c")={11}
  FM0_goto(⟨{10},2⟩,"c")=⟨{11},2⟩  (9)
  NM0_goto({10},"d")={}

FM0_state (6): ⟨{10},3⟩
  NM0_goto({10},"$")={}
  FM0_fail(⟨{10},3⟩,"$")=⟨{3,9,12,15},1⟩  (3)
  NM0_goto({10},"a")={}
  NM0_goto({10},"b")={}
  NM0_goto({10},"c")={11}
  FM0_goto(⟨{10},3⟩,"c")=⟨{11},5⟩  (10)
  NM0_goto({10},"d")={}

FM0_state (7): ⟨{4,13,16},2⟩
  NM0_goto({4,13,16},"$")={14}
  FM0_goto(⟨{4,13,16},2⟩,"$")=⟨{14},2⟩  (11)
  NM0_goto({4,13,16},"a")={14}
  FM0_goto(⟨{4,13,16},2⟩,"a")=⟨{14},3⟩  (12)
  NM0_goto({4,13,16},"b")={14}
  FM0_goto(⟨{4,13,16},2⟩,"b")=⟨{14},4⟩  (13)
  NM0_goto({4,13,16},"c")={5,17}
  FM0_goto(⟨{4,13,16},2⟩,"c")=⟨{5,17},2⟩  (14)
  NM0_goto({4,13,16},"d")={14}
  FM0_goto(⟨{4,13,16},2⟩,"d")=⟨{14},2⟩  (11)

FM0_state (8): ⟨{8},2⟩
  NM0_goto({8},"$")={}
  FM0_fail(⟨{8},2⟩,"$")=⟨{6},1⟩  (2)
  NM0_goto({8},"a")={}
  NM0_goto({8},"b")={}
  NM0_goto({8},"c")={}
  NM0_goto({8},"d")={2}
  FM0_goto(⟨{8},2⟩,"d")=⟨{2},2⟩  (15)

FM0_state (9): ⟨{11},2⟩
  NM0_goto({11},"$")={}
  FM0_fail(⟨{11},2⟩,"$")=⟨{6},1⟩  (2)
  NM0_goto({11},"a")={}
  NM0_goto({11},"b")={}
  NM0_goto({11},"c")={}
  NM0_goto({11},"d")={2}
  FM0_goto(⟨{11},2⟩,"d")=⟨{2},2⟩  (15)

FM0_state (10): ⟨{11},5⟩
  NM0_goto({11},"$")={}
  FM0_fail(⟨{11},5⟩,"$")=⟨{10},2⟩  (5)
  NM0_goto({11},"a")={}
  NM0_goto({11},"b")={}
  NM0_goto({11},"c")={}
  NM0_goto({11},"d")={2}
  FM0_goto(⟨{11},5⟩,"d")=⟨{2},2⟩  (15)

FM0_state (11): ⟨{14},2⟩
  NM0_goto({14},"$")={}
  FM0_fail(⟨{14},2⟩,"$")=⟨{6},1⟩  (2)
  NM0_goto({14},"a")={}
  NM0_goto({14},"b")={}
  NM0_goto({14},"c")={}
  NM0_goto({14},"d")={2}
  FM0_goto(⟨{14},2⟩,"d")=⟨{2},2⟩  (15)

FM0_state (12): ⟨{14},3⟩
  NM0_goto({14},"$")={}
  FM0_fail(⟨{14},3⟩,"$")=⟨{3,9,12,15},1⟩  (3)
  NM0_goto({14},"a")={}
  NM0_goto({14},"b")={}
  NM0_goto({14},"c")={}
  NM0_goto({14},"d")={2}
  FM0_goto(⟨{14},3⟩,"d")=⟨{2},5⟩  (16)
```

FIG. 28(b)

```
FMO_state (13): ⟨{14},4⟩
  NMO_goto({14},"$")={}
  FMO_fail(⟨{14},4⟩,"$")=⟨{7},2⟩ (4)
  NMO_goto({14},"a")={}
  NMO_goto({14},"b")={}
  NMO_goto({14},"c")={}
  NMO_goto({14},"d")={2}
  FMO_goto(⟨{14},4⟩,"d")=⟨{2},2⟩ (15)

FMO_state (14): ⟨{5,17},2⟩
  NMO_goto({5,17},"$")={2}
  FMO_goto(⟨{5,17},2⟩,"$")=⟨{2},2⟩ (15)
  NMO_goto({5,17},"a")={2}
  FMO_goto(⟨{5,17},2⟩,"a")=⟨{2},3⟩ (17)
  NMO_goto({5,17},"b")={2}
  FMO_goto(⟨{5,17},2⟩,"b")=⟨{2},4⟩ (18)
  NMO_goto({5,17},"c")={2}
  FMO_goto(⟨{5,17},2⟩,"c")=⟨{2},2⟩ (15)
  NMO_goto({5,17},"d")={2}
  FMO_goto(⟨{5,17},2⟩,"d")=⟨{2},2⟩ (15)

FMO_state (15): ⟨{2},2⟩
  NMO_goto({2},"$")={}
  FMO_fail(⟨{2},2⟩,"$")=⟨{6},1⟩ (2)
  NMO_goto({2},"a")={}
  NMO_goto({2},"b")={}
  NMO_goto({2},"c")={}
  NMO_goto({2},"d")={}

FMO_state (16): ⟨{2},5⟩
  NMO_goto({2},"$")={}
  FMO_fail(⟨{2},5⟩,"$")=⟨{10},2⟩ (5)
  NMO_goto({2},"a")={}
  NMO_goto({2},"b")={}
  NMO_goto({2},"c")={}
  NMO_goto({2},"d")={}

FMO_state (17): ⟨{2},3⟩
  NMO_goto({2},"$")={}
  FMO_fail(⟨{2},3⟩,"$")=⟨{3,9,12,15},1⟩ (3)
  NMO_goto({2},"a")={}
  NMO_goto({2},"b")={}
  NMO_goto({2},"c")={}
  NMO_goto({2},"d")={}

FMO_state (18): ⟨{2},4⟩
  NMO_goto({2},"$")={}
  FMO_fail(⟨{2},4⟩,"$")=⟨{7},2⟩ (4)
  NMO_goto({2},"a")={}
  NMO_goto({2},"b")={}
  NMO_goto({2},"c")={}
  NMO_goto({2},"d")={}
```

FIG. 29

STATE-TRANSITIONS IN FMO MACHINE

| state | output | VALUES OF SUCCESS FUNCTION g FOR EACH CHARACTER | | | | | VALUES OF FAILURE FUNCTION |
|---|---|---|---|---|---|---|---|
| | | $ | a | b | c | d | fail |
| 1 | [ ] | 2 | 3 | 2 | 2 | 2 | – |
| 2 | [ ] | – | – | 4 | – | – | 1 |
| 3 | [ ] | 5 | 6 | 7 | 5 | 5 | – |
| 4 | [ ] | – | – | – | 8 | – | 2 |
| 5 | [ ] | – | – | – | 9 | – | 2 |
| 6 | [ ] | – | – | – | 10 | – | 3 |
| 7 | [ ] | 11 | 12 | 13 | 14 | 11 | – |
| 8 | [ ] | – | – | – | – | 15 | 2 |
| 9 | [ ] | – | – | – | – | 15 | 2 |
| 10 | [ ] | – | – | – | – | 15 | 5 |
| 11 | [ ] | – | – | – | – | 15 | 2 |
| 12 | [ ] | – | – | – | – | 16 | 3 |
| 13 | [ ] | – | – | – | – | 15 | 4 |
| 14 | [ ] | 15 | 17 | 18 | 15 | 15 | – |
| 15 | [ A] | – | – | – | – | – | 2 |
| 16 | [ A] | – | – | – | – | – | 5 |
| 17 | [ A] | – | – | – | – | – | 3 |
| 18 | [ A] | – | – | – | – | – | 4 |

FIG. 31

| CASE NO. | REGULAR TRANSFORMATION | |
|---|---|---|
| | SLIGHTLY DUPLICATED CHARACTER FORM | HEAVILY DUPLICATED CHARACTER FORM |
| 1 | E(abcd) | E(abcd) |
| 2 | E(abcd) \| E(efgh) | E(abcd) \| E(cdef) |
| 3 | E(abcd) \| E(efgh) \| E(ghij) | E(abcd) \| E(cdef) \| E(efgh) |
| 4 | E(abcd) \| E(efgh) \| E(ghij) \| E(klmn) | E(abcd) \| E(cdef) \| E(efgh) \| E(ghij) |
| 5 | E(abcd) \| E(efgh) \| E(ghij) \| E(klmn) \| E(opqr) | E(abcd) \| E(cdef) \| E(efgh) \| E(ghij) \| E(ijkl) |
| 6 | E(abcd) \| E(efgh) \| E(ghij) \| E(klmn) \| E(opqr) \| E(stuv) | E(abcd) \| E(cdef) \| E(efgh) \| E(ghij) \| E(ijkl) \| E(klmn) |
| 7 | E(abcd) \| E(efgh) \| E(ghij) \| E(klmn) \| E(opqr) \| E(stuv) \| E(wxyz) | E(abcd) \| E(cdef) \| E(efgh) \| E(ghij) \| E(ijkl) \| E(klmn) \| E(mnop) |
| 8 | E(abcd) \| E(efgh) \| E(ghij) \| E(klmn) \| E(opqr) \| E(stuv) \| E(wxyz) \| E(ABCD) | E(abcd) \| E(cdef) \| E(efgh) \| E(ghij) \| E(ijkl) \| E(klmn) \| E(mnop) \| E(opqr) |
| 9 | E(abcd) \| E(efgh) \| E(ghij) \| E(klmn) \| E(opqr) \| E(stuv) \| E(wxyz) \| E(ABCD) \| E(EFGH) | E(abcd) \| E(cdef) \| E(efgh) \| E(ghij) \| E(ijkl) \| E(klmn) \| E(mnop) \| E(opqr) \| E(qrst) |
| 10 | E(abcd) \| E(efgh) \| E(ghij) \| E(klmn) \| E(opqr) \| E(stuv) \| E(wxyz) \| E(ABCD) \| E(EFGH) \| E(IJKL) | E(abcd) \| E(cdef) \| E(efgh) \| E(ghij) \| E(ijkl) \| E(klmn) \| E(mnop) \| E(opqr) \| E(qrst) \| E(stuv) |
| 11 | E(abcd) \| E(efgh) \| E(ghij) \| E(klmn) \| E(opqr) \| E(stuv) \| E(wxyz) \| E(ABCD) \| E(EFGH) \| E(IJKL) \| E(MNOP) | E(abcd) \| E(cdef) \| E(efgh) \| E(ghij) \| E(ijkl) \| E(klmn) \| E(mnop) \| E(opqr) \| E(qrst) \| E(stuv) \| E(uvwx) |

$E(c_1c_2c_3c_4) \equiv (c_1c_2c_3c_4 \mid [\hat{c}_1]c_2c_3c_4 \mid c_1[\hat{c}_2]c_3c_4 \mid c_1c_2[\hat{c}_3]c_4 \mid c_1c_2c_3[\hat{c}_4])/A$

CONSTRUCTING METHOD OF FINITE-STATE MACHINE PERFORMING TRANSITIONS ACCORDING TO A PARTIAL TYPE OF SUCCESS FUNCTION AND A FAILURE FUNCTION

BACKGROUND OF THE INVENTION

1. Field of the Invention

The present invention relates to a method for constructing a finite-state machine which is utilized for an automatic control system operated according to outside conditions and used in a chemical plant, a power plant, an airplane, a robot and a radar system and relates to a method for constructing a pattern-matching machine obtained by specializing the finite-state machine which is utilized for a retrieving apparatus and an editing machine using a computer pattern matching. Also, the present invention relates to a method for transforming failure transitions of the finite-state machine according to a failure function into a success transition according to a success function and a method for transforming failure transitions of the pattern-matching machine according to a failure function into a success transition according to a success function.

2. Description of the Prior Art 2.1. Previously Proposed Art

A concept of a finite-state machine proposed by McCulloch and Pitts in 1943 has been extended by many researchers, and various characteristics of the finite-state machine has been clarified. The finite-state machine has been recently utilized for the research and development in the industrial world and an academic society as the most simple model of an automaton and a computer. Also, the relationship between the finite-state machine and a regular expression relating to the finite-state machine in a pair has been profoundly researched. The finite-state machine or a finite-state automaton classified as a type of finite-state machine and the regular expression have been reported in various publications and literatures such as a first publication—M. L. Minsky, "Computation: Finite and Infinite Machines", Englewood, N.J., (1967)—, a second publication—E. J. Hopcroft, and D. J. Ullman, "Formal Languages and their Relation to Automata", Addison-Wesley, Mass., (1964)—, a third publication—translation by Nozaki et al., "Language Theory and Automa", Science Inc., (1971)—, a fourth publication—A. Salommaa, "Theory of Automata", Pergamon Press, England, (1969)—, a fifth publication—translated by Kitagawa et al., "Theory of Automata", Kyoritsu Press. (1964)—, a sixth publication—E. Tomira and T. Yokomori "Automata and Theory of languages", Morikita Press, (1992)—, and a literature—R. Mcnaughton and H. Yamada, "Regular Expressions and State Graphs for Automata", IRE Transactions on Electronic Computers", (1960). Therefore, introductory explanation of the finite-state machine and various concepts accompanying the finite-state machine is omitted, and formal definitions of a nondeterministic Moore machine NMO, a deterministic Moore machine DMO, regular expressions relating to the machines NMO and DMO and regular transformations equivalent to the extension of the regular expressions are merely described.

The nondeterministic Moore machine is initially described.

The nondeterministic Moore machine NMO=$(Q,\Sigma,\Delta,\delta,\lambda,q)$ representing a nondeterministic finite-state machine consists of a finite set Q of states, a finite input set $\Sigma$ expressed by symbolizing an input from the outside, a finite output set $\Delta$ expressed by symbolizing an output to the outside, a state-transition function $\delta(p,\alpha)$ designated by a current state $p \in Q$ of the nondeterministic Moore machine NMO and an input $\alpha \in \Sigma$ given from the outside for assigning a set of next states to which the nondeterministic Moore machine NMO is transferred in a next time, an output function $\lambda(p')$ designated only by a next state $p' \in Q$ for determining a value output to the outside while the state transition to the next state $p'$ is performed, and an initial state $q \in Q$. The next states are necessarily determined by values $\delta(p,\alpha)$ of the function $\delta$ for all inputs $\alpha$, so that the function $\delta$ is called a total function.

In the above formal definition of the nondeterministic Moore machine NMO, an input $\alpha$ given from the outside takes states of the machine NMO from a set $\{p1,p2,---,pN\}$ of current states (or, initially equivalent to a set $\{q\}$ of the initial states q) to a set $\delta(p1,\alpha) \cup\!\!-\!\!\cup \delta(pN,\alpha)$ of next states, and the operation that a value $\{\lambda(x)|x\in \delta(p1,\alpha) \cup\!\!-\!\!\cup \delta(pN,\alpha)\}$ is output is repeated at the same time with each of the state transitions. Here, $\delta(pi,\alpha) \cup \delta(pj,\alpha)$ denotes a union of $\delta(pi,\alpha)$ and $\delta(pj,\alpha)$. Also, even though any input $\alpha$ is given to the machine NMO from the outside, a state transition from the empty set $\phi \subset Q$ to the empty set $\phi$ is performed in the machine NMO, and an output is equal to the empty set $\phi$.

Though the state-transition function $\delta(p,\alpha)$ is the total function, there is a case that a value of the state-transition function $\delta(p,\alpha)$ is equal to that of the empty set $\phi$. Therefore, there is a case that the set $\delta(p1,\alpha) \cup\!\!-\!\!\cup \delta(pN,\alpha)$ of next states transferred from the current states is equal to the empty set $\phi$. In this case, current states newly determined are maintained in a state of the empty set $\phi$ according to the above regulation.

Next, the deterministic Moore machine is described.

The deterministic Moore machine DMO=$(Q,\Sigma,\Delta,\delta',\lambda,q)$ representing a deterministic finite-state machine consists of a finite set Q of states, a finite input set $\Sigma$ expressed by symbolizing an input from the outside, a finite output set $\Delta$ expressed by symbolizing an output to the outside, a state-transition function $\delta'(p,\alpha)$ that assigns to a current state $p \in Q$ of the deterministic Moore machine DMO and input $\alpha \in \Sigma$ given from the outside pair a next state to which the deterministic Moore machine DMO is transferred in a next time, an output function $\lambda(p')$, depending only the next state $p' \in Q$ translated, that determines a value output to the outside while the state transition is performed, and an initial state $q \in Q$. The next state are necessarily determined by values $\delta'(p,\alpha)$ of the function $\delta'$ for all inputs $\alpha$, so that the function $\delta'$ is called a total function.

In the above formal definition of the deterministic Moore machine DMO, an input $\alpha$ given from the outside takes a state of the machine DMO from a current state p (or, initially equivalent to the initial state q) to a next state $\delta'(p,\alpha)$, and the operation that a value $\lambda(\delta'(p,\alpha))$ is output to the outside is repeated at the same time with each of the state transitions.

Because the state-transition function $\delta'(p,\alpha)$ is the total function having an element p of the finite set Q, there is no case that a value of the state-transition function $\delta'(p,\alpha)$ is equal to that of the empty set $\phi$.

Finally, the definition of the regular expression is described.

In cases where a finite set of character strings is expressed by $\Sigma$, each of regular expressions on the finite set $\Sigma$ denotes a character string on the finite set $\Sigma$ defined according to following seven definitions. In this case, the empty character string having a length of zero is included in the finite set of character strings. In detail, (1) In a first definition, a symbol $\phi$ is a regular expression which denotes the empty set of character string on the finite set $\Sigma$.

(2) In a second definition, a symbol $\epsilon$ is a regular expression which denotes a set of character strings having a length of zero on the finite set $\Sigma$.

(3) In a third definition, a symbol a is a regular expression which denotes a set $\{\alpha\}$ (or expressed by $\alpha \in \Sigma$) on the finite set $\Sigma$.

(4) In a fourth definition, symbols R, S are respectively a regular expression on the finite set $\Sigma$, a symbol (R+S) is a regular expression denoting a set {t|t is an element of a set expressed by R or is an element of a set expressed by S}.

(5) In a fifth definition, symbols R, S are respectively a regular expression on the finite set $\Sigma$, a symbol (RS) is a regular expression denoting a set {rs|r is an element of a set expressed by R and s is an element of a set expressed by S}.

(6) In a sixth definition, a symbol R is a regular expression on the finite set $\Sigma$, a symbol (R*) is a regular expression equivalent to another regular expression (—(($\epsilon$+R)+(RR))+(RRR))+—).

(7) In a seventh definition, any other symbols not defined by one of the first to sixth definitions are not the regular expression. Also, one or more parentheses of the symbols can be omitted on condition that the symbols are interpreted without any ambiguity.

Also, a regular transformation in which a character string on the finite set $\Sigma$ is transformed into another character string on a finite set $\Delta$ is an extended concept of the regular expression which is originally defined in the present invention, and the regular transformation is a character string defined according to following definitions indicating a method for transforming a set of character strings on the finite set $\Sigma$ into a set of character strings on the finite set $\Delta$.

(1) In a first definition, in cases where a symbol R is a regular expression of a set of character strings on a finite set $\Sigma$ and a symbol d is character strings on a finite set $\Delta$, a symbol (R/d) is a regular transformation from character strings on the finite set $\Sigma$ to character strings on the finite set $\Delta$, characterized in that a set of character strings R on the finite set $\Sigma$ is transformed into another set $\{d\}$ of character strings d on the finite set $\Delta$ and another set of other character strings on the finite set $\Sigma$ is transformed into the empty set on the finite set $\Delta$.

(2) In a second definition, in cases where symbols (R/d), (S/e) respectively are a regular transformation from character strings on the finite set $\Sigma$ to character strings on the finite set $\Delta$, a symbol ((R/d)+(S/e)) is a regular transformation from character strings on the finite set $\Sigma$ to character strings on the finite set $\Delta$, characterized in that a set of character strings on the finite set $\Sigma$ not indicated by S but indicated by R is transformed into the set $\{d\}$ of character strings d on the finite set $\Delta$, a set of character strings on the finite set $\Sigma$ not indicated by R but indicated by S is transformed into the set $\{e\}$ of character strings e on the finite set $\Delta$, and a set of character strings on the finite set $\Sigma$ indicated by R and S is transformed into the set $\{d,e\}$ of character strings on the finite set $\Delta$.

(3) In a third definition, in cases where symbols (R/d), (S/e) respectively are a regular transformation from character strings on the finite set $\Sigma$ to character strings on the finite set $\Delta$, a symbol (R/d)(S/e)) is a regular transformation from character strings on the finite set $\Sigma$ to character strings on the finite set $\Delta$, characterized in that a set of character strings on the finite set $\Sigma$ not indicated by (RS) but indicated by R is transformed into the set $\{d\}$ of character strings d on the finite set $\Delta$, a set of character strings on the finite set $\Sigma$ indicated by (RS) is transformed into the set $\{de\}$ of character strings on the finite set $\Delta$, and other sets of character strings on the finite set $\Sigma$ are transformed into the empty set $\phi$ on the finite set $\Delta$.

(4) In a fourth definition, in cases where a symbol (R/d) is a regular transformation from character strings on the finite set $\Sigma$ to character strings on the finite set $\Delta$, a symbol ((R/d)*) is a regular transformation equivalent to another regular transformation (—((a+d)+(R/d))+(R/d)(R/d))+—).

(5) In a fifth definition, other sets not defined by one of the first to fourth definitions are not the regular transformation. Also, one or more parentheses in the sets can be omitted on condition that the sets are interpreted without any ambiguity.

Because of various researches performed until now, a Robinson method in which a nondeterministic Moore machine for performing the same transformation as that expressed by a regular transformation when the regular transformation is given is efficiently constructed by performing a limited number of calculations proportional to a length of the regular transformation and a subset constructing method in which a deterministic Moore machine equivalent to a nondeterministic Moore machine given is constructed are well-known. Because the subset constructing method closely relates to the present invention, the subset constructing method is described as an example of the prior art.

The equivalence of a nondeterministic Moore machine and a deterministic Moore machine is defined as that an output string output from the nondeterministic Moore machine is the same as that output from the deterministic Moore machine when an arbitrary input string is input to the machines. In this case, a deterministic Moore machine DMO=(Q',$\Sigma$,$\Delta$',$\delta$',$\lambda$',q') equivalent to a nondeterministic Moore machine NMO=(Q,$\Sigma$,$\Delta$,$\delta$,$\lambda$,q) given can be constructed as follows.

A state set Q' is defined as a set including all of subsets of a set Q as elements, and an initial state q' is set to $\{q\}$. An output set $\Delta$' is defined as a set including all of subsets of a set $\Delta$ as elements, and a value of an output function $\lambda$'($\{q1, ---,qN\}$) is defined as $\lambda(q1)$ U—U $\lambda(qN)$. A set $\Sigma$ indicating an input from the outside in the deterministic Moore machine is used in common with the nondeterministic Moore machine. A value of a state-transition function $\delta$'($\{q1, ---,qN\}$, c) for arbitrary elements $\{q1, ---,qN\}$ of the state set Q' and an arbitrary element c of the set $\Sigma$ is defined as $\delta(q1,c)$ U—U $\delta(qN,c)$. The equivalence of the nondeterministic Moore machine and the deterministic Moore machine constructed according to the above definitions can be easily proved according to an induction as to a length of an input string given from the outside.

Next, an example of a conventional automatic product inspection system in which a constructing method of the deterministic Moore machine described above is used is described.

FIG. 1 is a block diagram indicating a configuration of a conventional automatic product inspection system.

As shown in FIG. 1, a conventional automatic product inspection system 11 comprises a first sensor 12 for detecting one of first features of a product conveyed on a conveyer every prescribed time and outputting a value "0" or "1" every prescribed time, a second sensor 13 for detecting one of second features of the product every prescribed time and outputting a value "0" or "1" every prescribed time, a deterministic Moore machine constructing unit 14 for producing pieces of DMO data of a deterministic Moore machine according to pieces of NMO data of a nondeterministic Moore machine input from an external equipment (not shown), a control unit 15 composed of an electronic circuit for producing pieces of control data corresponding to a final state of the deterministic Moore machine which is determined according to the DMO data produced in the deterministic Moore machine constructing unit 14 and the values time-sequentially transferred from the first and second sensors 12, 13 as a finite input set, and a sealing robot 16 for sealing the product in cases where pieces of control data indicating that the product is a non-defective product are produced in the control unit 15.

In the above configuration, a constructing method of a deterministic Moore machine performed in the deterministic Moore machine constructing unit 14 to use the deterministic Moore machine in the control unit 15 for the purpose of moving the sealing robot 16 is described. Supposing that the sealing robot 16 is moved according to the control data produced from the NMO data of the nondeterministic Moore machine, a state-transition view of the nondeterministic Moore machine is shown in FIG. 2. In FIG. 2, $S_0$ denotes an initial state from which the inspection of each of the products is started. An external input from the first sensor 12 to the control unit 15 is indicated by a symbol A1 corresponding to a value "1" or another symbol A0 corresponding to a value "0". An external input from the second sensor 13 to the control unit 15 is indicated by a symbol B1 corresponding to a value "1" or another symbol B0 corresponding to a value "0". An input α to the nondeterministic Moore machine is indicated by the combination of the external inputs such as A0B0, A0B1, A1B0 or A1B1. In cases where an input α takes a state of the nondeterministic Moore machine from a current state to the empty set (or in cases where any transition of the nondeterministic Moore machine from a current state for an input is not defined), a current product is judged as a defective product in the control unit 15, and a succeeding product is inspected. In cases where a series of inputs takes a state of the nondeterministic Moore machine from the initial state $S_0$ to a final state $S_5$ marked by double circles, a current product is judged as a non-defective product in the control unit 15, and the current product is sealed by the sealing robot 16.

However, because the nondeterministic Moore machine is directly used, an input takes a state of the nondeterministic Moore machine from a current state to a plurality of states. For example, an input A1B0 takes a state of the nondeterministic Moore machine from the initial state to next states $S_1$ and $S_2$. Therefore, the control unit 15 is difficult to be composed of an electronic circuit in cases where the control unit 15 is operated according to the state-transition of the nondeterministic Moore machine shown in FIG. 2.

FIG. 3 is a state table showing a process for constructing a deterministic Moore machine from the nondeterministic Moore machine shown in FIG. 2 according to the subset constructing method, and FIG. 4 is a state-transition view of the deterministic Moore machine constructed according to the process shown in FIG. 3.

In the subset constructing method, the correspondence between a plurality of nondeterministic states (or a plurality of subsets of states) and a deterministic state is determined, the state-transition of the nondeterministic Moore machine from a plurality of subsets of states for a series of inputs given from the outside is examined, and a state-transition of the deterministic Moore machine is constructed. For example, as shown in FIG. 3, an input A0B1 takes a state of the deterministic Moore machine from a current state $t_0=\{S_0\}$ to a next state $t3=\{S_2\}$, an input A1B0 takes a state of the deterministic Moore machine from a current state $t_0=\{S_0\}$ to a next state $t2=\{S_1,S_2\}$, and each of inputs A1B1, A0B0 takes a state of the deterministic Moore machine from a current state $t_0=\{S_0\}$ to the empty state $t1=\phi$.

Therefore, as shown in FIG. 4, because the state-transition of the deterministic Moore machine from a current state to a next state is defined for all types of inputs, the control unit 15 can be composed of an electronic circuit in cases where the control unit 15 is operated according to the state-transition of the deterministic Moore machine shown in FIG. 4. For example, the control unit 15 is composed of a programmable circuit device such as a programmable integrated circuit, a field programmable gate array or the like or a micro-computer. Also, a software for automatically producing a program required to operate the programmable device from the deterministic Moore machine shown in FIG. 4 is prepared in most of the programmable devices, and a design of the control circuit is broadly performed by utilizing a model of the finite-state machine as a method for expressing a circuitry of the control circuit at higher abstraction than a circuit diagram of the control circuit.

The finite-state machine can be broadly applied as various types of pattern-matching machines as well as the various control systems. In detail, a plurality of elements composing a piece of referential pattern-matching data are given to a pattern-matching machine in order as a series of inputs given from the outside. The referential pattern-matching data denotes a piece of data which should be examined. Thereafter, a series of symbols or numerals designating the detected pattern is output just after the pattern-matching data agreeing with the detected pattern is input to the pattern-matching machine. That is, the referential pattern-matching data is transformed according to the regular transformation, a nondeterministic Moore machine is constructed according to the referential pattern-matching data transformed, a deterministic Moore machine is constructed according to the nondeterministic Moore machine, and a pattern-matching operation is performed by utilizing the deterministic Moore machine. Though the pattern matching operation can be performed by utilizing the nondeterministic Moore machine, in cases where the referential pattern-matching data is long, in other words in cases where the number of elements composing the referential pattern-matching data is large, the pattern matching operation utilizing the deterministic Moore machine can be performed at a shorter time.

In general, when a length of the referential pattern-matching data is expressed by a symbol N and a length of the regular transformation (or a length of a character string) is expressed by a symbol M, a processing time proportional to NM is required in case of the pattern matching operation utilizing the nondeterministic Moore machine. In contrast, a processing time proportional to N is required at the most in case of the pattern matching operation utilizing the deterministic Moore machine. However, another processing time proportional to $2^M$ is required to construct the deterministic Moore machine from the nondeterministic Moore machine. Accordingly, in cases where the referential pattern-matching data is long (or N is large), a processing time required for the pattern matching operation utilizing the deterministic Moore machine can be shortened as compared with the pattern matching operation utilizing the nondeterministic Moore machine.

An example of a conventional pattern-matching system in which a constructing method of the conventional pattern-matching machine described above is used is described.

In the conventional pattern-matching machine, a plurality of referential character strings desired to be found out can be simultaneously collated with character strings of a stored document by scanning the character strings of the stored document once, and a referential pattern indicated by a referential character string desired to be found out can be specified according to the regular expression.

FIG. 5 is a block diagram of a conventional pattern-matching system which is a portion of a conventional document retrieving system.

As shown in FIG. 5, a conventional pattern-matching system 21 comprises an input document memory 22 for storing character strings of an input document and reading out characters of the character strings one by one, a DMO constructing unit 23 for receiving a plurality of referential character strings desired to be found out and pieces of NMO data of a nondeterministic Moore machine input from an external equipment (not shown) and producing pieces of DMO data from the NMO data, a state number table memory 24 composed of a random access memory for storing a plurality of state numbers respectively indicating a partial matching condition between the input document and the referential character strings in a two-dimensional table in which the state numbers and character codes of the input document are listed, a state number register 25 for recording a state number output from the state number table memory 24, and an operation number table memory 26 for storing a plurality of operation numbers indicating types of operations other than the pattern matching operation performed in pattern-matching system 21 and outputting an operation number according to the state number output from the state number register 25.

In the state number table memory 24, a state-transition table (for example shown in FIG. 3) of the deterministic Moore machine calculated to satisfy pattern matching conditions represented by the referential character strings. The pattern matching conditions are specified according to the regular transformation. For example, a referential character string abcd is shown in FIG. 6. In FIG. 6, [^a] denotes all characters other than the character a, a symbol "|" in "x..|x..|x..|x..|x.." denotes a logic OR, and a symbol A denotes an output. Therefore, in cases where a referential character string abcd and pieces of NMO data are input to the DMO constructing unit 23, character strings of the input document abcd, [^a]bcd, a[^b]cd, ab[^c]d and abc[^d] satisfy the pattern matching conditions, and each of the character strings is successfully pattern-matched with the referential character string abcd in the deterministic Moore machine constructed to fit the referential character string abcd before the output A informing of the pattern matching is output.

In the above configuration, the operation of the conventional pattern-matching system 21 is described.

Before a pattern matching operation is performed, a plurality of referential character strings desired to be found out and pieces of NMO data of a nondeterministic Moore machine are input from an external equipment to the DMO constructing unit 23. The NMO data indicates a state-transition in the nondeterministic Moore machine and includes one or more types of operations to be performed when a pattern matching is successfully achieved. Thereafter, pieces of DMO data are produced from the NMO data and are stored in the state number table memory 24 and the operation number table memory 26.

Thereafter, character strings of an input document are stored in the input document memory 22 after the input document memory 22 is initialized, and a remarked character of the input document is set to a head portion of the input document. Also, the state number register 25 is initialized, and a state number of a current state is initially set to zero. Also, the pattern matching conditions are stored in the state number table memory 24 and the operation number table memory 26.

Thereafter, a retrieving address is determined according to a state number of a current state output from the state number register 25 and a character number of a remarked character of the input document output from the input document memory 22, and a next state listed at the retrieving address of the two-dimensional table is determined in the state number table memory 24. Thereafter, the next state is replaced with the current state recorded in the state number register 25. That is, the next state is regarded as a current state newly defined. For example, character numbers of characters of the input document range from 0 to 65535, state numbers in the state number table memory 24 range from 0 to 8191, and addresses of the two-dimensional table in the state number table memory 24 are sent through twenty-nine address lines. The state numbers are sent through lower thirteen address lines, and the character numbers are sent through upper sixteen address lines.

Thereafter, an operation number stored in the operation number table memory 26 is determined according to the state number recorded in the state number register 25, and an additional operation indicated by the operation number is performed. For example, a position of the remarked character in the input document specified in the input document memory 22 is recorded as an additional operation. Thereafter, the remarked character is replaced with a lower character of the input document adjacent to the remarked character. Thereafter, a next state is determined in the same manner according to a current state and a character number of a remarked character newly determined, and an additional operation corresponding to the next state is performed. The operation for determining a next state and an additional operation corresponding to the next state are repeated until a patter matching operation is stopped according to the additional operation or a final character of the input document is scanned as a remarked character, and the pattern matching operation of the input document is finished.

An example of the NMO data and the DMO data is shown in FIGS. 7 to 11.

FIG. 7 is a state-transition table of the nondeterministic Moore machine constructed to satisfy the pattern matching conditions expressed in regular expression shown in FIG. 6 according to a Robinson method, FIG. 8 is a state-transition view of the nondeterministic Moore machine constructed to satisfy the pattern matching conditions expressed in the regular expression shown in FIG. 6 according to the Robinson method, FIGS. 9(a), 9(b) shows a process for constructing the deterministic Moore machine by utilizing the nondeterministic Moore machine, FIG. 10 is a state-transition table of the deterministic Moore machine constructed according to the process shown in FIGS. 9(a), 9(b), and FIG. 11 is a state-transition view of the deterministic Moore machine constructed according to the process shown in FIGS. 9(a), 9(b).

In FIG. 7, the state numbers 1 to 17 of the states t1 to t17 are listed in a state column, an output having a value A is listed in an output column, state numbers of next states for each of inputs a, b, c and d are listed in a next state column, and state numbers of next states for an input $ denoting characters other than a, b, c and d are listed in the next state column. For example, as shown in FIGS. 7 and 8, an input a takes a state of the nondeterministic Moore machine from the state t1 to next states t1,t3,t9,t12 and t15, an input 5 takes a state of the nondeterministic Moore machine from the state t1 to next states t1 and t6, and an input $ takes a state of the nondeterministic Moore machine from the state t1 to next states t1 and t6.

In FIGS. 9(a), 9(b), "DMO_state(i): {q1,q2, - - - ,qm)" denotes that the i-th state of the deterministic Moore machine corresponds to a set having states q1,q2, - - - ,qm of the nondeterministic Moore machine as elements. "DMO_goto ({i},"x")={p1, - - - ,pn) (j)" denotes that the input x takes a state of the deterministic Moore machine from a current state having a state number i to a next state having a state number j which corresponds to a set having states p1, - - - ,pn of the nondeterministic Moore machine as elements.

In FIG. 10, the state numbers 1 to 18 of the states t1 to t18 are listed in a state column, an output having a value A is listed in an output column, state numbers of next states for each of inputs a, b, c and d are listed in a next state column, and state numbers of next states for an input $ denoting characters other than a, b, c and d are listed in the next state column. The number of transitions is summed up to sixty-seven in cases where a transition between the same states is counted up.

As is described above, the deterministic Moore machine can be applied for various fields such as a control system and a pattern-matching system, and an output can be responded for an input within a prescribed processing time regardless of the complexity of the deterministic Moore machine.

2.2. Problems to be Solved by the Invention

However, there is a first drawback that it takes a long time to construct the finite-state machine according to the constructing method of the deterministic Moore machine. Also, there is a second drawback that a size of the finite-state machine (or a size of a state-transition table in an actual applied system) is large. Because a processing time required to construct a large sized state-transition table is larger than that proportional to the number of effective elements included in the state-transition table, the first drawback relates to the second drawback.

In contrast, in cases where the nondeterministic Moore machine is used to obtain an output responding to an input without constructing any deterministic Moore machine, the nondeterministic Moore machine can be constructed at a short processing time, and a size of the nondeterministic Moore machine. However, in cases where the nondeterministic Moore machine is complicated, there is a drawback that the nondeterministic Moore machine cannot be operated at high speed.

Also, in cases where the nondeterministic Moore machine often passes though particular state and transition, to heighten an operational speed of the nondeterministic Moore machine, it is effective that the particular state and transition of the nondeterministic Moore machine are transformed into state and transition functioning in the same manner as those of the deterministic Moore machine. However, there is a drawback that it is difficult to transform the particular state and transition of the nondeterministic Moore machine.

SUMMARY OF THE INVENTION

A first object of the present invention is to provide, with due consideration to the drawbacks of such a conventional constructing method of the finite-state machine, a constructing method of a finite-state machine with failure transitions in which a finite-state machine with failure transitions having a smaller size than that of the deterministic Moore machine is constructed at higher speed than that in the conventional constructing method of the finite-state machine. Also, the first object is to provide an automatic product inspection system in which a product is inspected by utilizing the constructing method of the finite-state machine with failure transitions.

A second object of the present invention is to provide a transforming method of the finite-state machine with failure transitions constructed according to the constructing method of the finite-state machine in which a state-transition operation is efficiently performed at a high speed. Also, the second object is to provide an automatic product inspection system in which a product is inspected by utilizing the transforming method of the finite-state machine with failure transitions.

A third object of the present invention is to provide a constructing method of a pattern-matching machine which are constructed by specializing the constructing method of the finite-state machine for a pattern matching. Also, the third object is to provide a document retrieving apparatus in which a product is inspected by utilizing the constructing method of the pattern matching apparatus.

A fourth object of the present invention is to provide a transforming method of the pattern-matching machine constructed according to the constructing method of the pattern-matching machine in which a state-transition operation is efficiently performed at a high speed. Also, the fourth object is to provide a document retrieving apparatus in which a product is inspected by utilizing the transforming method of the pattern matching apparatus.

The first object is achieved by the provision of a constructing method of a finite-state machine with failure transitions, comprising the steps of:

preparing a nondeterministic finite-state machine, an external input taking the nondeterministic finite-state machine from a current state to a plurality of next states;

producing a deterministic finite-state machine by utilizing the nondeterministic finite-state machine, an external input taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine;

regarding a combination <p,q> of state sets p and q as states of the deterministic finite-state machine, the state set q being a set of states in the nondeterministic finite-state machine, and the set p being defined as a subset of the state set q;

setting an initial state $s_0$ of the deterministic finite-state machine to a state $<\{q_0\},\{q_0\}>$, $q_0$ denoting an initial state of the nondeterministic finite-state machine;

storing the initial state $s_0=<\{q_0\},\{q0\}>$ to add the initial state $s_0$ to a state set of the deterministic finite-state machine as an element having an unprocessed tag;

setting an output $\mu(s_0)$ of the deterministic finite-state machine at the initial state $s_0$ to be a set $\{\lambda(q_0)\}$ having an output of the nondeterministic finite-state machine at the initial state $q_0$;

storing the output $\mu(s_0)$;

producing a state $<\phi,\phi>$ of the deterministic finite-state machine obtained in case of $q=\phi$;

storing the state <φ,φ> to add the state <φ,φ> to the state set of the deterministic finite-state machine as an element having a processed tag;

setting a value μ(<φ,φ>) of an output function μ of the deterministic finite-state machine at the state <φ,φ> to be an empty set φ;

storing the value μ(<φ,φ>);

setting values g(<φ,φ>,c) of a success function g for arbitrary external inputs c to be the state <φ,φ>;

storing the values g(<φ,φ>,c);

checking whether or not one or more elements respectively having an unprocessed tag exist in the state set of the deterministic finite-state machine;

selecting one of the elements <p,q> respectively having an unprocessed tag from the set of states of the deterministic finite-state machine as a selected element <p,q> in cases where one or more elements <p,q> respectively having an unprocessed tag exist in the set of states of the deterministic finite-state machine;

changing the selected element <p,q> having an unprocessed tag to a selected element <p,q> having a processed tag;

setting one or more values g(<p,q>,c) of the success function g to one or more states <x,y> of the deterministic finite-state machine for first external inputs c which specify a non-empty set of next states δ(t,c) defined in the nondeterministic finite-state machine according to one of elements t of a state set p of the nondeterministic finite-state machine corresponding to a first component of the selected state <p,q>;

selecting a union Uδ(t,c) of the next states δ(t,c) of the nondeterministic finite-state machine for the first external inputs c and the elements t of the set p as values of a set y;

selecting the values of the set y or a no-empty subset of the set y as elements of a set x;

storing the values g(<p,q>,c)=<x,y>;

storing the states <x,y> to add the states <x,y> to the state set of the deterministic finite-state machine as elements respectively having an unprocessed tag in cases where the states <x,y> are not stored;

setting a union U{λ(t)} of outputs λ(t) of the nondeterministic finite-state machine for elements t of the set y as output values μ(<x,y>) of the output function μ of the deterministic finite-state machine at the states <x,y> in cases where the values μ(<x,y>) are not defined;

storing the output values μ(<x,y>)=U{λ(t)};

setting values f(<p,q>) of a failure function f not depending on any of second external inputs d to states <z,q–p> obtained by combining a difference set q–p defined by removing elements of the subset p from elements of the set q and an arbitrary subset z of the difference set q–p in cases where each of the second external inputs d does not specify any of next states g(<p,q>,d) defined in the nondeterministic finite-state machine for any of elements of the state set p of the selected element <p,q>;

storing the values f(<p,q>)=<z,q–p> stored;

setting a union U{λ(t)} of outputs λ(t) of the nondeterministic finite-state machine for elements t of the difference set q–p to output values μ(<z,q–p>) of the output function μ of the deterministic finite-state machine at the states <z,q–p> in cases where the values μ(<x,y>) of the output function μ are not defined;

storing the output values μ(<z,q–p>)=Uλ(t));

repeating the steps of checking whether or not one or more elements, selecting one of the elements <p,q>, changing the selected element <p,q>, setting one or more values g(<p,q>,c), selecting a union Uδ(t,c), selecting the values of the set y, storing the values g(<p,q>,c)=<x,y>, storing the states <x,y>, setting a union U{λ(t)}, storing the output values μ(<x,y>), setting values f(<p,q>), storing the values f(<p,q>), setting a union U{λ(t)}, and storing the output values μ(<z,q–p>) until no existence of an element having an unprocessed tag is detected in the step of checking whether or not one or more elements; and defining the deterministic finite-state machine modified in the above steps as a finite-state machine with failure transitions, wherein the number of states <p,q> is finite, an external input c takes the finite-state machine with failure transitions from a current state s to a next state g(s,c) and an output μ(s) is output from the next state g(s,c) in cases where a value g(s,c) of the success function g is defined, and an external input c takes the finite-state machine with failure transitions from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined.

In the above steps, in cases where a finite-state machine with failure transitions FFM is constructed, a combination <p,q> of sets p and q is regarded as states of a deterministic finite-state machine. In this case, a state set q is included in a nondeterministic finite-state machine and a state set p is a subset of the set q. Thereafter, an initial construction of the finite-state machine FFM is performed in a first step. In detail, by utilizing an initial state $q_0$ of the nondeterministic finite-state machine, an initial state $s_0$ of the deterministic finite-state machine is set to a state <{$q_0$},{$q_0$}>, and the initial state $s_0$=<{$q_0$},{$q_0$}> is stored to add the initial state $s_0$ to a state set of the deterministic finite-state machine as an element having an unprocessed tag. Thereafter, an output μ($s_0$) of the deterministic finite-state machine at the initial state $s_0$ is set to be a set {λ($q_0$)} having an output of the nondeterministic finite-state machine at the initial state $q_0$, and the output μ($s_0$) is stored. Also, a state <φ,φ> of the deterministic finite-state machine obtained in case of q=φ is produced and stored to add the state <φ,φ> to the state set of the deterministic finite-state machine as an element having a processed tag. Thereafter, a value μ(<φ,φ>) of an output function μ of the deterministic finite-state machine at the state <φ,φ> is set to be the empty set φ and is stored. In addition, values g(<φ,φ>,c) of a success function g for arbitrary external inputs c are set to be the state <φ,φ> and are stored.

In a second step of the method for constructing the finite-state machine FFM, in cases where an element having an unprocessed tag does not exist in the state set of the deterministic finite-state machine placed, no existence of an element having an unprocessed tag is detected, and the construction of the finite-state machine FFM is finished. In contrast, in cases where one or more elements <p,q> respectively having an unprocessed tag exist in the set of states of the deterministic finite-state machine, one of the elements <p,q> respectively having an unprocessed tag is selected from the set of states of the deterministic finite-state machine as a selected element <p,q> according to a certain calculation, and the selected element <p,q> having an unprocessed tag are changed to a selected element <p,q> having a processed tag.

In a third step of the method for constructing the finite-state machine FFM, one or more values g(<p,q>,c)= of the success function g are set to one or more states <x,y> of the deterministic finite-state machine for each of external inputs c which specifies a next state $\delta(t,c)$ defined in the nondeterministic finite-state machine according to one of element t of a state set p of the nondeterministic finite-state machine corresponding to a first component of the selected state $<p,q>$, and the values $g(<p,q>,c)=<x,y>$ are stored. In this case, a union $U\delta(t,c)$ of the next states $\delta(t,c)$ of the nondeterministic finite-state machine for the external inputs c and the elements t of the set p is selected as values of a set y, and the values of the set y or a no-empty subset of the set y are selected as a value of a set x. Thereafter, in cases where one or more states $<x,y>$ are not stored, the states $<x,y>$ are stored to add the states $<x,y>$ to the state set of the deterministic finite-state machine as elements respectively having an unprocessed tag. Also, in cases where output values $w=\mu(<x,y>)$ of the output function $\mu$ of the deterministic finite-state machine at the states $<x,y>$ are not defined, a union $U\{\lambda(t)\}$ of outputs $\lambda(t)$ of the nondeterministic finite-state machine for elements t of the set y is calculated as the output values w and is stored.

In a fourth step of the method for constructing the finite-state machine FFM, in cases where each of external inputs d does not specify any of next states $g(<p,q>,d)$ defined in the nondeterministic finite-state machine for any of elements of the state set p of the selected element $<p,q>$, values $f(<p,q>)$ of a failure function f not depending on any of the external inputs d are calculated to be states $<z,q-p>$ obtained by combining a difference set q–p defined by removing elements of the subset p from elements of the set q and an arbitrary subset z of the difference set q–p, and the values $f(<p,q>)$ are stored. Also, in cases where output values $w=\mu(<z,q-p>)$ of the output function $\mu$ of the deterministic finite-state machine at the states $<z,q-p>$ are not defined, a union $U\{\lambda(t)\}$ of outputs $\lambda(t)$ of the nondeterministic finite-state machine for elements t of the difference set q–p is calculated as the values w and is stored.

In a fifth step of the method for constructing the finite-state machine FFM, the procedure for constructing the finite-state machine FFM returns to the second step, and the procedure from the second step to the fourth step is repeated until no existence of an element having an unprocessed tag is detected in the second step.

Accordingly, a finite-state machine with failure transitions FFM in which a table of transitions has a small size than that in a conventional deterministic finite-state machine can be constructed at a high speed.

Also, the first object is achieved by the provision of an automatic product inspection system, comprising:

finite-state machine with failure transitions constructing means for constructing a finite-state machine with failure transitions from a nondeterministic finite-state machine according to a constructing method, the constructing method comprising the steps of preparing the nondeterministic finite-state machine, an external input taking the nondeterministic finite-state machine from a current state to a plurality of next states, producing a deterministic finite-state machine by utilizing the nondeterministic finite-state machine, an external input taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine, regarding a combination $<p,q>$ of state sets p and q as states of the deterministic finite-state machine, the state set q being a set of states in the nondeterministic finite-state machine, and the set p being defined as a subset of the state set q, setting an initial state $s_0$ of the deterministic finite-state machine to a state $<\{q_0\},\{q_0\}>$, $q_0$ denoting an initial state of the nondeterministic finite-state machine, storing the initial state $s_0=<\{q_0\},\{q_0\}>$ to add the initial state $s_0$ to a state set of the deterministic finite-state machine as an element having an unprocessed tag, setting an output $\mu(s_0)$ of the deterministic finite-state machine at the initial state $s_0$ to be a set $\{k(q_0)\}$ having an output of the nondeterministic finite-state machine at the initial state $q_0$, storing the output $\mu(s_0)$, producing a state $<\phi,\phi>$ of the deterministic finite-state machine obtained in case of $q=\phi$, storing the state $<\phi,\phi>$ to add the state $<\phi,\phi>$ to the state set of the deterministic finite-state machine as an element having a processed tag, setting a value $\mu(<\phi,\phi>)$ of an output function $\mu$ of the deterministic finite-state machine at the state $<\phi,\phi>$ to be an empty set $\phi$, storing the value $\mu(<\phi,\phi>)$, setting values $g(<\phi,\phi>,c)$ of a success function g for arbitrary external inputs c to be the state $<\phi,\phi>$, storing the values $g(<\phi,\phi>,c)$, checking whether or not one or more elements respectively having an unprocessed tag exist in the state set of the deterministic finite-state machine, selecting one of the elements $<p,q>$ respectively having an unprocessed tag from the set of states of the deterministic finite-state machine as a selected element $<p,q>$ in cases where one or more elements $<p,q>$ respectively having an unprocessed tag exist in the set of states of the deterministic finite-state machine, changing the selected element $<p,q>$ having an unprocessed tag to a selected element $<p,q>$ having a processed tag, setting one or more values $g(<p,q>,c)$ of the success function g to one or more states $<x,y>$ of the deterministic finite-state machine for first external inputs c which specify a non-empty set of next states $\delta(t,c)$ defined in the nondeterministic finite-state machine according to one of elements t of a state set p of the nondeterministic finite-state machine corresponding to a first component of the selected state $<p,q>$, selecting a union $U\delta(t,c)$ of the next states $\delta(t,c)$ of the nondeterministic finite-state machine for the first external inputs c and the elements t of the set p as values of a set y, selecting the values of the set y or a no-empty subset of the set y as elements of a set x, storing the values $g(<p,q>,c)=<x,y>$, storing the states $<x,y>$ to add the states $<x,y>$ to the state set of the deterministic finite-state machine as elements respectively having an unprocessed tag in cases where the states $<x,y>$ are not stored, setting a union $U\{\lambda(t)\}$ of outputs $\lambda(t)$ of the nondeterministic finite-state machine for elements t of the set y as output values $\mu(<x,y>)$ of the output function $\mu$ of the deterministic finite-state machine at the states $<x,y>$ in cases where the values $\mu(<x,y>)$ are not defined, storing the output values $g(<x,y>)=U\{\lambda(t)\}$, setting values f(<p,q>) of a failure function f not depending on any of second external inputs d to states <z,q−p> obtained by combining a difference set q−p defined by removing elements of the subset p from elements of the set q and an arbitrary subset z of the difference set q−p in cases where each of the second external inputs d does not specify any of next states g(<p,q>,d) defined in the nondeterministic finite-state machine for any of elements of the state set p of the selected element <p,q>, storing the values f(<p,q>)=<z,q−p> stored, setting a union U{λ(t)} of outputs λ(t) of the nondeterministic finite-state machine for elements t of the difference set q−p to output values μ(<z,q−p>) of the output function μ of the deterministic finite-state machine at the states <z,q−p> in cases where the values μ(<x,y>) of the output function μ are not defined, storing the output values μ(<z,q−p>)=U{λ(t)}, repeating the steps of checking whether or not one or more elements, selecting one of the elements <p,q>, changing the selected element <p,q>, setting one or more values g(<p,q>,c), selecting a union Uδ(t,c), selecting the values of the set y, storing the values g(<p,q>,c)=<x,y>, storing the states <x,y>, setting a union U{λ(t)}, storing the output values μ(<x,y>), setting values f(<p,q>), storing the values f(<p,q>), setting a union U{λ(t)}, and storing the output values μ(<z,q−p>) until no existence of an element having an unprocessed tag is detected in the step of checking whether or not one or more elements, and defining the deterministic finite-state machine modified in the above steps as a finite-state machine with failure transitions, wherein the number of states <p,q> is finite, an external input c takes the finite-state machine with failure transitions from a current state s to a next state g(s,c) and an output μ(s) is output from the next state g(s,c) in cases where a value g(s,c) of the success function g is defined, and an external input c takes the finite-state machine with failure transitions from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions constructed in the finite-state machine with failure transitions constructing means by utilizing the string of inspecting values Iv produced in the detecting means, each of the inspecting values Iv taking the finite-state machine with failure transitions from a current state s to a next state g(s,Iv) and an output μ(s) being output from the next state g(s,Iv) in cases where a value g(s,Iv) of the success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs μ(s) produced in the control means.

In the above configuration, the finite-state machine with failure transitions is constructed in the finite-state machine with failure transitions constructing means according to the constructing method in the same manner as described above. Thereafter, state-transitions of the finite-state machine with failure transitions is performed in the control means by utilizing the string of inspecting values Iv produced in the detecting means, and the product is processed by the action means according to the outputs μ(s) produced in the control means.

Accordingly, even though it is required to detect a large number of types of features existing in the product for the purpose of processing the product, the finite-state machine with failure transitions constructing means can be made of a small sized programmable integrated circuit.

The second object is achieved by the provision of a transforming method of a finite-state machine with failure transitions, comprising the steps of:

preparing a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next stateg g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

selecting an originally remarked state <p,q> of the finite-state machine with failure transitions and a particular external input c, a state set q being a set of states in a nondeterministic finite-state machine, and a set p being defined as a subset of the state set q;

examining whether or not a value g(<p,q>, c) of the success function g for the originally remarked state <p,q> and the particular external input c is defined;

expressing the originally remarked state <p,q> by a symbol P denoting a remarked state in cases where the value g(<p,q>,c) of the success function g is not defined;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions;

defining a value g(<p,q>,c) of the success function g as g(h,c) to determine a next state g(<p,q>,c)=g(h,c) for the originally remarked state <p,q> and the particular external input c;

storing the next state g(<p,q>,c);

repeating the above steps of selecting an originally remarked state, examining whether or not a value, expressing the originally remarked state, obtaining a value h=f(f(...f(P)...)), defining a value g(<p,q>,c) and storing the next state by changing the particular external input to one of external inputs until the next states g(<p,q>,c) for the originally remarked state <p,q> and all of the external inputs are defined and stored; and cancelling the definition of the value f(<p,q>) of the failure function f for the originally remarked state <p,q>.

In the above steps, in cases where a finite-state machine with failure transitions FFM constructed according to the above-mentioned constructing method is transformed according to a transforming method, after a finite-state machine with failure transitions FFM is constructed according to the above-mentioned constructing method, a first step is performed. That is, an originally remarked state <p,q> and a particular external input c are selected. Thereafter, it is examined whether or not a value g(<p,q>),c) of the success function g is defined. In cases where the value g(<p,q>),c) is defined, the value g(<p,q>),c) denotes a next state in a particular success transition, and the transforming method is finished. In contrast, in cases where the value g(<p,q>,c) of the success function g is not defined, the originally remarked state <p,q> is expressed by a symbol P denoting a remarked state.

Thereafter, in a second step, a value f(P) of the failure function f is calculated to determine a failed next state denoting a next state in the particular failure transition. In cases where a value g(f(P),c) of the success function g is not defined, the state f(P) is expressed by the symbol P denoting a remarked state newly defined, and the calculation of the value f(P) is repeated until a value g(f(P),c) of the success function g is defined. In other words, as shown in FIG. 19, a value h=f(f(...f(P)...)) is calculated by repeating the calculation of the failure function f until a value g(h,c) of the success function g is defined.

Thereafter, in a third step, a value g(<p,q>,c) of the success function g is defined to g(h,c) to determine a next state g(<p,q>,c)=g(h,c) for the originally remarked state <p,q> and the particular external input c. Thereafter, the next state g(<p,q>,c) is stored. In the same manner, values g(<p,q>,x) of the success function g are defined as next states for the originally remarked state <p,q> and arbitrary external inputs x, and the next states g(<p,q>,x) are stored.

Thereafter, in a fourth step, the definition of the value f(<p,q>) of the failure function f is cancelled to delete the particular failure transition from the remarked state <p,q>.

Thereafter, in a fifth step of the first transforming method, the procedure of the first transforming method is finished.

Accordingly, because a plurality of failure transitions are changed to a success transition, a state-transition operation of the machine FFM transformed according to the transforming method can be efficiently performed at a high speed.

Also, the transforming method can be performed even though the machine FFM is under operation on condition that the machine FFM is not placed at the originally remarked state <p,q> during the operation of the machine FFM.

It is preferred that the step of selecting an originally remarked state <p,q> include the steps of:

judging whether or not a storage region Sr required to store values g(<p,q>,c) of the success function g defined in the finite-state machine with failure transitions and values f(<p,q>) of the failure function f defined in the finite-state machine with failure transitions is smaller than a fixed storage region; and preparing the originally remarked state <p,q> on condition that the storage region Sr is smaller than the fixed storage region, and the step of defining a value g(<p,q>,c) of the success function g includes the steps of:

judging whether or not an increased storage region required to additionally store the values g(<p,q>,c) of the success function g for the remarked state <p,q> and all of the external inputs c is smaller than the fixed storage region; and defining the values g(<p,q>,c) of the success function g on condition that the increased storage region is equal to or smaller than the fixed storage region.

In the above steps, it is judged whether or not a storage region Sr required to store values g(<p,q>,c) of the success function g and values f(<p,q>) of the failure function f defined in the finite-state machine with failure transitions FFM is smaller than a fixed storage region. In cases where the storage region Sr is smaller than the fixed storage region, an originally remarked state <p,q> of the machine FFM is selected, and each of strings of failure transitions is changed to a success transition for each of external inputs on condition that the increased storage region is smaller than the fixed storage region.

Accordingly, because each of the strings of failure transitions is changed to a success transition on condition that the storage region Sr occupied by the values g(<p,q>,c) and the values f(<p,q>) defined in the state-transition of the machine FFM is smaller than the fixed storage region, the machine FFM in which a supreme state-transition operation is statistically performed can be constructed according to the transforming method within the fixed storage region.

Also, the second object is achieved by the provision of an automatic product inspection system, comprising:

finite-state machine with failure transitions transforming means for transforming, according to a transforming method, a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined, the transforming method comprising the steps of selecting an originally remarked state <p,q> of the finite-state machine with failure transitions and a particular external input c, a state set q being a set of states in a nondeterministic finite-state machine, and a set p being defined as a subset of the state set q, examining whether or not a value g(<p,q>, c) of the success function g for the originally remarked state <p,q> and the particular external input c is defined, expressing the originally remarked state <p,q> by a symbol P denoting a remarked state in cases where the value g(<p,q>,c) of the success function g is not defined, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions, defining a value g(<p,q>,c) of the success function g as g(h,c) to determine a next state g(<p,q>,c)=g(h,c) for the originally remarked state <p,q> and the particular external input c, storing the next state g(<p,q>,c), repeating the above steps of selecting an originally remarked state, examining whether or not a value, expressing the originally remarked state, obtaining a value h=f(f(...f(P)...)), defining a value g(<p,q>,c) and storing the next state by changing the particular external input to one of external inputs until the next states g(<p,q>,c) for the originally remarked state <p,q> and all of the external inputs are defined and stored, and cancelling the definition of the value $f(<p,q>)$ of the failure function f for the originally remarked state $<p,q>$;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions transformed in the finite-state machine with failure transitions transforming means by utilizing the string of inspecting values Iv produced in the detecting means, each of the inspecting values Iv taking the finite-state machine with failure transitions from a current state s to a next state g(s,Iv) and an output $\mu(s)$ being output from the next state g(s,Iv) in cases where a value g(s,Iv) of the success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs $\mu(s)$ produced in the control means.

In the above configuration, the finite-state machine with failure transitions is transformed in the finite-state machine with failure transitions transforming means according to the transforming method in the same manner as described above. Thereafter, state-transitions of the finite-state machine with failure transitions is performed in the control means by utilizing the string of inspecting values Iv produced in the detecting means, and the product is processed by the action means according to the outputs $\mu(s)$ produced in the control means.

Accordingly, because state-transitions relating to the failure function f are changed to a state-transition relating to the success function g, supreme state-transitions can be statistically performed in the finite-state machine with failure transitions transformed according to the transforming method.

Also, the second object is achieved by the provision of a transforming method of a finite-state machine with failure transitions, comprising the steps of:

preparing a finite-state machine with failure transitions in which the number of states $<p,q>$ is finite, an external input c takes the finite-state machine with failure transitions from a current state s to a next state g(s,c) and an output $\mu(s)$ is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

counting the number of state-transitions performed by applying the failure function f for each of current states and each of external inputs while operating the finite-state machine with failure transitions, the external inputs taking the finite-state machine with failure transitions from the current states to next states;

halting the operation of the finite-state machine with failure transitions in cases where the number of state-transitions from a particular current state $<p,q>$ to a particular next state $f(<p,q>)$ for a particular external input c reaches a fixed number of times, a state set p being defined as a non-empty subset of a finite state set Q of a nondeterministic finite-state machine, and a set r being defined as a subset of a finite state S of the finite-state machine with failure transitions;

expressing the particular current state $<p,q>$ by a symbol P denoting a remarked state;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions;

defining a value $g(<p,q>,c)$ of the success function g as g(h,c) to determine a next state $g(<p,q>,c)=g(h,c)$ for the particular current state $<p,q>$ and the particular external input c;

storing the next state $g(<p,q>,e)$; and restarting the operation of the finite-state machine with failure transitions.

In the above steps, in cases where the number of state-transitions performed between two states not necessarily adjacent to each other is counted during the operation of the finite-state machine with failure transitions FFM to change a string of failure transitions actually performed at a high frequency to a success function, the machine FFM is operated after the machine FFM is constructed according to the above-mentioned constructing method. Thereafter, the number of calculations performed by applying the failure function to take the machine FFM from each of current states to each of next states according to each of external inputs is counted for each of the current states and each of the external inputs. Thereafter, when the number of calculations performed by applying the failure function f to perform a particular failure transition of the machine FFM from a particular current state for a particular external input is summed up to a fixed number of times, the operation of the machine FFM is halted.

Thereafter, the particular failure transition is changed to a particular success transition for the particular current state and the particular external input in the same manner as the above-mentioned transforming method to transform the machine FFM into a transformed machine FFM. Thereafter, the operation of the transformed machine FFM is restarted.

Accordingly, because the machine FFM is transformed into the transformed machine FFM according to the transforming method to be fitted for a particular type of external inputs, the transformed machine FFM can be appropriately operated at a high speed for each of types of external inputs.

Also, the second object is achieved by the provision of an automatic product inspection system, comprising:

finite-state machine with failure transitions transforming means for transforming, according to a transforming method, a finite-state machine with failure transitions in which the number of states $<p,q>$ is finite, an external input c takes the finite-state machine with failure transitions from a current state s to a next state g(s,c) and an output $\mu(s)$ is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined, the transforming method comprising the steps of counting the number of state-transitions performed by applying the failure function f for each of current states and each of external inputs while operating the finite-state machine with failure transitions, the external inputs taking the finite-state machine with failure transitions from the current states to next states, halting the operation of the finite-state machine with failure transitions in cases where the number of state-transitions from a particular current state <p,q> to a particular next state f(<p,q>) for a particular external input c reaches a fixed number of times, a state set p being defined as a non-empty subset of a finite state set Q of a nondeterministic finite-state machine, and a set r being defined as a subset of a finite state S of the finite-state machine with failure transitions, expressing the particular current state <p,q> by a symbol P denoting a remarked state, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions, defining a value g(<p,q>,c) of the success function g as g(h,c) to determine a next state g(<p,q>,c)=g(h,c) for the particular current state <p,q> and the particular external input c, storing the next state g(<p,q>,c), and restarting the operation of the finite-state machine with failure transitions;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions transformed in the finite-state machine with failure transitions transforming means by utilizing the string of inspecting values Iv produced in the detecting means, each of the inspecting values Iv taking the finite-state machine with failure transitions from a current state s to a next state g(s,Iv) and an output $\mu(s)$ being output from the next state g(s,Iv) in cases where a value g(s,Iv) of the success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs $\mu(s)$ produced in the control means.

In the above configuration, the finite-state machine with failure transitions is transformed in the finite-state machine with failure transitions transforming means according to the transforming method in the same manner as described above. Thereafter, state-transitions of the finite-state machine with failure transitions is performed in the control means by utilizing the string of inspecting values Iv produced in the detecting means, and the product is processed by the action means according to the outputs $\mu(s)$ produced in the control means.

Accordingly, because state-transitions relating to the failure function f are changed to a state-transition relating to the success function g, the inspection of the product can be appropriately performed at a high speed for each of types of external inputs.

The third object is achieved by the provision of a constructing method of a pattern matching machine for collating strings of external characters written in an input document with one or more strings of referential characters and finding out one or more strings of external characters respectively agreeing with one of the strings of referential characters, comprising the steps of:

preparing a nondeterministic finite-state machine, an external input taking the nondeterministic finite-state machine from a current state to a plurality of next states;

producing a deterministic finite-state machine by utilizing the nondeterministic finite-state machine, an external character taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine;

regarding a combination <p,r> of state sets p and r as states of the deterministic finite-state machine, the state set p being defined as a non-empty subset of a finite state set Q of the nondeterministic finite-state machine, and the state set r being defined as a subset of a finite state S of the deterministic finite-state machine;

setting an initial state $s_0$ of the deterministic finite-state machine to a state <{$q_0$},$s_0$>, $q_0$ denoting an initial state of the nondeterministic finite-state machine;

storing the initial state $s_0$=<{$q_0$},$s_0$> to add the initial state $s_0$ to a state set of the deterministic finite-state machine as an element having an unprocessed tag;

setting an output $\mu(s_0)$ of the deterministic finite-state machine at the initial state $s_0$ to be a set {$\lambda(q_0)$} having an output of the nondeterministic finite-state machine at the initial state $q_0$;

storing the output $\mu(s_0)$;

checking whether or not one or more elements respectively having an unprocessed tag exist in the state set of the deterministic finite-state machine;

selecting an element <p,r> first added to the state set of the deterministic finite-state machine from the state set of the deterministic finite-state machine as a selected element in cases where one or more elements <p,r> respectively having an unprocessed tag exist in the state set of the deterministic finite-state machine;

changing the selected element <p,r> having an unprocessed tag to an selected element <p,r> having a processed tag;

selecting the initial state $s_0$ as an element of a set x in case of <p,r>=$s_0$;

repeating a first calculation r(<p,r>) for taking out a second component r of the selected state <p,r> one or more times until values g(.,c)=g(r(r(...r(<p,r>)...)),c) of a success function g are defined to obtain a state u=r(r(...r(<p,r>)...)) and selecting values g(u,c) of the success function g for the state u and first referential characters c as values of a set x in case of <p,r>≠$s_0$, the first referential characters c specifying a no-empty set of next states $\delta$(t,c) defined in the nondeterministic finite-state machine according to one of elements t of a state set p of the nondeterministic finite-state machine which corresponds to a first component of the selected state <p,r>;

calculating a first union U$\delta$(t,c) of next states $\delta$(t,c) of the nondeterministic finite-state machine for elements t of the state set p and the first referential characters c;

calculating a second union $p(x)Up(r(x))Up(r(r(x)))U$—$Up(r(r(...r(x)...)))$ of a string of sets $p(x),p(r(x)),p(r(r(x))),---,p(r(r(...r(x)...)))$ obtained by applying a second calculation for taking out a first component p of the selected state <p,r> of the deterministic finite-state machine after the first calculation r(x) is repeated a zero time or more;

selecting difference sets $U\delta(t,c)-p(x)Up(r(x))Up(r(r(x)))U$—$Up(r(r(...r(x)...)))$ of the first and second unions for the first referential characters c as values of a set y;

setting one or more values g(<p,r>,c) of the success function g for the selected element <p,r> denoting a current state and the first referential characters c to elements of the set x in cases where the set y is the empty set;

setting the values g(<p,r>,c) of the success function g to the states <y,x> in cases where the set y is not the empty set;

storing the values g(<p,r>,c) of the success function g to add the values g(<p,r>,c) to the state set of the deterministic finite-state machine as elements respectively having an unprocessed tag in cases where the values g(<p,r>,c) are not stored;

calculating a third union $U\{\delta(z,c)\}$ of next states $\delta(z,c)$ in the nondeterministic finite-state machine for elements z of a state set p of the nondeterministic finite-state machine corresponding to a first component of the selected element <p,r> and the first referential characters c;

setting output values $\mu(g(<p,r>,c))$ of an output function of the deterministic finite-state machine at the states g(<p,r>,c) to a fourth union $U\{\lambda(t)\}$ of values $\lambda(t)$ of an output function $\lambda$ of the nondeterministic finite-state machine for elements t of the third union $U\{\delta(z,c)\}$;

storing the output values $\mu(g(<p,r>,c))=U\{\lambda(t)\}$;

setting values f(g(<p,r>,c)) of the failure function f at the states g(<p,r>,c) to elements of a state set r of the nondeterministic finite-state machine corresponding to a second component of the selected element <p,r> in cases where one or more second referential characters c which specify next states $\delta(t,c)$ defined in the nondeterministic finite-state machine according to one of elements t of a state set p of the nondeterministic finite-state machine corresponding to a first component of the selected element <p,r> exist;

storing the values f(g(<p,r>,c))=r;

repeating the steps of checking whether or not one or more elements, selecting an element <p,r>, changing the selected element, selecting the initial states, repeating a first calculation, calculating a first union, calculating a second union, selecting difference sets, setting one or more values, setting the values g(<p,r>,c), storing the values g(<p,r>,c), calculating a third union, setting output values, storing the output values, and setting values f(g(<p,r>,c)), storing the values f(g(<p,r>,c)) until no existence of an element having an unprocessed tag is detected in the step of checking whether or not one or more elements; and defining the deterministic finite-state machine modified in the above steps as a pattern matching machine, wherein the number of states <p,r> is finite, a referential character c takes the pattern matching machine from a current state s to a next state g(s,c) and an output $\mu(s)$ is output from the next state g(s,c) in cases where a value g(s,c) of the success function g is defined, and a referential character c takes the pattern matching machine from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined.

In the above steps, a combination <p,r> of state sets p and r is regarded as states of the pattern matching machine. In this case, a state set p is a non-empty subset of a finite-state set of the nondeterministic finite-state machine and a state set r is a subset of the deterministic finite-state machine. Thereafter, in a first step, an initial state $s_0$ of the pattern matching machine is set to a state $<\{q_0\},s_0>$ by utilizing an initial state $q_0$ of the nondeterministic finite-state machine, and the initial state $s_0=<\{q_0\},s_0>$ is stored to add the initial state $s_0$ to a state set of the pattern matching machine as an element having an unprocessed tag. Thereafter, an output $\mu(s_0)$ of the pattern matching machine at the initial state $s_0$ is set to be a set $\{\lambda(q_0)\}$ having an output of the nondeterministic finite-state machine at the initial state $q_0$, and the output $\mu(s_0)$ is stored.

In a second step, in cases where an element having an unprocessed tag does not exist in the state set of the pattern matching machine, no existence of an element having an unprocessed tag is detected, and the construction of the pattern matching machine is finished. In contrast, in cases where one or more elements <p,r> respectively having an unprocessed tag exist in the state set of the pattern matching machine, an element <p,r> first added to the state set of the pattern matching machine is selected from the state set of the pattern matching machine as a selected element, and the selected element <p,r> having an unprocessed tag is changed to an selected element <p,r> respectively having a processed tag.

In a third step, one or more values g(<p,r>,c) of the success function g for each of first referential characters c which specify next states $\delta(t,c)$ defined in the nondeterministic finite-state machine according to one of elements t of a state set p of the nondeterministic finite-state machine corresponding to a first component of the selected element <p,r> are set to values Y denoting next states defined in the pattern matching machine. The values Y are determined as follows. The initial state $s_0$ is selected as an element of a set x in case of <p,r>=$s_0$. In case of <p,r>≠$s_0$, a first calculation r(<p,r>) for taking out a second component r of the selected state <p,r> is repeated one or more times until values g(.,c)=g(r(r(...r(<p,r>)...)),c) of a success function g are defined to obtain a state u=r(r(...r(<p,r>)...)), and values g(u,c) of the success function g for the state u and the first referential characters c are selected as values of a set x. Also, a first union $U\delta(t,c)$ of next states $\delta(t,c)$ of the nondeterministic finite-state machine for elements t of the set p of states and the first referential characters c is calculated, a second union $p(x)Up(r(x))Up(r(r(x)))U$—$Up(r(r(...r(x)...)))$ of a string of sets $p(x),p(r(x)),p(r(r(x))),---,p(r(r(...r(x)...)))$ obtained by applying a second calculation for taking out a first component p of the selected state <p,r> of the pattern matching machine after the first calculation r(x) is repeated a zero time or more is calculated, and difference sets $U\delta(t,c)-p(x)Up(r(x))Up(r(r(x)))U$—$Up(r(r(...r(x)...)))$ of the first and second unions for the first referential characters c are selected as values of a set y. In cases where the set y is the empty set, the values g(<p,r>,c) of the success function g in the pattern matching machine is set to elements of the set x (Y≡x). In cases where the set y is not the empty set, the values g(<p,r>,c) of the success function g in the pattern matching machine are set to states <y,x> (Y≡<y,x>). Thereafter, the values g(<p,r>,c) of the success function g are stored.

Thereafter, in cases where the values Y of the success function g are not stored, the values Y are stored to add the values Y to the state set of the pattern matching machine as elements respectively having an unprocessed tag. The values Y denote states defined in the pattern matching machine. Also, output values $\mu(Y)$ of the output function $\mu$ of the pattern matching machine at the states Y are calculated as follows. A third union $U\{\delta(z,c)\}$ of next states $\delta(z,c)$ in the nondeterministic finite-state machine for elements z of a state set p of the nondeterministic finite-state machine corresponding to a first component of the selected element <p,r> and the first referential characters c is calculated, and the output values $\mu(Y)$ are set to a fourth union $U\{\lambda(t)\}$ of values $\lambda(t)$ of the output function $\lambda$ of the nondeterministic finite-state machine for elements t of the third union $U\{\delta(z,c)\}$. Thereafter, the output values $\mu(Y)=U\{\lambda(t)\}$ are stored.

In a fourth step of the method for constructing the pattern matching machine, in cases where one or more second referential characters c which specify next states $\delta(t,c)$ defined in the nondeterministic finite-state machine according to one of elements t of a state set p of the nondeterministic finite-state machine corresponding to a first component of the selected element <p,r> exist, values f(Y) of the failure function f at the states $Y \equiv g(<p,r>,c)$ are set to elements of a state set r of the nondeterministic finite-state machine corresponding to a second component of the selected element <p,r> and are stored.

In a fifth step of the method for constructing the pattern matching machine, the procedure for constructing the pattern matching machine returns to the second step, and the procedure from the second step to the fourth step is repeated until no existence of an element having an unprocessed tag is detected.

Accordingly, a pattern matching machine in which a table of the state transitions has a smaller size than that in a conventional deterministic finite-state machine can be constructed at a high speed.

Also, the third object is achieved by the provision of a document retrieving apparatus for collating strings of external characters written in an input document with one or more strings of referential characters and finding out one or more strings of external characters respectively agreeing with one of the strings of referential characters, comprising:

pattern matching machine constructing means for constructing a pattern matching machine from a nondeterministic finite-state machine according to a constructing method, the constructing method comprising the steps of preparing the nondeterministic finite-state machine, an external input taking the nondeterministic finite-state machine from a current state to a plurality of next states, producing a deterministic finite-state machine by utilizing the nondeterministic finite-state machine, an external character taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine, regarding a combination <p,r> of state sets p and r as states of the deterministic finite-state machine, the state set p being defined as a non-empty subset of a finite state set Q of the nondeterministic finite-state machine, and the state set r being defined as a subset of a finite state S of the deterministic finite-state machine, setting an initial state $s_0$ of the deterministic finite-state machine to a state $<\{q_0\},s_0>$, $q_0$ denoting an initial state of the nondeterministic finite-state machine, storing the initial state $s_0=<\{q_0\},s_0>$ to add the initial state $s_0$ to a state set of the deterministic finite-state machine as an element having an unprocessed tag, setting an output $\mu(s_0)$ of the deterministic finite-state machine at the initial state $s_0$ to be a set $\{\lambda(q_0)\}$ having an output of the nondeterministic finite-state machine at the initial state $q_0$, storing the output $\mu(s_0)$, checking whether or not one or more elements respectively having an unprocessed tag exist in the state set of the deterministic finite-state machine, selecting an element <p,r> first added to the state set of the deterministic finite-state machine from the state set of the deterministic finite-state machine as a selected element in cases where one or more elements <p,r> respectively having an unprocessed tag exist in the state set of the deterministic finite-state machine, changing the selected element <p,r> having an unprocessed tag to an selected element <p,r> having a processed tag, selecting the initial state $s_0$ as an element of a set x in case of $<p,r>=s_0$, repeating a first calculation r(<p,r>) for taking out a second component r of the selected state <p,r> one or more times until values $g(.,c)=g(r(r(...r(<p,r>)...)),c)$ of a success function g are defined to obtain a state $u=r(r(...r(<p,r>)...))$ and selecting values g(u,c) of the success function g for the state u and first referential characters c as values of a set x in case of $<p,r>\neq s_0$, the first referential characters c specifying a no-empty set of next states $\delta(t,c)$ defined in the nondeterministic finite-state machine according to one of elements t of a state set p of the nondeterministic finite-state machine which corresponds to a first component of the selected state <p,r>, calculating a first union $U\delta(t,c)$ of next states $\delta(t,c)$ of the nondeterministic finite-state machine for elements t of the state set p and the first referential characters c;

calculating a second union p(x)Up(r(x))Up(r(r(x)))U— Up(r(r(...r(x)...))) of a string of sets p(x),p(r(x)),p(r(r(x))), - - - ,p(r(r(...r(x)...))) obtained by applying a second calculation for taking out a first component p of the selected state <p,r> of the deterministic finite-state machine after the first calculation r(x) is repeated a zero time or more, selecting difference sets $U\delta(t,c)-p(x)Up(r(x))U-p(r(r(x)))U$—Up(r(r(...r(x)...))) of the first and second unions for the first referential characters c as values of a set y, setting one or more values g(<p,r>,c) of the success function g for the selected element <p,r> denoting a current state and the first referential characters c to elements of the set x in cases where the set y is the empty set, setting the values g(<p,r>,c) of the success function g to the states <y,x> in cases where the set y is not the empty set, storing the values g(<p,r>,c) of the success function g to add the values g(<p,r>,c) to the state set of the deterministic finite-state machine as elements respectively having an unprocessed tag in cases where the values g(<p,r>,c) are not stored, calculating a third union $U\{\delta(z,c)\}$ of next states $\delta(z,c)$ in the nondeterministic finite-state machine for elements z of a state set p of the nondeterministic finite-state machine corresponding to a first component of the selected element <p,r> and the first referential characters c, setting output values $\mu(g(<p,r>,c))$ of an output function $\mu$ of the deterministic finite-state machine at the states g(<p, r>,c) to a fourth union U{λ(t)} of values λ(t) of an output function λ of the nondeterministic finite-state machine for elements t of the third union U{δ(z,c)}, storing the output values μ(g(<p,r>,c))=U{λ(t)}, setting values f(g(<p,r>,c)) of the failure function f at the states g(<p,r>,c) to elements of a state set r of the nondeterministic finite-state machine corresponding to a second component of the selected element <p,r> in cases where one or more second referential characters c which specify next states δ(t,c) defined in the nondeterministic finite-state machine according to one of elements t of a state set p of the nondeterministic finite-state machine corresponding to a first component of the selected element <p,r> exist, storing the values f(g(<p,r>,c))=r, repeating the steps of checking whether or not one or more elements, selecting an element <p,r>, changing the selected element, selecting the initial states, repeating a first calculation, calculating a first union, calculating a second union, selecting difference sets, setting one or more values, setting the values g(<p,r>,c), storing the values g(<p,r>,c), calculating a third union, setting output values, storing the output values, and setting values f(g(<p,r>,c)), storing the values f(g(<p,r>,c)) until no existence of an element having an unprocessed tag is detected in the step of checking whether or not one or more elements, and defining the deterministic finite-state machine modified in the above steps as the pattern matching machine, wherein the number of states <p,r> is finite, a referential character c takes the pattern matching machine from a current state s to a next state g(s,c) and an output μ(s) is output from the next state g(s,c) in cases where a value g(s,c) of the success function g is defined, and a referential character c takes the pattern matching machine from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined;

input document storing means for storing a plurality of strings of external characters written in an input document and outputting time-sequentially remarked characters Cr selected from the external characters one by one;

success function storing means for storing values of the success function g defined in the pattern matching machine constructing means;

failure function storing means for storing values of the failure function g defined in the pattern matching machine constructing means;

state recording means for recording a particular state g(t1,Cr) denoting a next state in cases where a value g(t1,Cr) of the success function g for a current state t1 of the pattern matching machine and a remarked character Cr output from the input document storing means is defined in the success function storing means, and recording a particular state g(h,Cr) (where h=f(f(...f(t1)...))) as a next state determined by repeating a process that a value f(t1) of the failure function f is calculated and the value f(t1) is rewritten to the symbol t1 newly defined until a value g(h,Cr) of the success function defined is found out in the success function storing means in cases where a value g(t1,Cr) of the success function g for a current state t1 of the pattern matching machine and a remarked character Cr output from the input document storing means is not defined in the success function storing means; and action storing means for storing actions denoting outputs at the states of the pattern matching machine produced in the pattern matching machine constructing means and outputting particular actions corresponding to particular states St time-sequentially transferred from the state recording means, the particular actions being used to judge whether or not a string of remarked characters Cr relating to the particular states St is pattern-matched with one of the strings of referential characters.

In the above configuration, the pattern matching machine is constructed in the pattern matching machine constructing means by utilizing the strings of referential characters according to the constructing method in the same manner as described above. Thereafter, values of the success function g are stored in the success function storing means, values of the failure function f are stored in the failure function storing means, and outputs at the states of the pattern matching machine are stored as actions in the action number storing means.

Thereafter, each of external characters of an input document stored in the input document storing means is retrieved with a referential character of the strings of the referential characters. In detail, a remarked character Cr is output from the input document storing means to the success function storing means. Thereafter, in cases where a value (t1,Cr) of the success function g for a current state t1 and the remarked character Cr is found out in the success function storing means, the value (t1,Cr) denoting a next state of the pattern matching machine is stored as a particular state in the state recording means. In contrast, the value (t1,Cr) of the success function g is found out in the success function storing means, the operation for searching for a value f(f(...f(t1)...)) is performed in the failure function storing means until a value g(f(f(...f(t1)...)),Cr) of the success function g is found out in the success function storing means, and the value g(f(f(...f(t1)...)),Cr) denoting a next state of the pattern matching machine is stored as a particular state in the state recording means.

Thereafter, the particular states for the remarked characters Cr are time-sequentially transferred to the action storing means, and particular actions corresponding to the particular states are output to be used for the judgement whether or not a string of remarked characters Cr stored in the input document storing means is pattern-matched with a string of referential characters.

Accordingly, because the pattern matching machine is constructed according to the constructing method, the pattern matching of the strings of external characters with the strings of the referential characters can be performed at a high speed.

The fourth object is achieved by the provision of a transforming method of a pattern matching machine for collating strings of external characters written in an input document with one or more strings of referential characters and finding out one or more strings of external characters respectively agreeing with one of the strings of referential characters, comprising the steps of:

preparing a pattern matching machine in which the number of states <p,r> is finite, a referential character c takes the pattern matching machine from a current state s to a next state g(s,c) and an output μ(s) is output from the next state g(s,c) in cases where a value g(s,c) of a success function g is defined, and a referential character c takes the pattern matching machine from the current state s to a next state h=f(f(...f(s)...)) determined by repeating a process that a value f(s) of a failure function f is calculated and the value f(s) is rewritten to the symbol s until a value g(h,c) of the success function g is defined in cases where a value g(s,c) of the success function g is not defined;

selecting an originally remarked state <p,r> of the pattern matching machine and a particular referential character c, a state set p being defined as a non-empty subset of a finite state set Q of a nondeterministic finite-state machine, and a set r being defined as a subset of a finite state S of the pattern matching machine;

examining whether or not a value g(<p,r>, c) of the success function g for the originally remarked state <p,r> and the particular referential character c is defined;

expressing the originally remarked state <p,r> by a symbol P denoting a remarked state in cases where the value g(<p,r>,c) of the success function g is not defined;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine;

defining a value g(<p,r>,c) of the success function g as g(h,c) to determine a next state g(<p,r>,c)=g(h,c) for the originally remarked state <p,r> and the particular referential character c;

storing the next state g(<p,r>,c);

repeating the above steps of selecting an originally remarked state, examining whether or not a value, expressing the originally remarked state, obtaining a value h=f(f(...f(P)...)), defining a value g(<p,r>,c) and storing the next state by changing the particular referential character to one of referential characters until the next states g(<p,r>,c) for the originally remarked state <p,r> and all of the referential characters are defined and stored; and cancelling the definition of the value f(<p,r>) of the failure function f for the originally remarked state <p,r>.

In the above steps, in cases where a pattern matching machine constructed according to the above-mentioned constructing method is transformed according to a transforming method, after a pattern matching machine is constructed according to the above-mentioned constructing method, a first step is performed. That is, an originally remarked state <p,r> and a particular referential character c are selected. Thereafter, it is examined whether or not a value g(<p,r>),c) of the success function g is defined. In cases where the value g(<p,r>),c) is defined, the value g(<p,r>),c) denotes a next state in a particular success transition, and the transforming method is finished. In contrast, in cases where the value g(<p,r>,c) of the success function g is not defined, the originally remarked state <p,r> is expressed by a symbol P denoting a remarked state.

Thereafter, in a second step, a value f(P) of the failure function f is calculated to determine a failed next state denoting a next state in the particular failure transition. In cases where a value g(f(P),c) of the success function g is not defined, the state f(P) is expressed by the symbol P denoting a remarked state newly defined, and the calculation of the value f(P) is repeated until a value g(f(P),c) of the success function g is defined. In other words, as shown in FIG. 19, a value h=f(f(...f(P)...)) is calculated by repeating the calculation of the failure function f until a value g(h,c) of the success function g is defined.

Thereafter, in a third step, a value g(<p,r>,c) of the success function g is defined to g(h,c) to determine a next state g(<p,r>,c)=g(h,c) for the originally remarked state <p,r> and the particular referential character c. Thereafter, the next state g(<p,r>,c) is stored. In the same manner, values g(<p,r>,x) of the success function g are defined as next states for the originally remarked state <p,r> and arbitrary referential characters x, and the next states g(<p,r>,x) are stored.

Thereafter, in a fourth step, the definition of the value f(<p,r>) of the failure function f is cancelled to delete the particular failure transition from the remarked state <p,r>.

Thereafter, in a fifth step of the first transforming method, the procedure of the first transforming method is finished.

Accordingly, because a plurality of failure transitions are changed to a success transition, a state-transition operation of the pattern matching machine transformed according to the transforming method can be efficiently performed at a high speed.

Also, the transforming method can be performed even though the pattern matching machine is under operation on condition that the pattern matching machine is not placed at the originally remarked state <p,r> during the operation of the pattern matching machine.

It is preferred that the step of selecting an originally remarked state <p,r> includes the steps of:

judging whether or not a storage region Sr required to store values g(<p,r>,c) of the success function g defined in the pattern matching machine and values f(<p,r>) of the failure function f defined in the pattern matching machine is smaller than a fixed storage region; and preparing the originally remarked state <p,r> on condition that the storage region Sr is smaller than the fixed storage region, and the step of defining a value g(<p,r>,c) of the success function g includes the steps of:

judging whether or not an increased storage region required to additionally store the values g(<p,r>,c) of the success function g for the remarked state <p,r> and all of the referential characters c is smaller than the fixed storage region; and defining the values g(<p,r>,c) of the success function g on condition that the increased storage region is equal to or smaller than the fixed storage region.

In the above steps, it is judged whether or not a storage region Sr required to store values g(<p,r>,c) of the success function g and values f(<p,r>) of the failure function f defined in the pattern matching machine is smaller than a fixed storage region. In cases where the storage region Sr is smaller than the fixed storage region, an originally remarked state <p,q> of the pattern matching machine is selected, and each of strings of failure transitions from the originally remarked state <p,q> is changed to a success transition for each of referential characters on condition that the increased storage region is smaller than the fixed storage region.

Accordingly, because each of the strings of failure transitions is changed to a success transition on condition that the storage region Sr occupied by the values g(<p,r>,c) and the values f(<p,r>) defined in the pattern matching machine is smaller than the fixed storage region, the pattern matching machine in which a supreme state-transition operation is statistically performed can be constructed according to the transforming method within the fixed storage region.

Also, the fourth object is achieved by the provision of a document retrieving apparatus for collating strings of external characters written in an input document with one or more strings of referential characters and finding out one or more strings of external characters respectively agreeing with one of the strings of referential characters, comprising:

pattern matching machine transforming means for transforming, according to a transforming method, a pattern matching machine in which the number of states <p,r> is finite, a referential character c takes the pattern matching machine from a current state s to a next state g(s,c) and an output μ(s) is output from the next state g(s,c) in cases where a value g(s,c) of a success function g is defined, and a referential character c takes the pattern matching machine from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where the value g(s,c) of the success function g is not defined, the transforming method comprising the steps of selecting an originally remarked state <p,r> of the pattern matching machine and a particular referential character c, a state set p being defined as a non-empty subset of a finite state set Q of a nondeterministic finite-state machine, and a set r being defined as a subset of a finite state S of the pattern matching machine, examining whether or not a value g(<p,r>, c) of the success function g for the originally remarked state <p,r> and the particular referential character c is defined, expressing the originally remarked state <p,r> by a symbol P denoting a remarked state in cases where the value g(<p,r>,c) of the success function g is not defined, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine, defining a value g(<p,r>,c) of the success function g as g(h,c) to determine a next state g(<p,r>,c)=g(h,c) for the originally remarked state <p,r> and the particular referential character c, storing the next state g(<p,r>,c), repeating the above steps of selecting an originally remarked state, examining whether or not a value, expressing the originally remarked state, obtaining a value h=f(f(...f(P)...)), defining a value g(<p,r>,c) and storing the next state by changing the particular referential character to one of referential characters until the next states g(<p,r>,c) for the originally remarked state <p,r> and all of the referential characters are defined and stored, and cancelling the definition of the value f(<p,r>) of the failure function f for the originally remarked state <p,r>;

input document storing means for storing a plurality of strings of external characters written in an input document and outputting time-sequentially remarked characters Cr selected from the external characters one by one;

success function storing means for storing values of the success function g defined in the pattern matching machine transforming means;

failure function storing means for storing values of the failure function g defined in the pattern matching machine transforming means;

state recording means for recording a particular state St=g(t1,Cr) denoting a next state in cases where a value g(t1,Cr) of the success function g for a current state t1 of the pattern matching machine and a remarked character Cr output from the input document storing means is defined in the success function storing means, and recording a particular state St=g(f(f(...f(t1)...)),Cr) denoting a next state in cases where a value g(t1,Cr) of the success function g for a current state t1 of the pattern matching machine and a remarked character Cr output from the input document storing means is not defined in the success function storing means, a value f(f(...f(t1)...)) being obtained by repeatedly finding out a value f(P) of the failure function g for a calculated result P while rewriting the value f(P) to the calculated result P in the failure function storing means until a value g(f(f(...f(t1)...)), Cr) of the success function g for the value f(f(...f(t1)...)) is found out in the success function storing means, and the value g(f(f(...f(t1)...)),Cr) found out in the success function storing means being transferred to the state recording means; and action storing means for storing actions denoting outputs at the states of the pattern matching machine produced in the pattern matching machine constructing means and outputting particular actions corresponding to particular states St time-sequentially transferred from the state recording means, the particular actions being used to judge whether or not a string of remarked characters Cr relating to the particular states St is pattern-matched with one of the strings of referential characters.

In the above configuration, the pattern matching machine is transformed in the pattern matching machine transforming means by utilizing the strings of referential characters according to the transforming method in the same manner as described above. Thereafter, values of the success function g are stored in the success function storing means, values of the failure function f are stored in the failure function storing means, and outputs at the states of the pattern matching machine are stored as actions in the action number storing means.

Thereafter, each of external characters of an input document stored in the input document storing means is retrieved with a referential character of the strings of the referential characters. In detail, a remarked character Cr is output from the input document storing means to the success function storing means. Thereafter, in cases where a value (t1,Cr) of the success function g for a current state t1 and the remarked character Cr is found out in the success function storing means, the value (t1,Cr) denoting a next state of the pattern matching machine is stored as a particular state in the state recording means. In contrast, the value (t1,Cr) of the success function g is found out in the success function storing means, the operation for searching for a value f(f(...f(t1)...)) is performed in the failure function storing means until a value g(f(f(...f(t1)...)),Cr) of the success function g is found out in the success function storing means, and the value g(f(f(...f(t1)...)),Cr) denoting a next state of the pattern matching machine is stored as a particular state in the state recording means.

Thereafter, the particular states for the remarked characters Cr are time-sequentially transferred to the action storing means, and particular actions corresponding to the particular states are output to be used for the judgement whether or not a string of remarked characters Cr stored in the input document storing means is pattern-matched with a string of referential characters.

Accordingly, because the pattern matching machine is transformed according to the transforming method, the pattern matching of the strings of external characters with the strings of the referential characters can be performed at a high speed.

Also, the fourth object is achieved by the provision of a transforming method of a pattern matching machine for collating strings of external characters written in an input document with one or more strings of referential characters and finding out one or more strings of external characters respectively agreeing with one of the strings of referential characters, comprising the steps of:

preparing a pattern matching machine in which the number of states <p,r> is finite, a referential characters c takes the pattern matching machine from a current state s to a next state g(s,c) and an output μ(s) is output from the next state g(s,c) in cases where a value g(s,c) of a success function g is defined, and a referential characters c takes the pattern matching machine from the current state s to a next state g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

counting the number of state-transitions performed by applying the failure function f for each of current states and each of referential characters while operating the pattern matching machine, the referential characters taking the pattern matching machine from the current states to next states;

halting the operation of the pattern matching machine in cases where the number of state-transitions from a particular current state <p,r> to a particular next state f(<p,r>) for a particular referential characters c reaches a fixed number of times, a state set p being defined as a non-empty subset of a finite state set Q of a nondeterministic finite-state machine, and a set r being defined as a subset of a finite state S of the pattern matching machine;

expressing the particular current state <p,r> by a symbol P denoting a remarked state;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine;

defining a value g(<p,r>,c) of the success function g as g(h,c) to determine a next state g(<p,r>,c)=g(h,c) for the particular current state <p,r> and the particular referential characters c;

storing the next state g(<p,r>,c); and restarting the operation of the pattern matching machine.

In the above steps, in cases where the number of state-transitions performed between two states not necessarily adjacent to each other is counted during the operation of the pattern matching machine to change a string of failure transitions actually performed at a high frequency to a success function, the pattern matching machine is operated after the pattern matching machine is constructed according to the above-mentioned constructing method. Thereafter, the number of calculations performed by applying the failure function to take the pattern matching machine from each of current states to each of next states according to each of referential characters is counted for each of the current states and each of the referential characters. Thereafter, when the number of calculations performed by applying the failure function f to perform a particular failure transition of the pattern matching machine from a particular current state for a particular referential character is summed up to a fixed number of times, the operation of the pattern matching machine is halted.

Thereafter, the particular failure transition is changed to a particular success transition for the particular current state and the particular referential character in the same manner as the above-mentioned transforming method to transform the pattern matching machine into a transformed pattern matching machine. Thereafter, the operation of the transformed pattern matching machine is restarted.

Accordingly, because the pattern matching machine is transformed into the transformed pattern matching machine according to the transforming method to be fitted for a particular type of referential characters, the transformed pattern matching machine can be appropriately operated at a high speed for each of types of referential characters.

Also, the fourth object is achieved by the provision of a document retrieving apparatus for collating strings of external characters written in an input document with one or more strings of referential characters and finding out one or more strings of external characters respectively agreeing with one of the strings of referential characters, comprising:

pattern matching machine transforming means for transforming, according to a transforming method, a pattern matching machine in which the number of states <p,r> is finite, a referential characters c takes the pattern matching machine from a current state s to a next state g(s,c) and an output μ(s) is output from the next state g(s,c) in cases where a value g(s,c) of a success function g is defined, and a referential characters c takes the pattern matching machine from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where the value g(s,c) of the success function g is not defined, the transforming method comprising the steps of counting the number of state-transitions performed by applying the failure function f for each of current states and each of referential characters while operating the pattern matching machine, the referential characters taking the pattern matching machine from the current states to next states, halting the operation of the pattern matching machine in cases where the number of state-transitions from a particular current state <p,r> to a particular next state f(<p,r>) for a particular referential characters c reaches a fixed number of times, a state set p being defined as a non-empty subset of a finite state set Q of a nondeterministic finite-state machine, and a set r being defined as a subset of a finite state S of the pattern matching machine, expressing the particular current state <p,r> by a symbol P denoting a remarked state, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine, defining a value g(<p,r>,c) of the success function g as g(h,c) to determine a next state g(<p,r>,c)=g(h,c) for the particular current state <p,r> and the particular referential characters c, storing the next state g(<p,r>,c), and restarting the operation of the pattern matching machine;

input document storing means for storing a plurality of strings of external characters written in an input document and outputting time-sequentially remarked characters Cr selected from the external characters one by one;

success function storing means for storing values of the success function g defined in the pattern matching machine transforming means;

failure function storing means for storing values of the failure function g defined in the pattern matching machine transforming means;

state recording means for recording a particular state $St=g(t1,Cr)$ denoting a next state in cases where a value $g(t1,Cr)$ of the success function g for a current state t1 of the pattern matching machine and a remarked character Cr output from the input document storing means is defined in the success function storing means, and recording a particular state $St=g(f(f(...f(t1)...)),Cr)$ denoting a next state in cases where a value $g(t1,Cr)$ of the success function g for a current state t1 of the pattern matching machine and a remarked character Cr output from the input document storing means is not defined in the success function storing means, a value $f(f(...f(t1)...))$ being obtained by repeatedly finding out a value $f(P)$ of the failure function g for a calculated result P while rewriting the value $f(P)$ to the calculated result P in the failure function storing means until a value $g(f(f(...f(t1)...)),Cr)$ of the success function g for the value $f(f(...f(t1)...))$ is found out in the success function storing means, and the value $g(f(f(...f(t1)...)),Cr)$ found out in the success function storing means being transferred to the state recording means; and action storing means for storing actions denoting outputs at the states of the pattern matching machine produced in the pattern matching machine constructing means and outputting particular actions corresponding to particular states; St time-sequentially transferred from the state recording means, the particular actions being used to judge whether or not a string of remarked characters Cr relating to the particular states St is pattern-matched with one of the strings of referential characters.

In the above configuration, the pattern matching machine is transformed in the pattern matching machine transforming means by utilizing the strings of referential characters according to the transforming method in the same manner as described above. Thereafter, values of the success function g are stored in the success function storing means, values of the failure function f are stored in the failure function storing means, and outputs at the states of the pattern matching machine are stored as actions in the action number storing means.

Thereafter, each of external characters of an input document stored in the input document storing means is retrieved with a referential character of the strings of the referential characters. In detail, a remarked character Cr is output from the input document storing means to the success function storing means. Thereafter, in cases where a value $(t1,Cr)$ of the success function g for a current state t1 and the remarked character Cr is found out in the success function storing means, the value $(t1,Cr)$ denoting a next state of the pattern matching machine is stored as a particular state in the state recording means. In contrast, the value $(t1,Cr)$ of the success function g is found out in the success function storing means, the operation for searching for a value $f(f(...f(t1)...))$ is performed in the failure function storing means until a value $g(f(f(...f(t1)...)),Cr)$ of the success function g is found out in the success function storing means, and the value $g(f(f(...f(t1)...)),Cr)$ denoting a next state of the pattern matching machine is stored as a particular state in the state recording means.

Thereafter, the particular states for the remarked characters Cr are time-sequentially transferred to the action storing means, and particular actions corresponding to the particular states are output to be used for the judgement whether or not a string of remarked characters Cr stored in the input document storing means is pattern-matched with a string of referential characters.

Accordingly, because the pattern matching machine is transformed according to the transforming method, the pattern matching of the strings of external characters with the strings of the referential characters can be performed at a high speed.

BRIEF DESCRIPTION OF THE DRAWINGS

The objects, features and advantages of the present invention will be apparent from the following description taken in conjunction with the accompanying drawings, in which:

FIG. 6 shows a pattern matching condition of a referential character string abcd collated with character strings of the input document;

FIG. 7 is a state-transition table of the nondeterministic Moore machine constructed to satisfy the pattern matching conditions expressed in regular expression shown in FIG. 6 according to a Robinson method;

FIGS. 9(a), 9(b) show a process for constructing the deterministic Moore machine by utilizing the nondeterministic Moore machine;

FIG. 10 is a state-transition table of the deterministic Moore machine constructed according to the process shown in FIG. 9;

FIG. 15 shows a procedure for constructing a Moore machine with failure transitions FMO from the NMO machine shown in FIG. 14 by applying the first constructing method;

FIG. 20 is a constitutional block diagram of an automatic product inspection system according to a second embodiment, a Moore machine with failure transitions FMO constructed according to the first constructing method shown in FIG. 13B being transformed according to the first transforming method shown in FIG. 17B in the automatic product inspection system;

FIG. 25 is a constitutional block diagram of an automatic product inspection system according to a modification of the second embodiment, the Moore machine with failure transitions FMO constructed according to the first constructing method shown in FIG. 13B being transformed according to the modified transforming method described in FIG. 24 in the automatic product inspection system;

FIGS. 28(a), 28(b) shows a soft program utilized to perform the third constructing method shown in FIG. 26B;

FIG. 29 shows a procedure for constructing a pattern maching machine from the NMO machine shown in FIG. 14 by applying the third constructing method;

FIG. 31 shows N strings of referential characters (N ranges from 1 to 11) for a duplicated character case and a non-duplicated character case, the strings indicating extended pattern matching conditions specified by a regular transformation;

DESCRIPTION OF THE PREFERRED EMBODIMENTS

Figure 1:
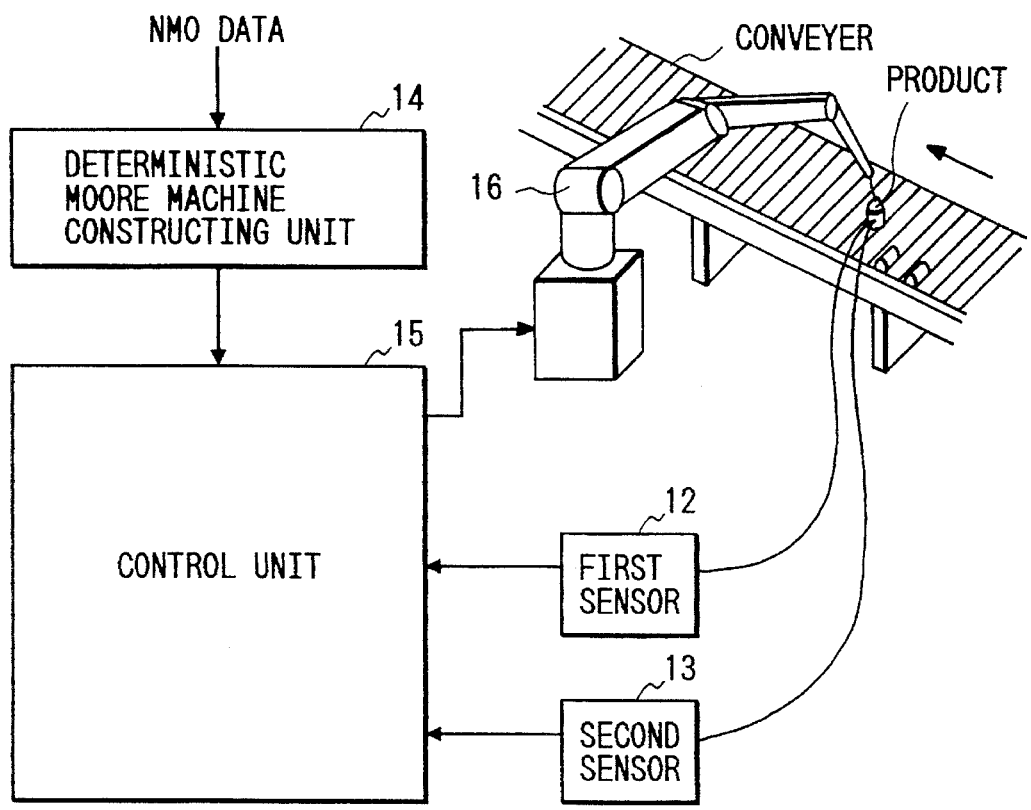
FIG. 1 is a block diagram indicating a configuration of a conventional automatic product inspection system.
Figure 2:
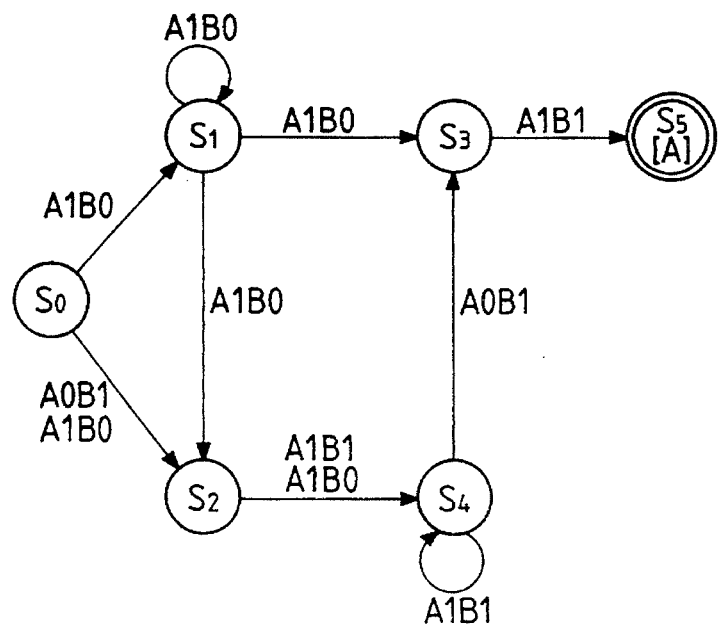
FIG. 2 is a state-transition view of the nondeterministic Moore machine.

Preferred embodiments of a constructing method of a finite-state machine, a constructing method of a pattern-matching machine, a transforming method of the finite-state machine and a transforming method of the pattern-matching machine according to the present invention are described with reference to drawings.

Before describing preferred embodiments, a mathematical preparation is described to smoothly realize the present invention.

First, a finite-state machine with failure transitions, a constructing method of the finite-state machine with failure transitions and a rightfulness of the constructing method are described.

A finite-state machine with failure transitions (abbreviated to FFM) utilized in the present invention is defined as a general term of a Moore machine with failure transitions (abbreviated to FMO) and a Mealy machine with failure transitions (abbreviated to FME). The Moore machine with failure transitions $FMO=(S,\Sigma,\Delta,g,f,\mu,s)$ consists of a finite set S of states, a finite input set $\Sigma$ expressed by symbolizing an input from the outside, a finite output set $\Delta$ expressed by symbolizing an output to the outside, a success function g defined as a partial function from a set $S\times\Sigma$ to the finite set S, a failure function f defined as a partial function from the finite set S to the finite set S, an output function $\mu$ of the Moore machine with failure transitions defined as a total function from the finite set S to subsets of the finite output set $\Delta$, and an initial state s equivalent to a particular element s of the finite state S.

The Mealy machine with failure transitions $FME=(S,\Sigma,\Delta,g,f,\lambda,s)$ consists of the finite set S of states, the finite input set $\Sigma$, the finite output set $\Delta$, the success function g, the failure function f, an output function $\lambda$ of the Mealy machine with failure transitions defined as a total function from the set $S\times\Sigma$ to subsets of the finite output set $\Delta$, and the initial state s.

The difference between a group of machines FMO and FME and another group of a conventional deterministic Moore machine (DMO) and a conventional deterministic Mealy machine (DME) is a method of state transitions. In detail, a state transition in the conventional machines DMO and DME is performed at one step by utilizing the state-transition function $\delta(q,c)$ which is a total function and determines a next state according to a current state q and a current input c. In contrast, a state transition in the machines FMO and FME is performed by utilizing the success function $g(q,c)$ which is a partial function and determines a next state according to a current state q and one of limited current inputs c in cases where the success function $g(q,c)$ is defined in advance and by utilizing the failure function $f(q)$ to specify one or more other states for the purpose of using state-transition information of the other states in cases where the success function $g(q,c)$ is not defined in advance.

In cases where a success function $g(q,c)$ is defined for a current state $q \in S$ and a current input $c \in \Sigma$, a next state is set to $g(q,c)$ so that a state transition is completed (a first state-transition operation). In this case, a value of the output function $\mu(q)$ is output in the Moore machine FMO, and a value of the output function $\lambda(q,c)$ is output in the Mealy machine FME.

In cases where a success function $g(q,c)$ is not defined for a current state $q \in S$ and a current input $c \in \Sigma$, the current state q is replaced with a value of the failure function $f(q)$ (a second state-transition operation), and whether or not a success function $g(f(q),c)$ is defined is judged to perform the first or second operation.

Because the success and failure functions are partial functions and because a range of a value of the failure function is not limited, there is a case that any final state is not defined even though one or more first state-transition operations are performed in general machines FMO and FME. Also, there is another case that the second state-transition operation is repeated infinite times in general machines FMO and FME.

In cases where the first and second state-transition operations are repeated finite times for a series of arbitrary inputs of the finite set $\Sigma$ in the Moore machine FMO and are finally completed because a final state is determined, the Moore machine FMO is called a well-formed Moore machine FMO. Similarly, in cases where the first and second state-transition operations are repeated finite times for a series of arbitrary inputs of the finite set $\Sigma$ in the Mealy machine FME and are finally completed because a final state is determined, the Mealy machine FME is called a well-formed Mealy machine FME.

Also, in cases where the Moore machine FMO and the nondeterministic Moore machine NMO output the same series of outputs for the same series of arbitrary inputs, it is defined that the Moore machine FMO is equivalent to the Moore machine NMO. Similarly, in cases where the Mealy machine FME and the nondeterministic Mealy machine NME output the same series of outputs for the same series of arbitrary inputs, it is defined that the Mealy machine FME is equivalent to the Mealy machine NME. In this case, the inputs and outputs in the machine FMO (or the machine FME) is convertible into those in the machine NMO (or the machine NME).

A basic constructing method of a well-formed Moore machine FMO which is equivalent to the machine NMO is described as follows. In this case, the machines NMO and FMO are indicated by $NMO=(Q,\Sigma,\Delta,\delta,\lambda,q_0)$ and $FMO=(S,\Sigma,\Delta,g,f,\mu,s_0)$. Also, the finite set S is defined as a subset of $\{<p,q>|q \subseteq Q, p \subseteq q, \text{ and } (p \neq \phi \text{ or } p=q)\}$. That is, because a size of a set of states in each of machines FMO depends on a machine NMO, a set of states $<p,q>$ is utilized as a maximum sized set of states to include the set of states in each of machines FMO in the set of states $<p,q>$. Therefore, the finite set S of a machine FMO is necessarily included in the set of states $<p,q>$. In this case, the set q has the states of the machine NMO as members, and the set p is a subset of the set q.

The reason that two state sets p and q are utilized to define the states of the machine FMO is described. For example, the transitions from an element of a state to a plurality of elements $\{t1,t2,t3,t4\}$ of the state set q are simultaneously performed. Therefore, in the machine DMO constructed according to the subset constructing method, the state set $q=\{t1,t2,t3,t4\}$ is treated as a state. In contrast, in the FMO machine, one or more elements $\{t1,t2\}$ of the state set p are selected from the state set q as a remarked state, one or more external inputs c which specify the non-empty set of states $\delta(p,c)$ defined in the NMO machine are selected to define state transitions from the state p for the external inputs c as success transitions, and other external inputs c' which do not specify any non-empty set of states $\delta(p,c)$ defined in the NMO machine are selected to define state transitions from the state p for the external inputs c' as failure transitions. Because the state set p is a subset of the state set q, a size of the FMO machine is smaller than that of the machine DMO.

A first constructing method of the Moore machine FMO representing the machines FMO and FME is described in detail.

(Step 1)

A finite set S is set to an empty set, and an initial state $s_0$ is set to $s_0=<\{q_0\},\{q_0\}>$. The state $q_0$ denotes an initial state of the machine NMO. Also, the initial set $s_0$ is added to the finite set S as an element having an unprocessed tag, and an output at the initial state $s_0$ is set to $\mu(s_0)=\{\lambda(q_0)\}$. Also, a state $<\phi,\phi>$ in which the set q is the empty set is added to the finite set S as an element having a processed tag, values $g(<\phi,\phi>,c)$ of the success function g for the state $<\phi,\phi>$ and a plurality of arbitrary inputs c are set to the same value $<\phi,\phi>$ ($g(<\phi,\phi>, c)=<\phi,\phi>$), and an output value at the state $<\phi,\phi>$ is set to $\mu(<\phi,\phi>)=\phi$. Therefore, an initial condition for constructing the Moore machine FMO is set.

(Step 2)

Thereafter, a substantial constructing process is started. That is, one of the states $<p,q>$ having an unprocessed tag is selected as a selected state $<p,q>$ from elements of the finite set S and is changed to a selected state $<p,q>$ having a processed tag. In cases where any state $<p,q>$ having an unprocessed tag is not found out, the procedure of the first constructing method is finished.

(Step 3)

On condition that each of inputs c ($c \in E$) satisfies an equation (1), a plurality of values $g(<p,q>,c)$ of the success function g for the selected state $<p,q>$ and the inputs c are defined according to an equation (2).

$$\underset{t \in p}{U}\ \delta(t,c) \neq \phi \qquad (1)$$

$$g(<p,q>,c) = <x,y> \qquad (2)$$

Here, a second component y of states $<x,y>$ is defined as a set according to an equation (3), and a first component x of the states $<x,y>$ is defined as an arbitrary subset of the set y and is not the empty set.

$$y \equiv \underset{t \in q}{U}\ \delta(t,c) \qquad (3)$$

Because the equation (1) is satisfied for the inputs c, state transitions from the states p for the inputs c are defined in the machine NMO. Therefore, state transitions from the states $<p,q>$ for the inputs c are defined in the machine FMO according to the equation (2). In other words, values $g(<p,q>,c)$ of the success function g are defined.

In cases where one or more states $<x,y>$ are not elements of the finite set S, the states $<x,y>$ are added to the finite set S as elements respectively having an unprocessed tag, and a plurality of output values $\mu$ at the states $<x,y>$ are set according to an equation (4).

$$\mu(<x,y>) = \underset{t \in y}{U}\ \{\lambda(t)\} \qquad (4)$$

Thereafter, in cases where one or more inputs c ($c \in \Sigma$) satisfying an equation (5) exist, a value of the failure function f at the selected state $<p,q>$ is defined according to an equation (6).

$$\underset{t \in p}{U}\ \delta(t,c) = \phi \qquad (5)$$

$$f(<p,q>) = <z, q-p> \qquad (6)$$

Here, a set z of states is arbitrarily selected from subsets of a difference set q–p on condition that a subset not equal to the empty set is selected as the set z in case of the difference set q–p$\neq \phi$. Because the equation (5) is satisfied for the inputs c, state transitions from a state p for the inputs c are not defined in the machine NMO. Therefore, state transitions from the selected state $<p,q>$ for the inputs c are not defined in the machine FMO and are treated as failure transitions. In other words, values $g(<p,q>,c)$ of the success function g are not defined. In cases where an input c satisfying the equation (5) is input to the machine FMO, the selected state $<p,q>$ is indicated by a symbol P, and a value $h=f(f(...f(P)...)))$ is calculated by repeating a process that a value f(P) of the failure function f is calculated and the value f(P) is rewritten to the symbol P newly defined until a value $g(h,c)$ of the success function g is defined. Thereafter, the input c takes the machine FMO from the selected state $<p,q>$ to a state $g(h,c)$.

Thereafter, in cases where one or more states $<z,q-p>$ are not an element of the finite set S, the states $<z,q-p>$ are added to the finite set S as elements respectively having an unprocessed tag, and output values of at the states $<z,q-p>$ are set according to an equation (7).

$$\mu(<z,q-p>) = \underset{t \in q-p}{U}\ \{\lambda(t)\} \qquad (7)$$

Thereafter, a procedure for constructing the Moore machine FMO returns to the step 2, and the procedure from the step 2 to the step 4 is repeated in the same manner to determine values of the success function g, values of the failure function f and values of the output function $\mu$ for other states $<p,q>$ selected in the step 2 until it is judged in the step 2 that all of the states of the finite set S respectively have a processed tag. Accordingly, the Moore machine FMO can be constructed.

The rightfulness of the first constructing method is confirmed by proving two propositions.

1. A first proposition

The well-formed machine FMO is constructed by the first constructing method.

2. A second proposition

The well-formed machine FMO constructed by the first constructing method is equivalent to a machine FMO.

The first proposition is will proved as follows.

A well-formed condition that an state-transition operation from an arbitrary state $<p,q>$ of the machine FMO constructed by the first constructing method is completed in finite steps is proved according to a mathematical induction relating to the number |q| of elements (or states) of the set q.

(1) The states of the machine FMO are limited to $<\phi,\phi>$ in case of |q|=0. In this case, the state-transition operation is finished in one step of the step 2 for an arbitrary input. Therefore, the first proposition is proved in case of |q|=0.

(2) Supposing that the first proposition is proved for all of states of the machine FMO in case of |q|$\leq$m ($0 \leq$m), a state-transition operation from an arbitrary state $<p,q>$ for a input c in case of |q|=m+1 is performed according to either a step A or a step B.

Step A: A value $g(<p,q>,c)$ of the success function g is defined in the step 3. Therefore, the state-transition operation is finished in one step of the step 3.

Step B: The state-transition operation results in another state-transition operation from a state $<z,q-p>$ equal to a value of the failure function f defined in the step 4.

In case of the step A, the well-formed condition is apparently proved.

In case of the step B, there are two cases p=q and p$\neq$q. In case of p=q, $f(<p,q>)=<\phi,\phi>$ is obtained. Therefore, the state-transition operation results in another state-transition operation in case of |q|=0, so that the well-formed condition is proved. In case of p≠q, because of p ⊂ q, |q−p|<|q|=m+1 is satisfied. That is, |q−p|≦m is satisfied. Therefore, a state-transition operation from a state f(<p,q>) is finished in finite steps because of the supposition of the mathematical induction, and the well-formed condition is proved.

As a result, the well-formed condition for the arbitrary state <p,q> in case of |q|=m+1 are proved.

Accordingly, the number of states is finite, and the first proposition is proved.

Next, the second proposition will be proved by utilizing a supplementary proposition.

3. A supplementary proposition

A set $q_x$ is set as a set of states of the machine NMO set in an initial condition $q_0$ to which a series of inputs x (or a character string x) are input, and a state $s_x$ is set as a state of the machine FMO set in an initial condition $s_0$ to which the series of inputs x are input. Also, the machine FMO is constructed from the machine NMO according to the first constructing method, and a function Q is defined according to an equation (8).

$$Q(<p,q>)=q \tag{8}$$

In this case, an equation (9) is satisfied for the series of inputs x.

$$q_x=Q(S_x) \tag{9}$$

The supplementary proposition can be easily proved according to a mathematical induction relating to a length |x| of the series of inputs x. Therefore, the second proposition is proved as follows by utilizing the supplementary proposition.

In detail, in cases where a series of arbitrary inputs x(or an arbitrary character string x) is input to the machines NMO and FMO which are respectively in an initial state, a series of outputs $\lambda_x$ obtained in the machine NMO is calculated in the steps 3 and 4 by utilizing the supplementary proposition and is formulated according to an equation (10), and a series of outputs $\mu_x$ obtained in the machine FMO is calculated in the steps 3 and 4 by utilizing the supplementary proposition and is formulated according to an equation (11).

$$\lambda_x = \underset{t\in q_x}{U} \{\lambda(t)\} \tag{10}$$

$$\mu_x = \mu(S_x) \tag{11}$$

$$= \underset{t\in Q(S_x)}{U} \{\lambda(t)\}$$

$$= \underset{t\in S_x}{U} \{\lambda(t)\}$$

Therefore, the series of outputs $\lambda_x$ obtained in the machine NMO is the same as the series of outputs $\mu_x$ obtained in the machine FMO, so that the second proposition is proved.

Next, the specialization of the constructing methof of the finite-state machine with failure transitions FFM for a pattern matching is described.

In this pattern matching performed in the machine FMO, strings of characters in an input document are scanned character by character from its head portion, each if the strings of characters scanned is simultaneously collated with N strings of referential characters Rj (j=1, - - -,N) expressed according to the regular expression, and a string of outputs Dj (j=1, - - -,N) is output in cases where a string of characters in the input document agrees with one of the N strings of referential characters Rj. To construct a machine FMO from which the string of outputs Dj (j=1, - - -,N) is output in cases where the pattern matching is successfully finished, a machine NMO satisfying an equation (12) is initially constructed according to a well-known constructing method of the machine NMO such as a Robinson constructing method.

$$(\Sigma^*/\epsilon)((R1/D1)|(R2/D2)|\text{- - -}(R_N/D_N)) \tag{12}$$

Here, the symbol $\Sigma^*$ denotes a finite set of arbitrary strings of characters in the input document, and the symbol $\epsilon$ denotes a string of characters having a zero length. Also, the outputs Dj are elements of an output character set $\Delta$ of the machine FMO.

Thereafter, the first constructing method is applied for the machine NMO constructed to construct the machine FMO.

Because a loop in which a state of the machine NMO is returned from a starting state to the same starting state after an arbitrary time passes is formed in the machine NMO, a set of states q in the machine NMO is divided into a plurality of subsets $p_j$ (j=1, - - -,N) by dividing the set q each time a state of the machine NMO leaves a starting state $s_0$, and a constructing method of a finite-state machine with failure transitions FFM utilized for a pattern matching is obtained by modifying the first constructing method.

A second constructing method of the finite-state machine with failure transitions FFM specialized for a pattern matching is described in detail. In this case, the machine NMO is indicated by NMO=$(Q,\Sigma,\Delta,\delta,\lambda,q_0)$, and the machine FMO representing the machine FFM is indicated by FMO=$(S,\Sigma,\Delta,g,f,\mu,s_0)$. Also, on condition that a plurality of subsets $p_j$ (j=1, - - -,N) of the set q are not respectively the empty set, a subset of a set which is formed of a string <$p_1$, - - - $p_N$> of the subsets $p_j$ (j=1, - - -,N) is set to a set S.

(A step 1)

A state <{$q_0$}> is selected from the set q as an initial state $s_0$ of the machine FMO to be constructed. The state $q_0$ denote an initial state in the machine NMO. Thereafter, the state <{$q_0$}> is entered to the set S and a cue. Also, a value of an output $\mu(s_0)$ at the initial state $s_0$ is set to $\{\lambda(q_0)\}$.

(A step 2)

In cases where the cue is empty, a procedure of the second constructing method is finished. In contrast, in cases where the cue is not empty, an element P=<$p_1$, - - - ,$p_N$> placed in a head portion of the cue is taken out from the cue as a current state.

(A step 3)

Values of a success function g are defined for all of characters c (c $\epsilon$ $\Sigma$) satisfying an equation (13). Each of the characters c corresponds to an input.

$$\underset{t\in p_N}{U} \delta(t,c) \neq \phi \tag{13}$$

In detail, N+1 sets $x_1,x_2$, - - - ,$x_N,x_{N+1}$ are defined according to equations (14), (15).

$$x_1 = p_1 \tag{14}$$

$$x_{i+1} = \left( \underset{t\in p_i}{U} \delta(t,c) \right) - \left( \underset{k\leq i}{U} x_1 \right) \tag{15}$$

(Here, $1 \leq i \leq N$)

Thereafter, no-empty sets are selected from the sets $x_1 x$, $x_2$, - - - $x_N,x_{N+1}$, and sets $y_1$, - - - , $y_m$ are formed by arranging the no-empty sets in ascending order of subscripts 1, 2, - - - ,N+1. Thereafter, an element $Y \equiv \langle y_1, \text{- - -}, y_m \rangle$ of a string $\langle y_1, \text{- - -}, y_m \rangle$ is set to a value of a success function g(P,c) to define the element Y as a next state of the machine FMO. In cases where the state Y is not included in the set S, the state Y is added to the set S as an element of the set S, and the state Y is entered in the cue. Thereafter, an output at the state Y is obtained according to an equation (16).

$$\mu(Y) = U\{\lambda(t)\} \atop {t \in \bigcup_{j=1}^{m} yj}} \qquad (16)$$

In cases where characters c (c $\in \Sigma$) satisfying an equation (17) exist, a value of a failure function f is defined according to an equation (18).

$$\bigcup_{t \in p_N} \delta(t,c) = \phi \qquad (17)$$

$$f(P) = \langle p_1, p_2, \ldots, p_{N-1} \rangle \qquad (18)$$

The procedure returns to the step 2, and the steps 2 to 4 are repeated until it is judged in the step that the cue is empty.

Therefore, the Moore machine with failure transitions FMO specialized for a pattern matching is constructed according to the second constructing method. Also, the finite-state machine with failure transitions FFM specialized for a pattern matching is constructed in the same manner.

In the second constructing method, the next state Y is selected from a string of the elements y1, - - - ,ym, and values of m−1 elements selected from y1, - - - ,ym other than a $y_j$ equal to $x_{N+1}$ are determined by the subsets $p_1$, - - - ,$p_{N-1}$. Therefore, in cases where a current state $R \equiv \langle p_1, \text{- - -}, p_{n-1} \rangle$ is an element of the set S and in cases where a next state for the current state R and the character c is represented by W, the state P can be written by $\langle R,P \rangle$, and the state Y can be written by $\langle W,y \rangle$. By utilizing this relationship among R,P,Y and W, a third constructing method of the finite-state machine with failure transitions FFM specialized for a pattern matching is obtained. The third constructing method is equivalent to the second constructing method, and the machine FFM can be efficiently constructed by the third constructing method.

The third constructing method is described in detail. In this case, the machine NMO is indicated by NMO=(Q,$\Sigma$,$\Delta$,$\delta$,$\lambda$,$q_0$), and the machine FMO representing the machine FFM is indicated by FMO=(S,$\Sigma$,$\Delta$,g,f,$\mu$,$s_0$). Also, by utilizing a no-empty subset p of the set Q and an element r of the set S, a subset of a set formed of all ordered pairs P and r represented by $R \equiv \langle p,r \rangle$ is set to the set S. Also, a function for obtaining a first component p of $R \equiv \langle p,r \rangle$ is indicated by p(R), and a function for obtaining a second component r of $R \equiv \langle p,r \rangle$ is indicated by r(R). That is, p(R)=p and r(R)=r are defined.

(A step 1)

A state $\langle \{q_0\}, s_0 \rangle$ is selected as an initial state $s_0$ of the machine FMO to be constructed, and the state $\langle \{q_0\}, s_0 \rangle$ is entered to the set S and a cue. Also, a value of an output $\mu(s_0)$ at the initial state $s_0$ is set to $\{\lambda(q_0)\}$.

(A step 2)

In cases where the cue is empty, a procedure of the third constructing method is finished. In contrast, in cases where the cue is not empty, an element $R \equiv \langle p,r \rangle$ placed in a head portion of the cue is taken out from the cue as a current state.

(A step 3)

A success function g is defined for all of characters c (c $\in \Sigma$) satisfying an equation (19). Each of the characters c corresponds to an input.

$$\bigcup_{t \in p(R)} \delta(t,c) \neq \phi \qquad (19)$$

Also, a symbol x is defined according to equations (20), (21).

$$x = R \quad (\text{in case of } R = s_0) \qquad (20)$$

$$x = g(r(r(\ldots r(R)\ldots)),c) \quad (\text{in case of } R \neq s_0) \qquad (21)$$

Here, the calculation of the function r(.) in the equation (21) is repeated one or more times until the success function g(v,c) (v is a value of the function r(.)) is defined for the first time. Thereafter, a symbol y is defined according to an equation (22).

$$y = \left( \bigcup_{t \in p(R)} \delta(t,c) \right) - (p(x) \cup p(r(x) \cup \ldots \cup p(r(r(\ldots r(x)\ldots)))))) \qquad (22)$$

In cases where y is not the empty set, a state $Y \equiv \langle y,x \rangle$ is set to a value g(R,c) of the success function g. In cases where y is the empty set, a state $Y \equiv x$ is set to a value g(R,c) of the success function g. Also, in cases where the state Y is not included in the set S, the state Y is added to the set S as an element of the set S, and the state Y is entered to the cue. An output at the state Y is set according to an equation (23).

$$\mu(Y) = U \{\lambda(t)\} \atop {t \in \bigcup_{z \in p(R)} \delta(z,c)}} \qquad (23)$$

In cases where characters c (c $\in \Sigma$) satisfying an equation (24A) exist (in other words, characters c (c $\in \Sigma$) not satisfying the equation (19) exist), a failure function f is defined according to an equation (24B).

$$\bigcup_{t \in p(R)} \delta(t,c) = \phi \qquad (24A)$$

$$f(Y) = r(R) \qquad (24B)$$

The procedure returns to the step 2, and the steps 2 to 4 are repeated.

Therefore, the Moore machine with failure transitions FMO specialized for a pattern matching is constructed according to the third constructing method. Also, the finite-state machine with failure transitions FFM specialized for a pattern matching is constructed in the same manner.

Next, a first transforming method of the finite-state machine with failure transitions FFM constructed according to the first constructing method is described.

The machine FMO constructed according to the first constructing method represents the machine FFM constructed according to the first constructing method and is indicated by FMO=(S,$\Sigma$,$\Delta$,g,f,$\mu$,$s_0$). The set S is defined as a subset of $\{\langle p,q \rangle | q \subseteq Q, p \subseteq q, \text{ and } (p \neq \phi \text{ or } p = q)\}$. The object of the first transforming method is that a next state transferred from a particular state $P \equiv \langle p,q \rangle$ of the machine FMO by an external input is necessarily defined by the success function $g(\langle p,q \rangle,c)$ in the machine FMO constructed according to the first transforming method.

(A step 1)

Figure 12A:
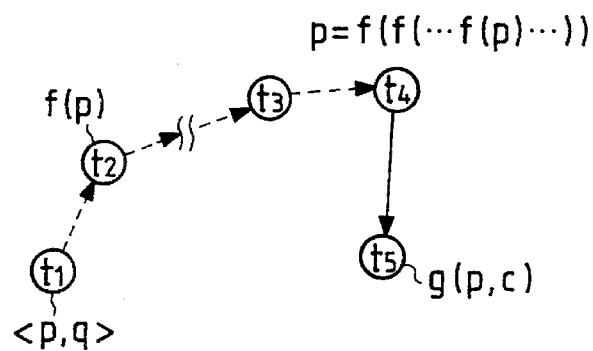
FIGS. 12A and 12B are respectively a state-transition view showing state-transitions in the Moore machine with failure transitions FMO to explain a first transforming method.

In cases where a value $g(\langle p,q \rangle,c)$ of the success function g of the machine FMO for an originally designated state $\langle p,q \rangle$ and an external input c is defined, a procedure of the first transforming method for defining a next state $g(\langle p,q \rangle,c)$ is finished. In contrast, as shown in FIG. 12A, in cases where the value $g(\langle p,q \rangle,c)$ of the success function g of the machine FMO is not defined, the originally designated state $\langle p,q \rangle$ is expressed by a symbol P denoting a designated state, and the procedure proceeds to a step 2 (P←<p,q>).

(A step 2)

In place of the designated state P, a state f(P) is selected as a designated state P newly defined (P←f(P)).

(A step 3)

In cases where a value g(P,c) of the success function g for the designated state P newly defined in the step 2 and the external input c is not defined, the procedure returns to the step 2 to obtain a designated state P=f(f(...f(p)...)) newly defined. In contrast, in cases where the value g(P,c) of the success function g is defined, the procedure proceeds to a step 4.

(A step 4)

Figure 12B:
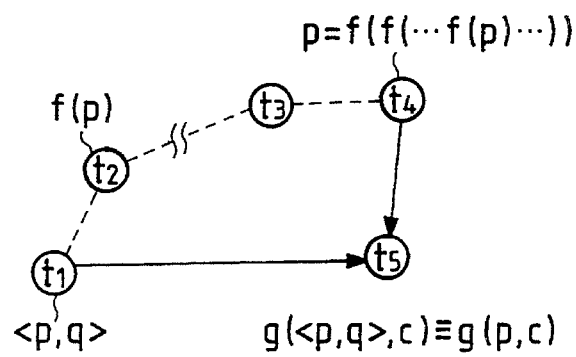

As shown in FIG. 12B, the value g(<p,q>,c) of the success function g for the originally designated state <p,q> and the external input c is additionally defined as g(P,c). This is, g(<p,q>,c)≡g(P,c) is additionally defined.

(A step 5)

In cases where values g(<p,q>,x) of the success function g for all of arbitrary external inputs x and the originally designated state <p,q> is defined in the step 4, the definition of the failure function f(<p,q>) is cancelled.

(A step 6)

The procedure of the first transforming method for defining the originally designated state g(<p,q>,c) is finished.

Therefore, the Moore machine with failure transitions FMO constructed according to the first constructing method is transformed according to the first transforming method to perform the transition from a designated state to a next state indicated by a value of the success function g for an external input in one step operation.

The transforming operation according to the first transforming method is performed locally in the the machine FMO, and the transformation is not performed all over the machine FMO. Therefore, the transformation of the machine FMO can be performed at a high speed. In addition, even though the machine FMO is under operation, the transformation of the machine FMO can be performed at any time on condition that the transition to be newly defined is not just performed. Therefore, a portion of the machine FMO to be transformed can be dynamically transformed during the operation of the machine FMO, and the machine FMO fitted to a series of external inputs (or a type of character string) can be appropriately constructed.

Also, the finite-state machine with failure transitions FFM constructed according to the first constructing method is transformed in the same manner.

Also, the Moore machine with failure transitions FMO specialized for a pattern matching which is constructed according to the third constructing method can be transformed according to the first transforming method to perform the transition from a designated state to a next state indicated by a value of the success function g for a designated character in one step operation.

Next, a first embodiment of an automatic product inspection system in which the first constructing method of the Moore machine with failure transitions FMO is applied is described.

Initially, the first constructing method applied to construct an automatic product inspection system is described with reference to FIG. 13A.

Figure 13A:
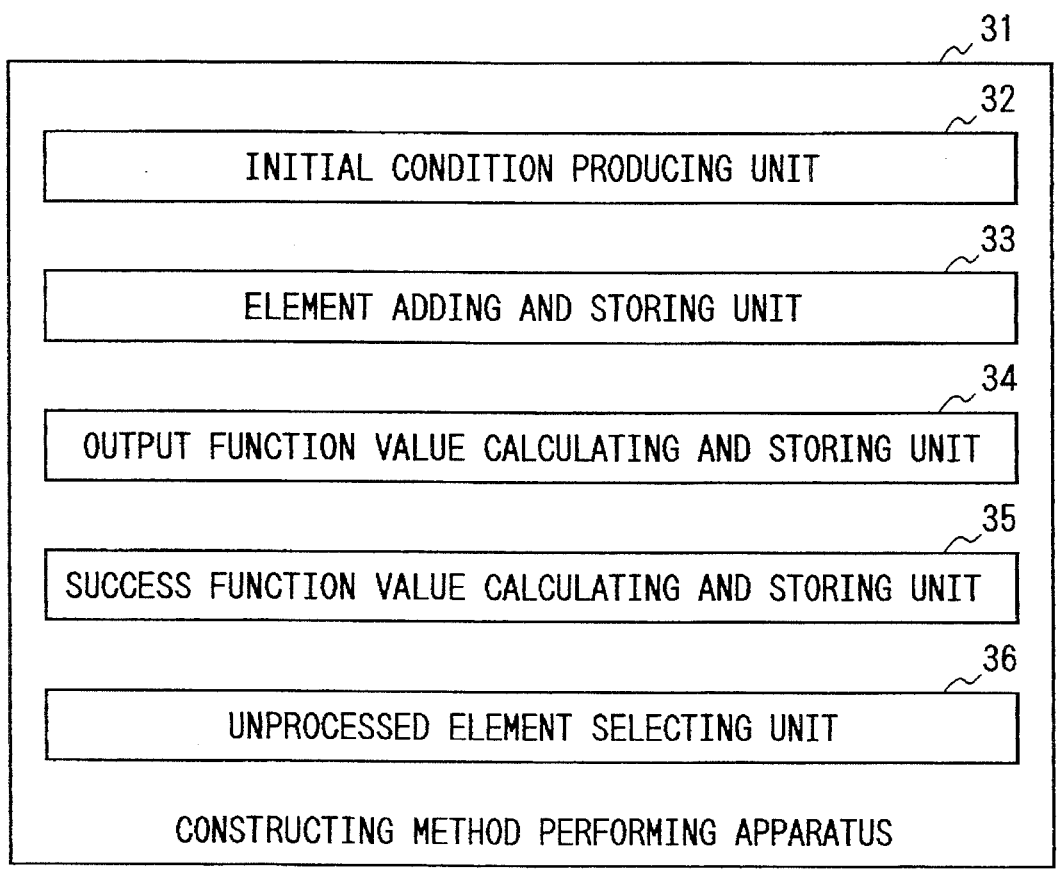
FIG. 13A is a block diagram of a constructing method performing apparatus for constructing a finite-state machine with failure transitions FFM represented by the Moore machine with failure transitions FMO according to a first constructing method.
Figure 13B:
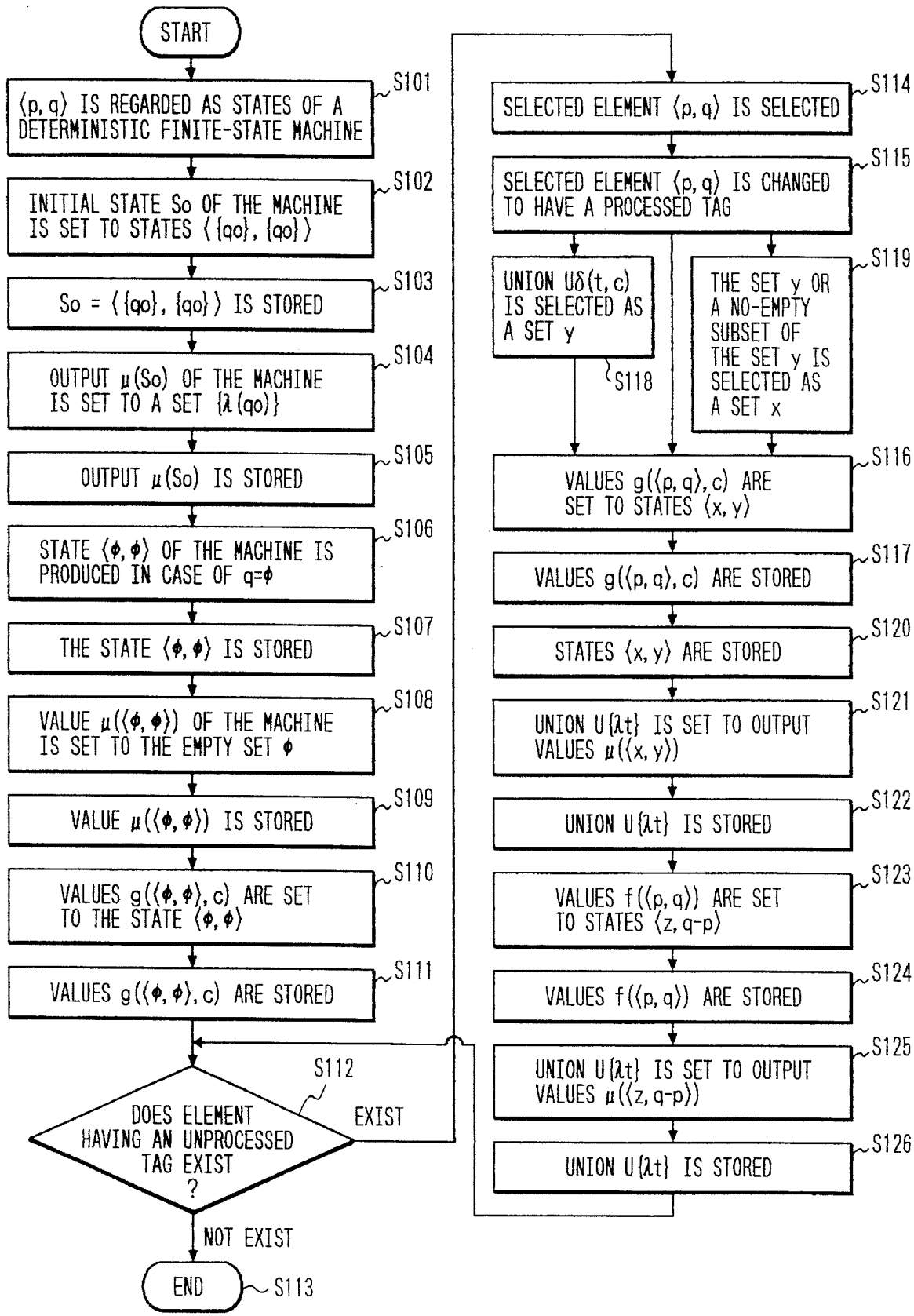
FIG. 13B is a flow chart of the first constructing method performed in the constructing method performing apparatus shown in FIG. 13A.

FIG. 13A is a block diagram of a constructing method performing apparatus for constructing a finite-state machine with failure transitions FFM represented by the Moore machine with failure transitions FMO according to the first constructing method. FIG. 13B is a flow chart of the first constructing method performed in the constructing method performing apparatus shown in FIG. 13A;

As shown in FIG. 13A, in cases where a finite-state machine with failure transitions FFM is constructed in a constructing method performing apparatus 31 according to the first constructing method, by utilizing both a set q of states included in a nondeterministic finite-state machine and a subset p of the set q, a combination <p,q> of the sets p and q is regarded as states of a deterministic finite-state machine (S101 shown in FIG. 13B). Thereafter, an initial construction of the finite-state machine FFM is performed in a first step. In detail, by utilizing an initial state $q_0$ of the nondeterministic finite-state machine, an initial state $s_0$ of the deterministic finite-state machine is set to a state <{$q_0$}, {$q_0$}> in an initial condition producing unit 32 (S102 shown in FIG. 13B), and the initial state $s_0$=<{$q_0$},{$q_0$}> is stored in an element adding and storing unit 33 to add the initial state $s_0$ to a state set of the deterministic finite-state machine as an element having an unprocessed tag (S103 shown in FIG. 13B). Thereafter, in the initial condition producing unit 32, an output $\mu(s_0)$ of the deterministic finite-state machine at the initial state $s_0$ is set to be a set {$\lambda(q_0)$} having an output of the nondeterministic finite-state machine at the initial state $q_0$ (S104 shown in FIG. 13B), and the output $\mu(s_0)$ is stored in an output function value calculating and storing unit 34 (S105 shown in FIG. 13B). Also, a state <φ,φ> of the deterministic finite-state machine obtained in case of q=φ is produced in the initial condition producing unit 32 (S106 shown in FIG. 13B) and is stored in the element adding and storing unit 33 to add the state <φ,φ> to the state set of the deterministic finite-state machine as an element having a processed tag (S107 shown in FIG. 13B). Thereafter, a value $\mu(<φ,φ>)$ of an output function $\mu$ of the deterministic finite-state machine at the state <φ,φ> is set to be the empty set φ (S108 shown in FIG. 13B) and is stored in the output function value calculating and storing unit 34 (S109 shown in FIG. 13B). In addition, values g(<φ,φ>,c) of a success function g for arbitrary external inputs c are set in the initial condition producing unit 32 to be the state <φ,φ> (S110 shown in FIG. 13B) and are stored in a success function value calculating and storing unit 35 (S111 shown in FIG. 13B).

In a second step of the method for constructing the finite-state machine FFM, it is checked whether or not an element having an unprocessed tag exists in the state set of the deterministic finite-state machine placed in the element adding and storing unit 33 (S112 shown in FIG. 13B). In cases where an element having an unprocessed tag does not exist in the state set of the deterministic finite-state machine, no existence of an element having an unprocessed tag is detected in an unprocessed element selecting unit 36, and the construction of the finite-state machine FFM is finished (S113 shown in FIG. 13B). In contrast, in cases where one or more elements <p,q> respectively having an unprocessed tag exist in the set of states of the deterministic finite-state machine, one of the elements <p,q> respectively having an unprocessed tag is selected from the set of states of the deterministic finite-state machine as a selected element <p,q> according to a certain calculation by the action of the unprocessed element selecting unit 36 (S114 shown in FIG. 13B), and the selected element <p,q> having an unprocessed tag stored in the element adding and storing unit 33 are changed to a selected element <p,q> having a processed tag (S115 shown in FIG. 13B).

In a third step of the method for constructing the finite-state machine FFM, one or more values g(<p,q>,c) of the success function g are set to one or more states <x,y> of the deterministic finite-state machine for each of external inputs c which specifies a next state δ(t,c) defined in the nondeterministic finite-state machine according to one of element t of a state set p of the nondeterministic finite-state machine corresponding to a first component of the selected state <p,q> (S116 shown in FIG. 13B), and the values g(<p,q>, C)=<x,y> are stored in the success function value calculating and storing unit 35 (S117 shown in FIG. 13B). In this case, a union Uδ(t,c) of the next states δ(t,c) of the nondeterministic finite-state machine for the external inputs c and the elements t of the set p is selected as values of a set y (S118 shown in FIG. 13B), and the values of the set y or a no-empty subset of the set y are selected as a value of a set x (S119 shown in FIG. 13B). Thereafter, in cases where one or more states <x,y> are not stored in the element adding and storing unit 33, the states <x,y> are stored in the element adding and storing unit 33 to add the states <x,y> to the state set of the deterministic finite-state machine as elements respectively having an unprocessed tag (S120 shown in FIG. 13B). Also, in cases where output values w=μ(<x,y>) of the output function μ of the deterministic finite-state machine at the states <x,y> are not defined, a union U{λ(t)} of outputs λ(t) of the nondeterministic finite-state machine for elements t of the set y is calculated as the output values w (S121 shown in FIG. 13B) and is stored in the output function value calculating and storing unit 34 (S122 shown in FIG. 13B).

In a fourth step of the method for constructing the finite-state machine FFM, in cases where each of external inputs d does not specify any of next states g(<p,q>,d) defined in the nondeterministic finite-state machine for any of elements of the state set p of the selected element <p,q>, values f(<p,q>) of a failure function f not depending on any of the external inputs d are calculated to be states <z,q−p> obtained by combining a difference set q−p defined by removing elements of the subset p from elements of the set q and an arbitrary subset z of the difference set q−p (S123 shown in FIG. 13B), and the values f(<p,q>) are stored in a calculated failure function value storing unit 37 (S124 shown in FIG. 13B). Also, in cases where output values w=μ(<z,q−p>) of the output function μ of the deterministic finite-state machine at the states <z,q−p> are not defined, a union U{λ(t)} of outputs λ(t) of the nondeterministic finite-state machine for elements t of the difference set q−p is calculated as the values w (S125 shown in FIG. 13B) and is stored in the output function value calculating and storing unit 34 (S126 shown in FIG. 13B).

In a fifth step of the method for constructing the finite-state machine FFM, the procedure for constructing the finite-state machine FFM returns to the second step, and the procedure from the second step to the fourth step is repeated until no existence of an element having an unprocessed tag is detected in the unprocessed element selecting unit 36 in the second step (S112 shown in FIG. 13B).

Accordingly, a finite-state machine with failure transitions FFM in which a table of transitions has a small size than that in a conventional deterministic finite-state machine can be constructed at a high speed.

Figure 13C:
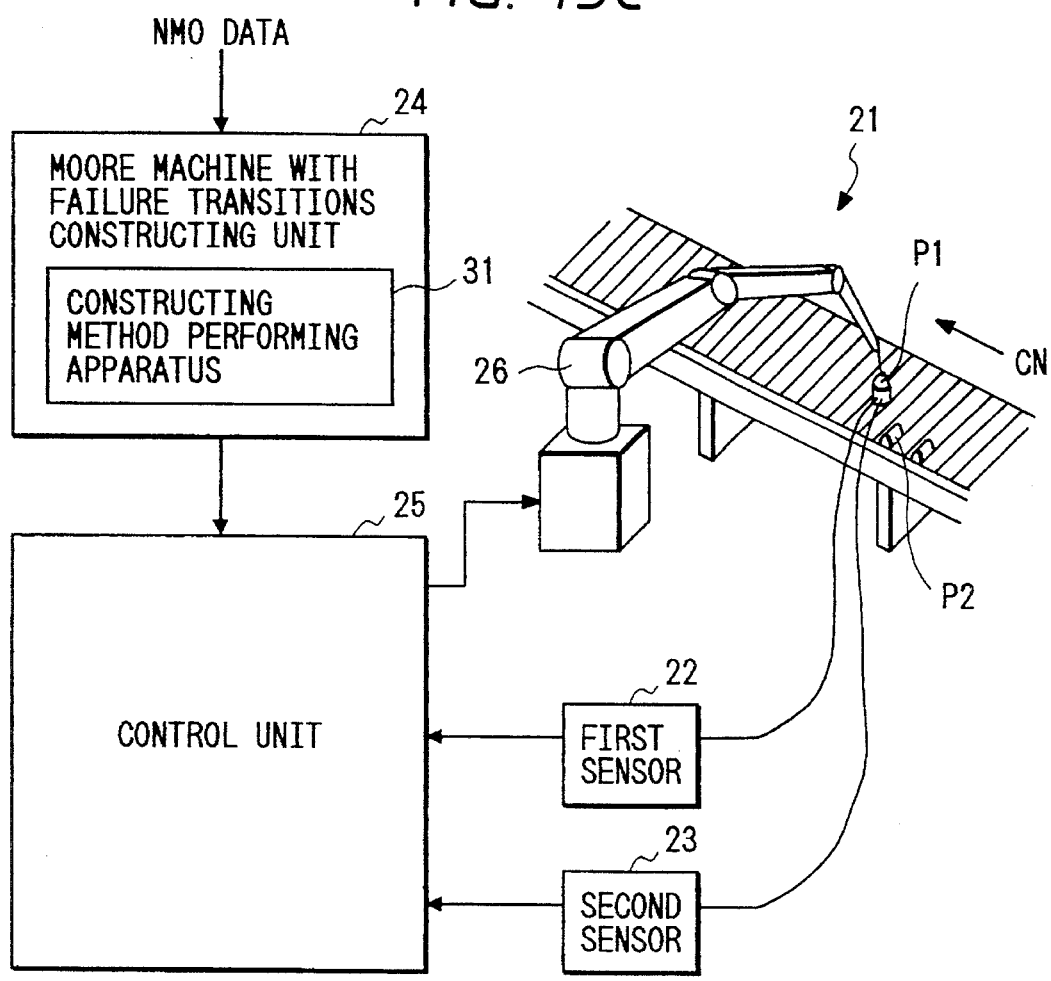
FIG. 13C is a constitutional block diagram of an automatic product inspection system according to the first embodiment, the first constructing method shown in FIG. 13B being utilized to construct the Moore machine with failure transitions FMO.

FIG. 13C is a constitutional block diagram of an automatic product inspection system in which the first constructing method is utilized to construct the Moore machine with failure transitions FMO according to the first embodiment.

As shown in FIG. 13C, an automatic product inspection system 21 comprises a first sensor 22 for detecting one of first features of a product conveyed on a conveyer CN every prescribed time and outputting an inspecting value "0" or "1" every prescribed time, a second sensor 23 for detecting one of second features of the product every prescribed time and outputting an inspecting value "0" or "1" every prescribed time, a Moore machine with failure transitions constructing unit 24 having the constructing method performing apparatus 31 for producing pieces of FMO data of a Moore machine with failure transitions from pieces of NMO data of a nondeterministic Moore machine input from an external equipment (not shown) according to the first constructing method performed in the constructing method performing apparatus 31, a control unit 25 composed of an electronic circuit for storing the FMO data produced in the constructing unit 24 in a FMO memory having the fixed storage capacity, producing pieces of control data corresponding to a final state of the Moore machine with failure transitions FMO which is determined according to the FMO data and the inspecting values time-sequentially transferred from the first and second sensors 22, 23 as a string of inputs, and a marking robot 26 for marking a non-defective mark on the product in cases where pieces of control data indicating that the product is a non-defective product are produced in the control unit 25.

In the above configuration of the automatic product inspection system 21 shown in FIG. 13C, the operation of the system 21 in which a constructing method of a Moore machine with failure transitions constructed in the Moore machine with failure transitions constructing unit 24 in a form of pieces of FMO data is applied is described.

Figure 14:
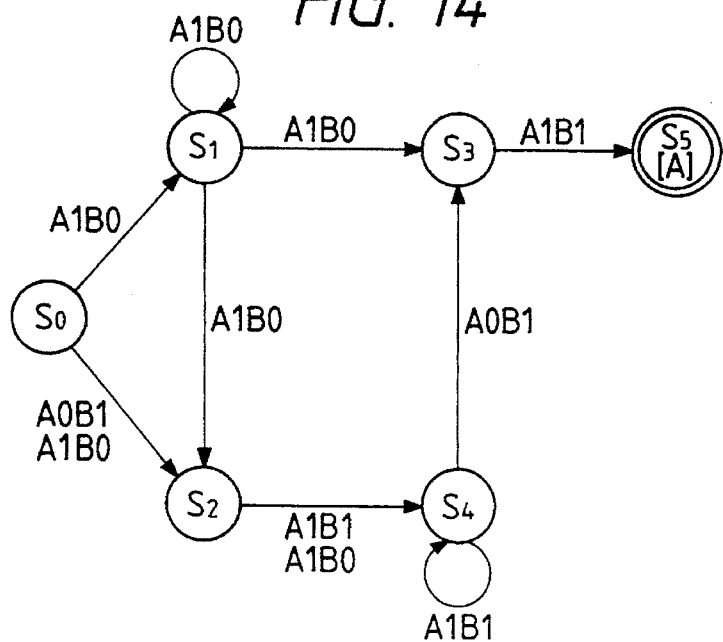
FIG. 14 is a state-transition view of a nondeterministic Moore machine NMO utilized to construct the machine FMO according to the first constructing method shown in FIG. 13B.

Supposing that pieces of NMO data which designate a nondeterministic finite-state machine NMO shown in FIG. 14 are directly input to the control unit 25, the control unit 25 is operated according to the nondeterministic finite-state machine. In FIG. 14, a state S0 denotes an initial state for inspecting each of products on the conveyer CN, and states S1 to S5 follow the initial state S0. Also, a symbol A1 denotes an inspecting value "1" transferred from the first sensor 22, a symbol A0 denotes an inspecting value "0" transferred from the first sensor 22, a symbol B1 denotes an inspecting value "1" transferred from the second sensor 23, and a symbol B0 denotes an inspecting value "0" transferred from the second sensor 23. A pair of inspecting values from the first and second sensors 22, 23 are transferred to the control unit 25 at one time each time a prescribed interval passes, so that an external input transferred to the control unit 25 is formed of a combination of the inspecting values such as A0B0, A0B1, A1B0 or A1B1. In cases where an external input taking the machine NMO from a current state to a next state defined by the empty set is input to the control unit 25 (or any next state is not defined) when a product P1 is inspected, the product P1 is judged by the control unit 25 to be defective, and a product P2 following the product P1 is inspected. For example, an external input A0B0 is input to the control unit 25 when the machine NMO is placed at the initial state S0, the product P1 is judged to be defective because a next state is not defined for the external input A0B0. In contrast, in cases where a string of external inputs takes the machine NMO from the initial state S0 to a final state S5, a movement A is instructed from the control unit 25 to the marking robot 26. Therefore, a non-defective mark is marked on the product P1 by the marking robot 26. For example, a string of external inputs A0B1, A1B1, A0B1 and A1B1 takes the machine NMO from the initial state S0 to a final state S5.

However, in cases where an external input A1B0 is, for example, input to the control unit 25 when the machine NMO is placed at the initial state S0, the machine NMO can be placed at a plurality of next states S1 and S2. Therefore, the control unit 25 composed of an electronic circuit cannot be correctly operated to judge whether or not a product is defective. To avoid this drawback, the Moore machine with failure transitions constructing unit 24 is utilized in this embodiment.

FIG. 15 shows a procedure for constructing a Moore machine with failure transitions FMO from the NMO machine shown in FIG. 14 by applying the first constructing method.

As shown in FIG. 15, states <p,q> of the machine FMO, values of the success function g defined according to the equation (2) for each of the external inputs, values of the failure function f defined according to the equation (6) and values of the output function μ according to the equations (4) and (7) are listed in a tabular form. For example, the machine FMO is constructed to perform the transition from an initial state t0=<{S0},{S0}> to a next state t2=<{S2},{S2}> for a first external input A0B1, and the machine FMO is constructed to perform the transition from the current state t2=<{S2},S2)> to a next state t5=<{S4},{S4}> for either a second external input A1B0 or a second external input A1B1 following the first external input A0B1. Also, the machine FMO is constructed to perform the transition from the initial state t0=<(S0),(S0)> to a next state t3=<ϕ,ϕ> for either a first external input A1B1 or a first external input A0B0 because a value of the success function g for the initial state t0=<{S0},{S0}> and the external input A1B1 or A0B0 is not defined and a value of the failure function f is <ϕ,ϕ>. In addition, the machine FMO is constructed to instruct a movement [A] to the marking robot 26 in cases where the machine FHO is placed at a state t10 or t11 because values of the output function μ of the machine FMO at the states t10 and t11 are defined to [A].

Figure 16:
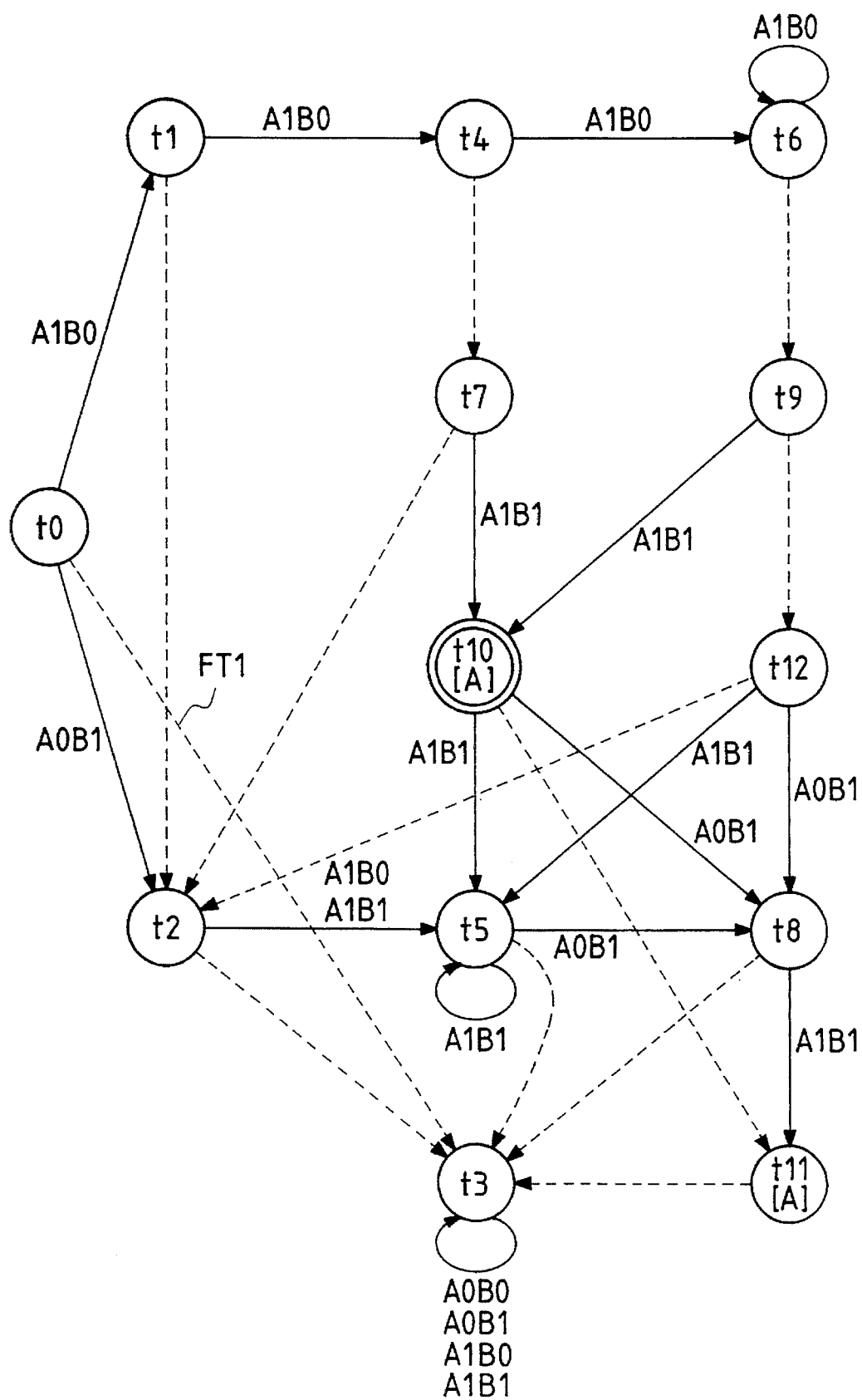
FIG. 16 is a state-transition view of the machine FMO constructed according to the first constructing method of which the procedure is shown in FIG. 15.

FIG. 16 is a state-transition view of the machine FMO constructed according to the first constructing method of which the procedure is shown in FIG. 15.

Figures 3, 4:
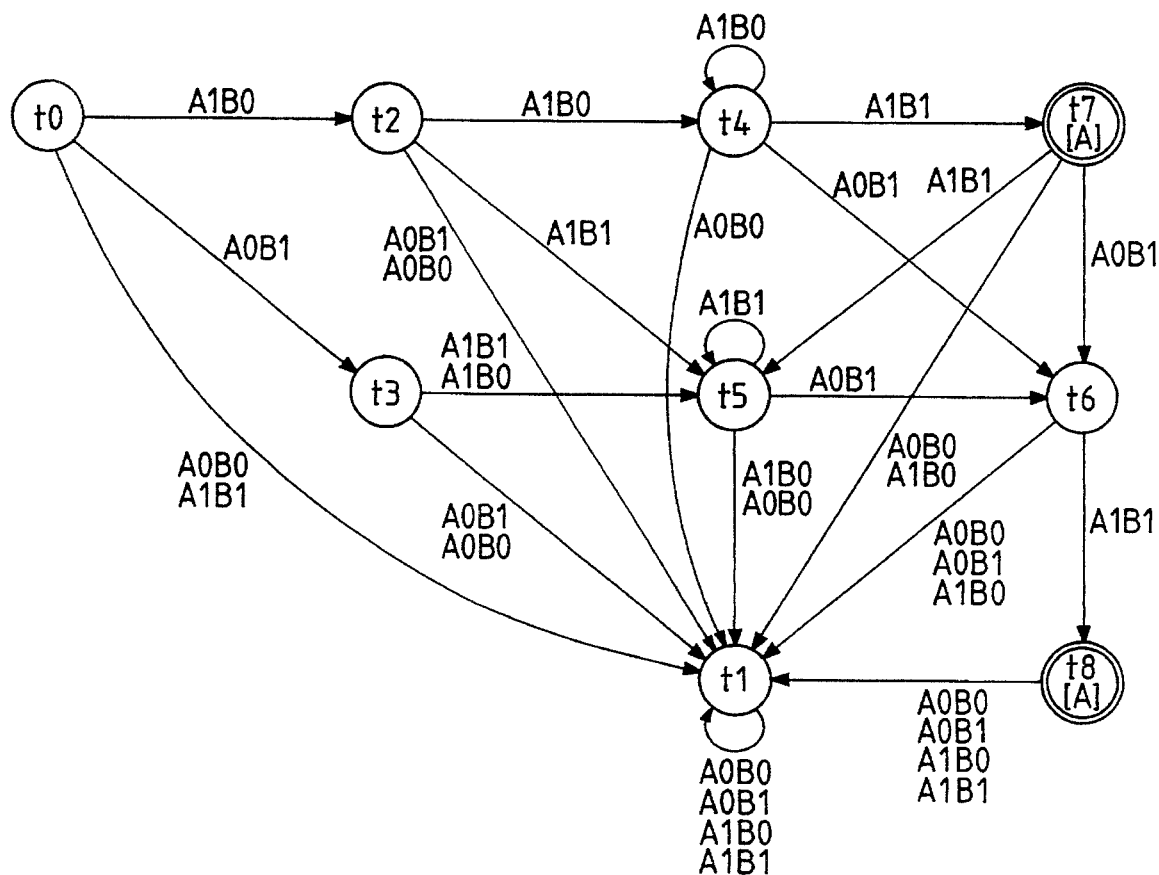
FIG. 3 is a state table showing a process for constructing a deterministic Moore machine from the nondeterministic Moore machine shown in FIG. 2 according to the subset constructing method.
FIG. 4 is a state-transition view of the deterministic Moore machine constructed according to the process shown in FIG. 3.
Figure 5:
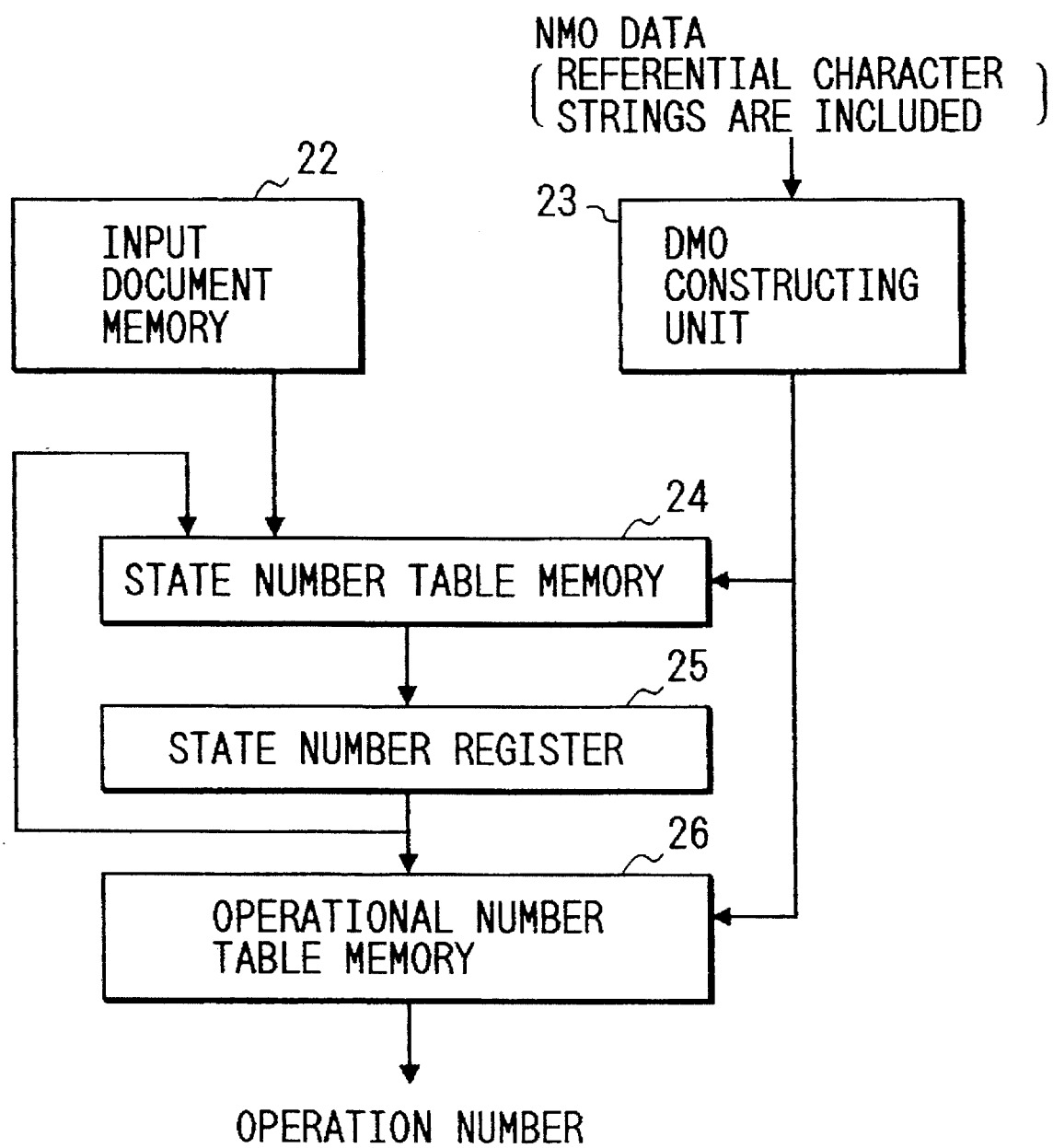
FIG. 5 is a block diagram of a conventional pattern-matching system which is a portion of a conventional document researching system.

In FIG. 16, each of success transitions indicated by solid lines denotes a transition in which a next state is defined by a value of the success function g of the machine FMO, and each of failure transitions indicated by broken lines denotes a transition in which a failed next state is defined by a value of the failure function f of the machine FMO. By comparing the state-transition view of the machine FMO shown in FIG. 16 with the state-transition view of the machine DMO shown in FIG. 4, though the machine DMO and the machine FMO are constructed from the same machine NMO, four transitions for four types of external inputs are necessarily defined at each of states of the machine DMO because the state-transition function δ' of the machine DMO is the total function. In contrast, In the machine FMO, because the success function g is the partial function, a definition region of the success function g is almost the same as that of the state-transition function δ of the machine NMO. Therefore, the number of success transitions indicated by solid lines in the machine FMO is considerably smaller than the number of transitions in the machine DMO. Particularly, in cases where the number of sensors is, for example, not two but ten, the number of types of external inputs is considerably increased, so that the difference between the number of transitions in the machine DMO and the number of success transitions in the machine FMO is considerably increased.

Accordingly, in cases where there are a large number of types of external inputs, the machine FMO can be made of a small sized programmable integrated circuit as compared with the machine DMO. For example, in cases where the machine FMO is made of a sum-of-product type of programmable integrated circuit called a programmable array logic in which a prescribed number of programmable portions (called product-term lines) of a combinational circuit for selecting m arbitrary signal lines from 2n signal lines formed of n input lines having n signal levels D1,D2, - - - ,Dn and n inverted input lines having n inverted signal levels $\overline{D1},\overline{D2}$, - - - ,$\overline{Dn}$ and calculating a logical multiply of the m arbitrary signal lines are arranged and an output of the combinational circuit is determined by calculating a logical sum of outputs of the prescribed number of product-term lines, the number of product-term lines can be small as compared with that of the programmable array logic utilized for the machine DMO.

Next, a second embodiment of an automatic product inspection system in which the Moore machine with failure transitions FMO constructed according to the first constructing method is transformed according to the first transforming method is described.

Initially, the first transforming method applied to transform the Moore machine with failure transitions FMO constructed according to the first constructing method is described with reference to FIGS. 17, 18 and 19.

Figure 17A:
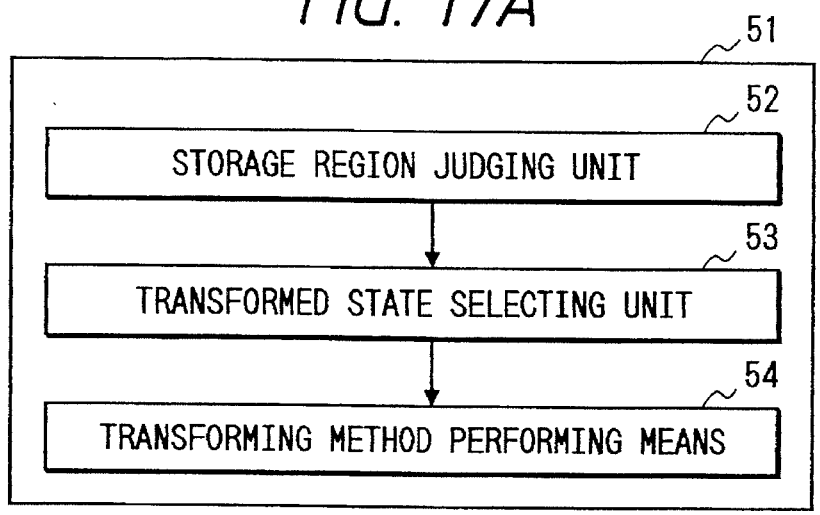
FIG. 17A is a block diagram of a transforming method performing apparatus in which a finite-state machine with failure transitions FFM represented by the Moore machine with failure transitions constructed according to the first constructing method shown in FIG. 13B is transformed according to a first transforming method.
Figure 17B:
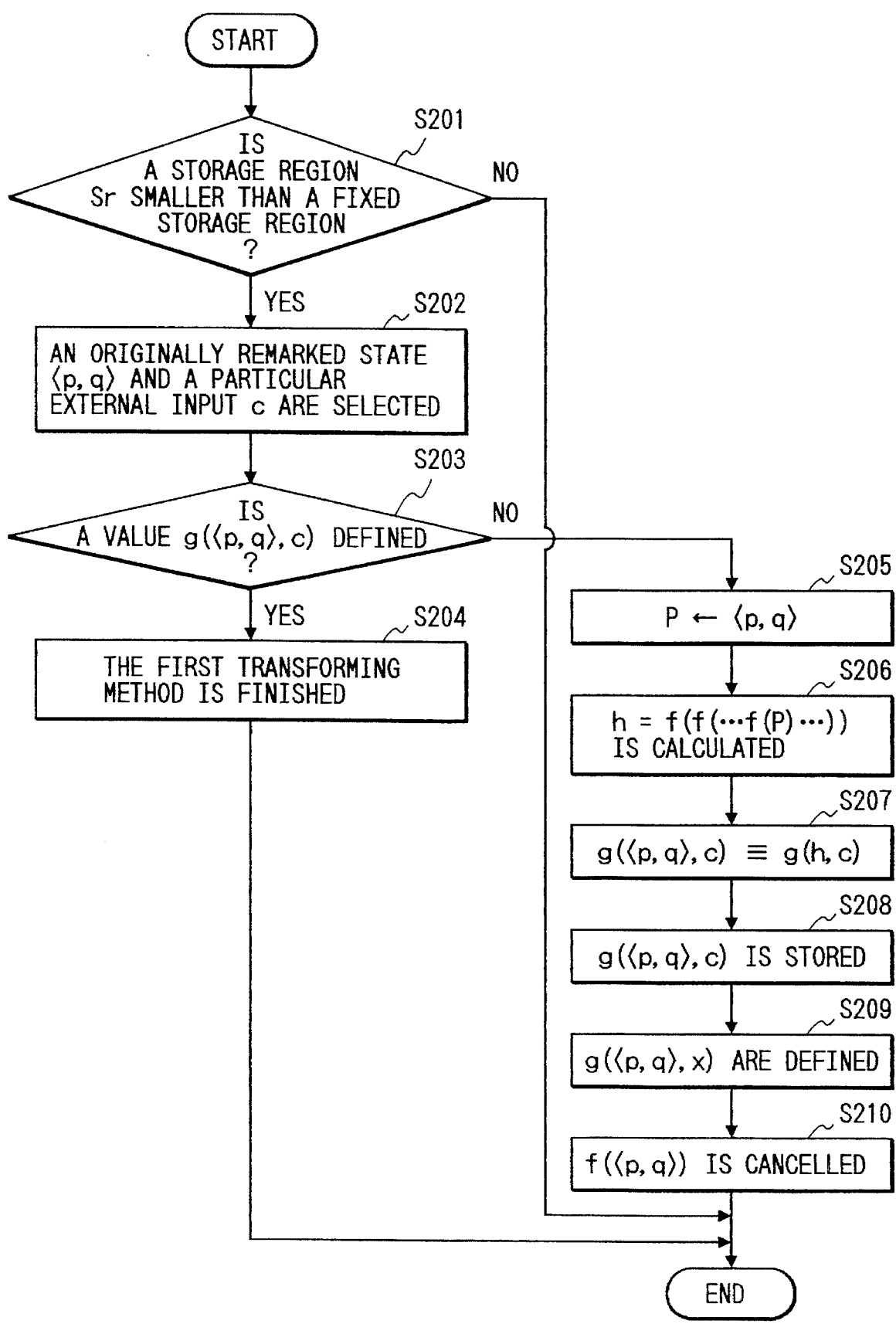
FIG. 17B is a flow chart of the first constructing method performed in the transforming method performing apparatus shown in FIG. 17A.

FIG. 17A is a block diagram of a transforming method performing apparatus in which a finite-state machine with failure transitions FFM represented by the Moore machine with failure transitions constructed according to the first constructing method is transformed according to the first transforming method. FIG. 17B is a flow chart of the first constructing method performed in the transforming method performing apparatus shown in FIG. 17A.

As shown in FIG. 17A, in cases where a finite-state machine with failure transitions FFM constructed according to the first constructing method is transformed according to the first transforming method in a transforming method performing apparatus 51, after a finite-state machine with failure transitions FFM is constructed according to the first constructing method in the constructing method performing apparatus 31, it is judged in a storage region judging unit 52 whether or not a storage region Sr required to store pieces of FFM transition data relating to state-transitions of the finite-state machine with failure transitions FFM is smaller than a fixed storage region (S201 shown in FIG. 17B). In cases where the storage region Sr is smaller than the fixed storage region, a plurality of strings of failure transitions from a plurality of remarked states of the machine FFM are selected one after another in the order placed nearer to an initial state of the machine FFM in a transformed state selecting unit 53, and each of the strings of failure transitions selected is changed to a success transition for each of external inputs in a transforming method performing means 54 according to the first transforming method.

Accordingly, because each of the strings of failure transitions is changed to a success transition on condition that the storage region Sr occupied by the state-transition of the machine FFH is smaller than the fixed storage region, the machine FFM in which a supreme state-transition operation is statistically performed can be constructed according to the first transforming method within the fixed storage region.

Figure 18:
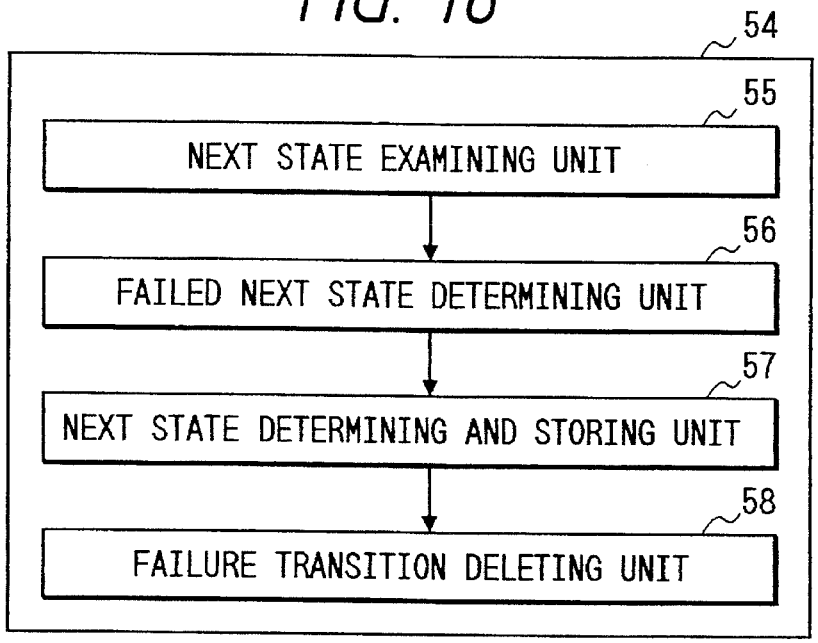
FIG. 18 is a block diagram of a transforming method performing means of the transforming method performing apparatus shown in FIG. 17A.
Figure 19:
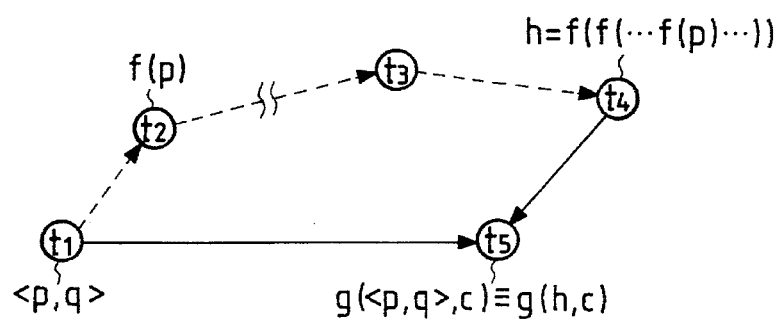
FIG. 19 shows a string of failure transitions changed to a success transition according to the first transforming method shown in FIG. 17B.

FIG. 18 is a block diagram of the transforming method performing means 54 of the transforming method performing apparatus 51 shown in FIG. 17.

As shown in FIG. 18, in a first step, an originally remarked state <p,q> and a particular external input c are selected in the transformed state selecting unit 53 (S202 shown in FIG. 17B). Thereafter, it is examined in a next state examining unit 55 of the transforming method performing means 54 whether or not a value g(<p,q>),c) of the success function g is defined (S203 shown in FIG. 17B). In cases where the value g(<p,q>),c) is defined, the value g(<p,q>),c)

denotes a next state in a particular success transition, and the first transforming method is finished (S204 shown in FIG. 17B). In contrast, in cases where the value g(<p,q>,c) of the success function g is not defined, the originally remarked state <p,q> is expressed by a symbol P denoting a remarked state (S205 shown in FIG. 17B).

Thereafter, in a second step of the first transforming method, a value f(P) of the failure function f is calculated in a failed next state determining unit 56 to determine a failed next state denoting a next state in the particular failure transition. In cases where a value g(f(P),c) of the success function g is not defined, the state f(P) is expressed by the symbol P denoting a remarked state newly defined, and the calculation of the value f(P) is repeated until a value g(f(P),c) of the success function g is defined. In other words, as shown in FIG. 19, a value h=f(f(...f(P)...)) is calculated in the failed next state determining unit 56 by repeating the calculation of the failure function f until a value g(h,c) of the success function g is defined (S206 shown in FIG. 17B).

Thereafter, in a third step of the first transforming method, a value g(<p,q>,c) of the success function g is defined as g(h,c) in a next state determining and storing unit 57 to determine a next state g(<p,q>,c)=g(h,c) for the originally remarked state <p,q> and the particular external input c (S207 shown in FIG. 17B). Thereafter, the next state g(<p, q>,c) is stored in the next state determining and storing unit 57 (S208 shown in FIG. 17B). In the same manner, values g(<p,q>,x) of the success function g are defined as next states for the originally remarked state <p,q> and arbitrary external inputs x, and the next states g(<p,q>,x) are stored in the next state determining and storing unit 57 (S209 shown in FIG. 17B).

Thereafter, in a fourth step of the first transforming method, the definition of the value f(<p,q>) of the failure function f is cancelled in a failure transition deleting unit 58 to delete the particular failure transition from the remarked state <p,q> (S210 shown in FIG. 17B).

Thereafter, in a fifth step of the first transforming method, the procedure of the first transforming method is finished.

Accordingly, because a plurality of failure transitions are changed to a success transition, a state-transition operation of the machine FFM transformed according to the first transforming method can be efficiently performed at a high speed.

Also, in cases where the machine FFM is not placed at the originally remarked state <p,q> during the operation of the machine FFM, the first transforming method can be performed even though the machine FFM is under operation.

FIG. 20 is a constitutional block diagram of an automatic product inspection system according to the second embodiment, the Moore machine with failure transitions FMO constructed according to the first constructing method being transformed according to the first transforming method in the automatic product inspection system.

As shown in FIG. 20, an automatic product inspection system 41 comprises the first sensor 22, the second sensor 23, the Moore machine with failure transitions constructing unit 24, a Moore machine transforming unit 42 having the transforming method performing apparatus 51 for transforming the FMO data of the Moore machine with failure transitions FMO constructed in the constructing unit 24 by changing a string of failure transitions performed by applying the failure function f to a single success transition performed by applying the success function g, a control unit 43 composed of an electronic circuit for storing pieces of transformed FMO data produced in the transforming unit 42 in a memory having the fixed storage capacity and producing pieces of control data corresponding to a final state of the Moore machine with failure transitions FMO which is determined according to the transformed FMO data indicating a transformed machine FMO and the inspecting values time-sequentially transferred from the first and second sensors 22, 23 as a string of external inputs, and the marking robot 26 for marking a non-defective mark on the product in cases where pieces of control data indicating that the product is a non-defective product are produced in the control unit 25. The number of transitions changed from the failure transitions to the success transitions in the Moore machine transforming unit 42 is determined on condition that the transformed FMO data is stored in the control unit 43 having a fixed storage capacity, and a failure transition from a current state nearer to an initial state has priority to be changed to a success transition.

In the above configuration of the automatic product inspection system 41 shown in FIG. 20, the operation of the system 41 in which a transforming method of a Moore machine with failure transitions constructed according to the first constructing method is applied is described.

Pieces of FMO data indicating the machine FMO shown in FIG. 16 are produced in the Moore machine with failure transitions constructing unit 24 from pieces of NMO data indicating the machine NMO shown in FIG. 14. Thereafter, the FMO data of the machine FMO are transformed in the Moore machine transforming unit 42 by changing a string of failure transitions to a single success transition to transfer pieces of transformed FMO data indicating a transformed machine FMO to the control unit 43.

In the control unit 43, a success transition is stored in a set having three elements of a starting point (or a current state), an ending point (or a next state) and an external input, and a failure transition is stored in a set having two elements of a starting point (or a current state) and an ending point (or a failed next state). Therefore, a storage capacity equivalent to 3 words is consumed in the control unit 43 each time a success transition of the transformed machine FMO or the machine FMO is defined in the transforming unit 42, and a storage capacity equivalent to 2 words is consumed in the control unit 43 each time a failure transition of the transformed machine FMO or the machine FMO is defined in the transforming unit 42. Also, the control unit 43 has, for example, the fixed storage capacity equivalent to 100 words. The fixed storage capacity of the control unit 43 is informed the transforming unit 42.

When the FMO data of the machine FMO constructed in the Moore machine with failure transitions constructing unit 24 is transferred to the transforming unit 42, the storage capacity consumed by the machine FMO is calculated in the transforming unit 42. Because twenty success transitions and eleven failure transitions are defined in the machine FMO shown in FIG. 16, the storage capacity equivalent to 82 words (20*3+11*2=82) is consumed by the machine FMO. Therefore, a storage capacity equivalent to 18 words remains in the control unit 43, and each of one or more strings of failure transitions is changed to a success transition within the increase of the storage capacity equivalent to 18 words to transform the machine FMO into a transformed machine FMO. In this case, the strings of failure transitions are selected one after another in the order placed nearer to an initial state of the machine FFM. Therefore, it is initially judged in the transforming unit 42 whether or not a failure transition in which a current state is equivalent to an initial state t0 exists, and the failure transition is changed to a success transition in cases where the failure transition exists.

In detail, the first transforming method is applied for the initial state <p,r>=t0 and each of external inputs c=A0B0, A0B1, A1B0 and A1B1. Because values g(t0,"A0B1") and g(t0,"A1B0") of the success function g for the initial state t0 and the external inputs A0B1 and A1B0 are defined as shown in FIG. 16, the first transforming method performed for each of the external inputs A0B1 and A1B0 is finished at the first step. In contrast, because values g(t0,"A0B0") and g(t0,"A1B1") of the success function g for the initial state t0 and the external inputs A0B0 and A1B1 are not defined, it is judged that a failure transition FT1 to be changed to a success transition exists. Also, because a value f(t0) of the failure function f at the initial state t0 is t3 and because a value g(t3,"A0B0") of the success function g is defined, a value h=f(f(...f(P)...)) is equal to f(t0)=t3. Thereafter, in the third step of the first transforming method, because the value g(t3,"A0B0") is t3, a value g(<p,r>,c)=g(t0,"A0B0") of the success function g for the initial state t0 and the external input A0B0 is defined to t3 (that is, g(t0,"A0B0")≡t3). Also, because a value g(t3,"A1B1") of the success function g is defined to t3 in the third step of the first transforming method, a value g(t0,"A1B1") of the success function g for the initial state t0 and the external input A1B1 is defined to t3 (that is, g(t0,"A1B1")≡t3). Because the values of the success function g for the initial state t0 and all of the external inputs are defined, the definition of the value f(t0) of the failure function f is allowed to be cancelled for the purpose of constructing a first-stage transformed machine FMO in the fourth step of the first transforming method on condition that a storage capacity required by the first-stage transformed machine FMO is equal to or smaller than the fixed storage capacity of the control unit 43.

Because the failure transition FT1 is deleted and two success transitions are newly defined, a storage capacity equivalent to 4 words (2*3−1*2=4) is additionally consumed in the control unit 43. Therefore, a storage capacity equivalent to 14 words (18−4=14) still remains in the control unit 43 even though the machine FMO is transformed into the first-stage transformed machine FMO, and the transformation of the machine FMO described above is performed to obtain the first-stage transformed machine FMO shown in FIG. 21.

Thereafter, a state placed nearest to the initial state t0 is selected. In other words, a state to which the first-stage transformed machine FMO reaches from the initial state t0 at the smallest state-transition times is selected. Because there are three states t1, t2 and t3 closest to the initial state t0, the state t1 is, for example, selected.

Figure 21:
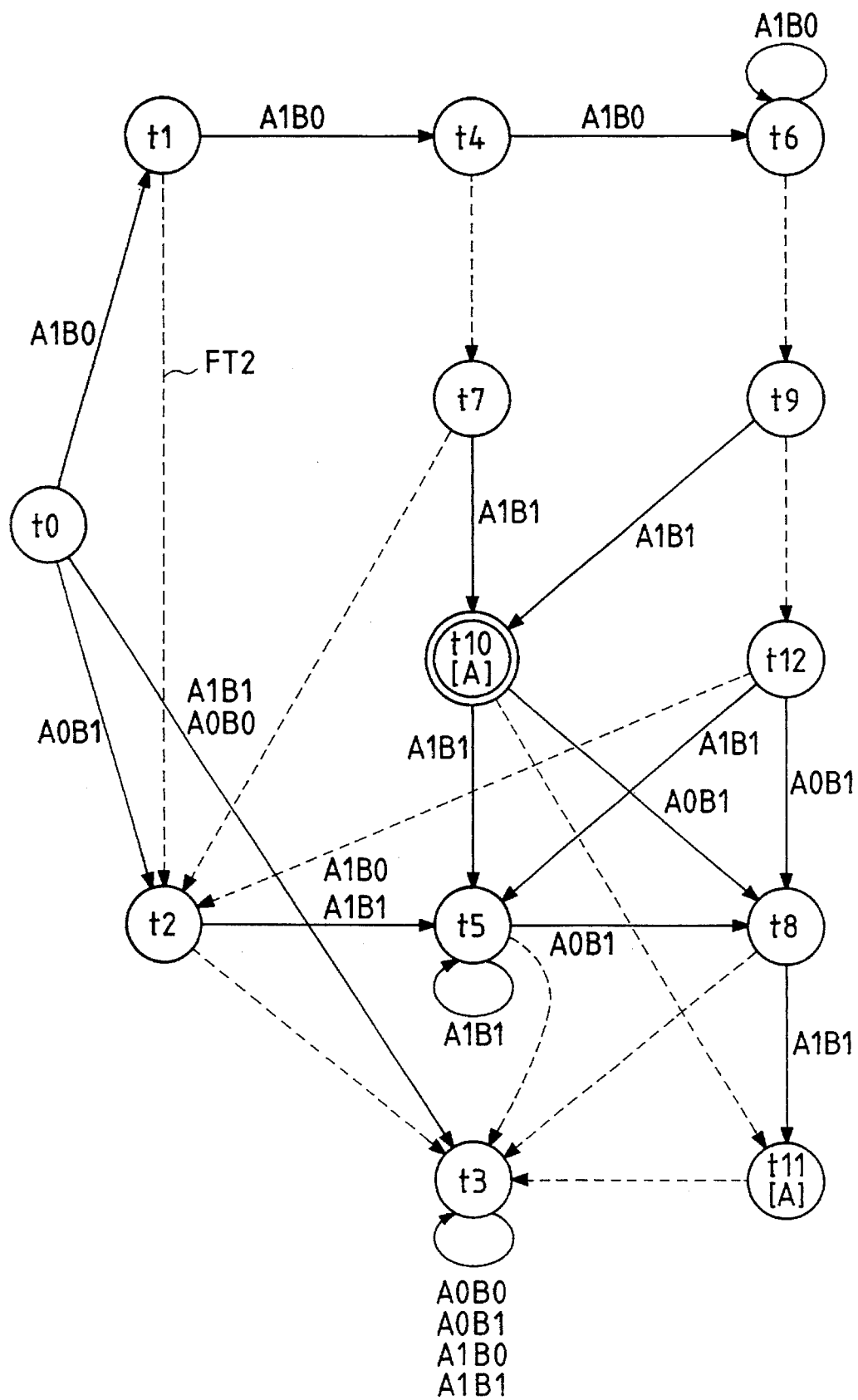
FIG. 21 shows a first-stage transformed machine FMO obtained by transforming the machine FMO shown in FIG. 16 according to the first transforming method shown in FIG. 17B.

Because a value g(t1,"A1B0") of the success function g for the selected state t1 and the external input A1B0 is defined as shown in FIG. 21, the first transforming method performed for the external input A1B0 is finished at the first step. In contrast, because a value g(t1,"A1B1") of the success function g for the selected state t1 and the external input A1B1 is not defined, it is judged that a failure transition FT2 to be changed to a success transition exists. Also, because a value f(t1) of the failure function f at the selected state t1 is t2 and because a value g(t2,"A1B1") of the success function g is defined, a value h=f(f(...f(P)...)) is equal to f(t1)=t2. Thereafter, in the third step of the first transforming method, because the value g(t2,"A1B1") is t5, a value g(<p,r>,c)=g(t1,"A1B1") of the success function g for the selected state t1 and the external input A1B1 is defined to t5 (that is, g(t1,"A1B1")≡t5). Also, because values g(t1,"A0B0") and g(t1,"A0B1") of the success function g for the selected state t1 and the external inputs A0B0 and A0B1 are not defined, it is judged that the failure transition FT2 to be changed to a success transition still exists. Also, because a value f(t1) of the failure function f at the selected state t1 is t2 and because values g(t2,"A0B0") and g(t2,"A0B1") of the success function g are not defined, a value f(t2)=f(f(t1)) of the failure function f at a selected state t2=f(t1) is calculated to t3. Because values g(t3,"A0B0") and g(t3,"A0B1") of the success function g are defined, a value h=f(f(...f(P)...)) is equal to f(f(t1))=f(t2)=t3. Thereafter, in the third step of the first transforming method, because the value g(t3,"A0B0") is t3, a value g(<p,r>,c)=g(t1,"A0B0") of the success function g for the selected state t1 and the external input A0B0 is defined to t3 (that is, g(t1,"A0B0")≡t3). Also, because the value g(t3,"A0B1") is 3, a value g(<p,r>,c)=g(t1,"A0B1") of the success function g for the selected state t1 and the external input A0B1 is defined to t3 (that is, g(t1,"A0B1")≡t3). Because the values of the success function g for the selected state t1 and all of the external inputs are defined, the definition of the value f(t1) of the failure function f is allowed to be cancelled for the purpose of constructing a second-stage transformed machine FMO in the fourth step of the first transforming method on condition that a storage capacity required by the second-stage transformed machine FMO is equal to or smaller than the fixed storage capacity of the control unit 43.

Because the failure transition FT2 is deleted and three success transitions are newly defined, a storage capacity equivalent to 7 words (3*3−1*2=7) is additionally consumed in the control unit 43. Therefore, a storage capacity equivalent to 7 words (14−7=7) still remains in the control unit 43 even though the first-stage transformed machine FMO is transformed into the second-stage transformed machine FMO, and the transformation of the first-stage transformed machine FMO described above is performed to obtain the second-stage transformed machine FMO shown in FIG. 22.

Figure 22:
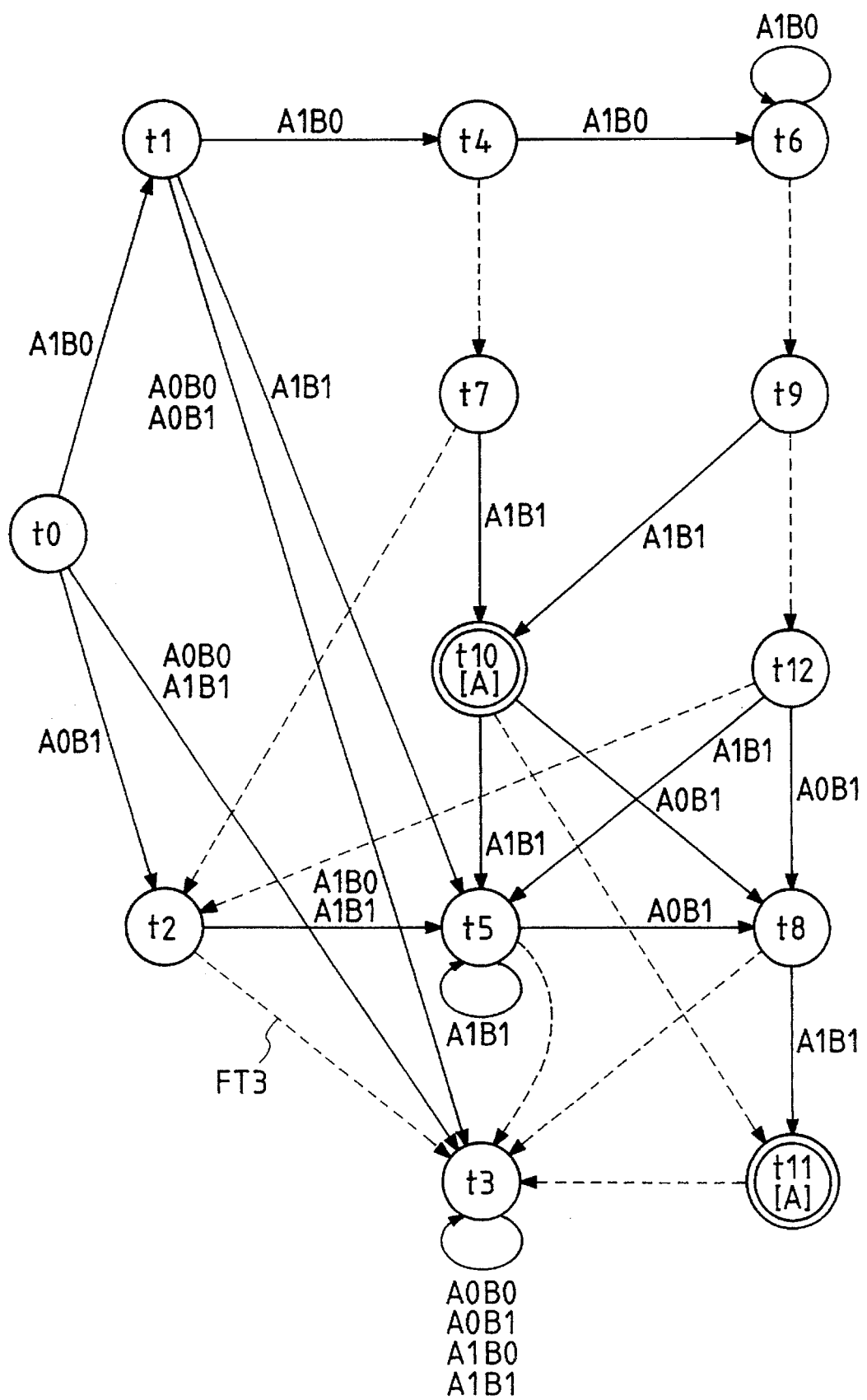
FIG. 22 shows a second-stage transformed machine FMO obtained by transforming the first-stage transformed machine FMO shown in FIG. 21 according to the first transforming method shown in FIG. 17B.
Figure 23:
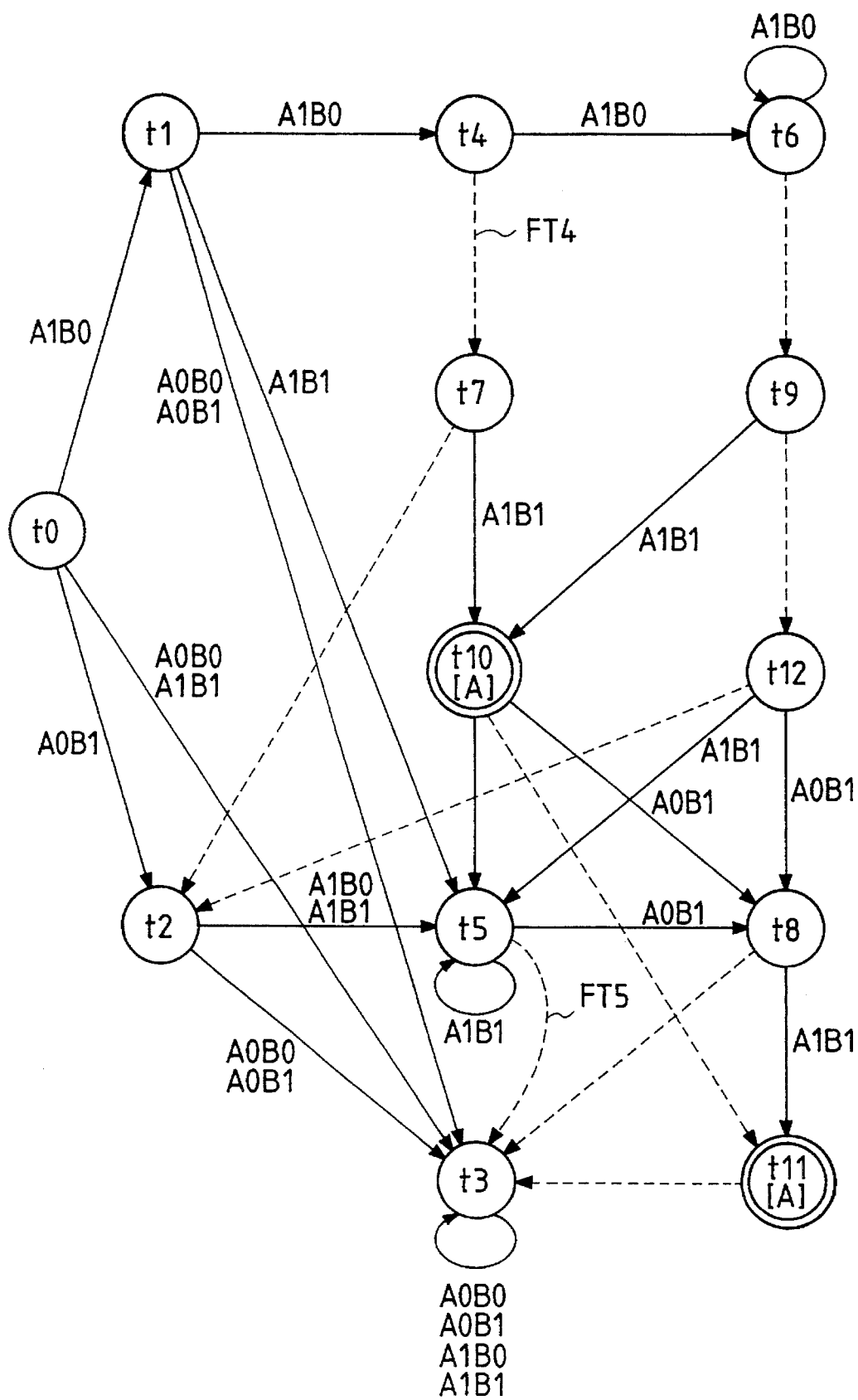
FIG. 23 is a third-stage transformed machine FMO obtained by transforming the second-stage transformed machine FMO shown in FIG. 22 according to the first transforming method shown in FIG. 17B.

Thereafter, the state t2 is, for example, selected because the state t2 is placed nearest to the initial state t0. Thereafter, values g(t2,"A0B0") and g(t2,"A0B1") of the success function g are defined, and a failure transition FT3 shown in FIG. 22 is cancelled in the same manner. Therefore, a third-stage transformed machine FMO shown in FIG. 23 is constructed according to the first transforming method. In this case, a storage capacity equivalent to 4 words (2*3−1*2=4) is additionally consumed in the control unit 43. Therefore, a storage capacity equivalent to 3 words (7−4=3) still remains in the control unit 43.

Thereafter, the state t3 is, for example, selected because the state t2 is placed nearest to the initial state t0. In this case, because values g(t3,c) of the success function g for the state t3 and all of the external inputs c are defined as shown in FIG. 23, the first transforming method performed for each of the external inputs is finished at the first step. That is, the third-stage transformed machine FMO is not transformed.

Because all of the states t1, t2 and t3 to which the third-stage transformed machine FMO reaches in a state-transition are transformed, one of states t4 and t5 to which the third-stage transformed machine FMO reaches in two state-transitions is selected. However, in cases where a failure transition FT4 of the state 4 is changed to three success transitions, a storage capacity equivalent to 7 words (3*3−1*2=7) is additionally required, so that a storage capacity more than the fixed storage capacity is required to transform the third-stage transformed machine FMO. Also, in cases where a failure transition FT5 of the state 5 is changed to three success transitions, a storage capacity equivalent to 7 words (3*3−1*2=7) is additionally required, so that a storage capacity more than the fixed storage capacity is required to transform the third-stage transformed machine FMO. Therefore, the first transforming method is finished, and the third-stage transformed machine FMO is not transformed. Thereafter, pieces of transformed FMO data (equivalent to 97 words) of the third-stage transformed machine FMO are transferred to the control unit 42, and pieces of control data corresponding to a final state of the third-stage transformed machine FMO are produced according to the transformed FMO data and the inspecting values time-sequentially transferred from the first and second sensors 22, 23 as a string of external inputs, and the marking robot 26 is operated according to the transformed FMO data.

Accordingly, because each of the strings of failure transitions is changed to a success transition on condition that a storage capacity required by a transformed machine FMO transformed according to the first transforming method is equal to or smaller than the fixed storage capacity, the transformed machine FMO in which a supreme state-transition operation is statistically performed can be constructed according to the first transforming method.

Also, because the machine FMO is transformed to the transformed machine FMO by locally changing each of the strings of failure transitions to a success transition, the transformation of the machine FMO can be performed during the operation of the machine FMO according to the first transforming method on condition that the machine FMO is not placed at a state relating to the transformation of the machine FMO.

Next, a modification of the first transforming method applied for the Moore machine with failure transitions FMO is described.

Initially, a modified transforming method applied to transform the machine FMO constructed according to the first constructing method is described with reference to FIG. 24.

Figure 24A:
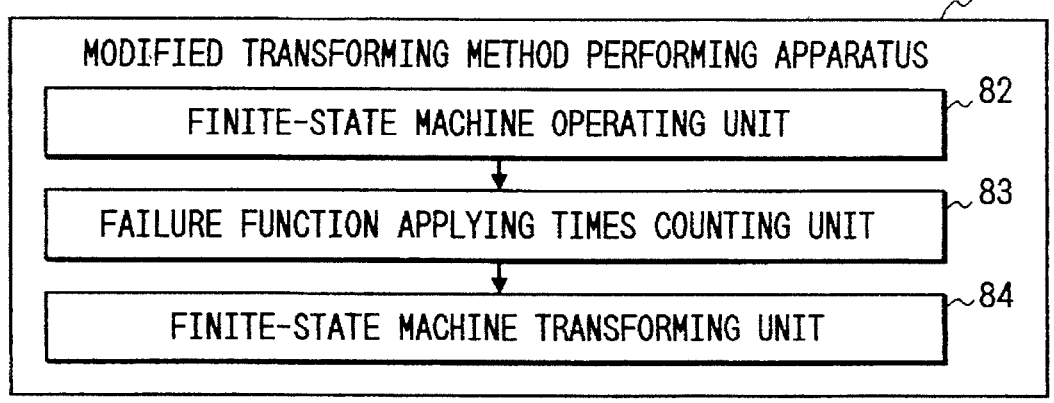
FIG. 24A is a block diagram of a modified transforming method performing apparatus in which a machine FFM represented by the machine FMO constructed according to the first constructing method is transformed according to a modified transforming method.
Figure 24B:
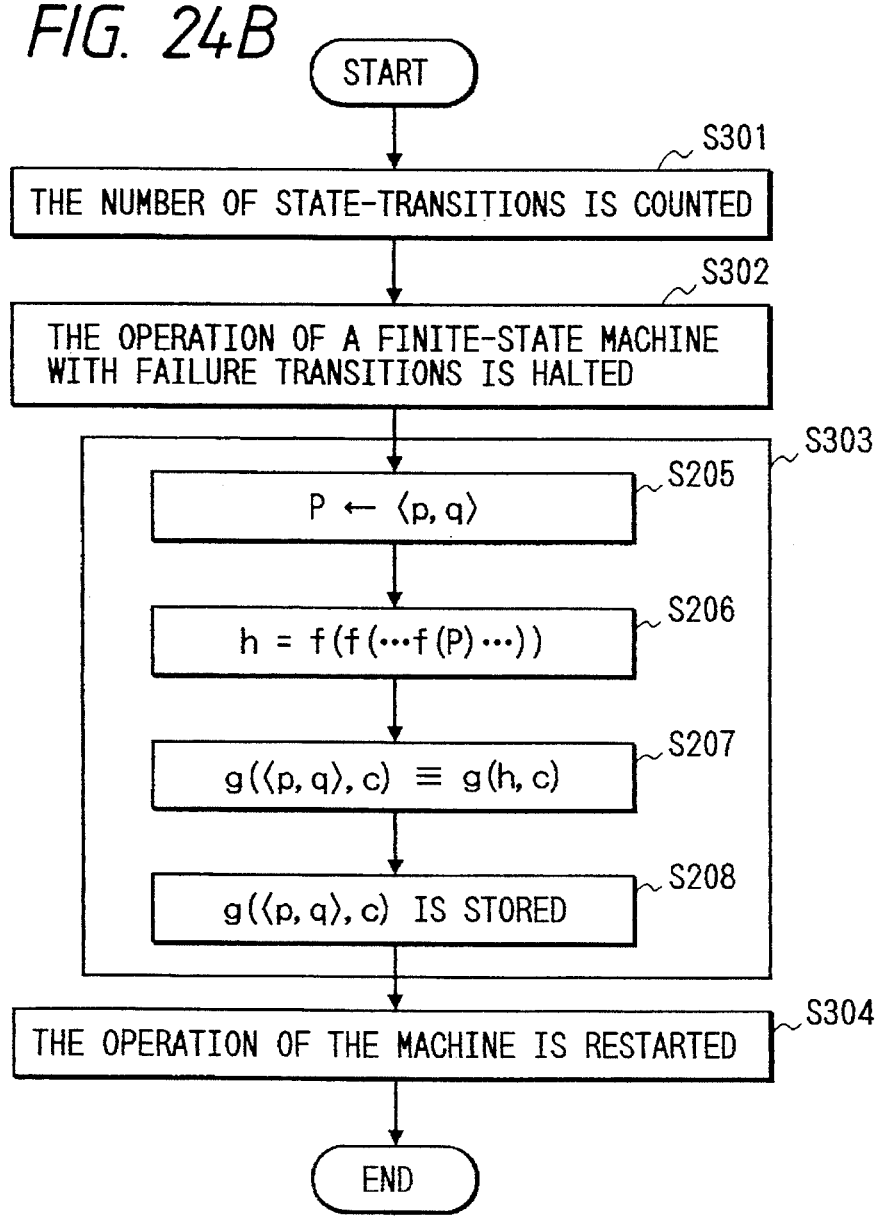
FIG. 24B is a flow chart of the modified transforming method performed in the modified transforming method performing apparatus shown in FIG. 24A.

FIG. 24A is a block diagram of a modified transforming method performing apparatus in which the machine FFM represented by the machine FMO constructed according to the first constructing method is transformed according to the modified transforming method. FIG. 24B is a flow chart of the modified transforming method performed in the modified transforming method performing apparatus shown in FIG. 24A.

As shown in FIG. 24A, in cases where the number of state-transitions performed between two states not necessarily adjacent to each other is counted during the operation of the machine FFM to change a string of failure transitions actually performed at a high frequency to a success function in a modified transforming method performing apparatus 81, after a finite-state machine with failure transitions FFM is constructed according to the first constructing method in the constructing method performing apparatus 31, the machine FFM is operated by the action of a finite-state machine operating unit 82. Thereafter, the number of state-transitions performed by applying the failure function to takes the machine FFM from each of current states to each of next states according to each of external inputs is counted in a failure function applying times counting unit 83 for each of the current states and each of the external inputs (S301 shown in FIG. 24B). Thereafter, when the number of state-transitions performed by applying the failure function f to perform a particular failure transition of the machine FFM from a particular current state for a particular external input is summed up to a fixed number of times, the operation of the machine FFM is halted by the action of the finite-state machine operating unit 82 (S302 shown in FIG. 24B). Thereafter, the particular current state and the particular external input are informed a finite-state machine transforming unit 84, and the particular failure transition is changed to a particular success transition for the particular current state and the particular external input according to the first transforming method to transform the machine FFM into a transformed machine FFM in the finite-state machine transforming unit 84 (S303 shown in FIG. 24B). Thereafter, the operation of the transformed machine FFM is restarted by the action of the finite-state machine operating unit 82 (S304 shown in FIG. 24B).

Accordingly, because the machine FFM is transformed into the transformed machine FFM according to the modified transforming method to be fitted for a particular type of external inputs, the transformed machine FFM can be appropriately operated at a high speed for each of types of external inputs.

FIG. 25 is a constitutional block diagram of an automatic product inspection system according to a modification of the second embodiment, the Moore machine with failure transitions FMO constructed according to the first constructing method being transformed according to the modified transforming method described in FIG. 24A.

As shown in FIG. 25, an automatic product inspection system 71 comprises the first sensor 22, the second sensor 23, the Moore machine with failure transitions constructing unit 24, a Moore machine transforming unit 72 having the modified transforming method performing apparatus 81 for transforming the FMO data of the Moore machine with failure transitions FMO constructed in the constructing unit 24 by changing a string of failure transitions to a single success transition according to a modification of the first transforming method, a control unit 73 composed of an electronic circuit for storing pieces of transformed FMO data produced in the transforming unit 72 in a memory having the fixed storage capacity and producing pieces of control data corresponding to a final state of the Moore machine with failure transitions FMO which is determined according to the transformed FMO data indicating a transformed machine FMO and the inspecting values time-sequentially transferred from the first and second sensors 22, 23 as a string of external inputs, and the marking robot 26.

The number of transitions changed from the strings of failure transitions to the success transitions in the Moore machine transforming unit 72 is determined on condition that the transformed FMO data is stored in the memory of the control unit 73 having the fixed storage capacity.

Three differences between the modified transforming method and the first transforming method is described.

A first difference is that phased transformations are performed according to the modified transforming method without performing serial transformations according to the first transforming method. A second difference is that a success transition from a current state for a particular external input is newly defined and other success transitions from the same current state for other external inputs are not defined according to the modified transforming method. A third difference is that a string of failure transitions performed more than the number of prescribed times is selected according to the modified transforming method to be changed to a success transition.

In the above configuration, the operation of the automatic product inspection system 71 is described.

Initially, pieces of control data is determined in the control unit 73 according to the FMO data produced in the constructing unit 24 and the inspecting values time-sequentially transferred from the first and second sensors 22, 23 as a string of external inputs each time a product is inspected. After many products are inspected, in cases where a sequential state-transition corresponding t0→t0→t1→t4→t10 is performed many times by receiving a string of external inputs "A1B0","A1B0" and "A1B1" many times and the number of state-transitions caused by a string of external inputs "A1B0","A1B0" and "A1B1" reaches the number of prescribed times, the change of a state-transition from the state t4 to the state t10 including a failure transition from the state t4 to the state t7 is performed to transform the machine FMO into a transformed machine FMO. In other words, a value t10 of the success function g for the state t4 and the external input A1B1 is additionally defined according to an equation (25).

$$g(t4, "A1B1") \equiv t10 \tag{25}$$

Thereafter, the inspection of products is performed by utilizing the transformed machine FMO.

Accordingly, because the state-transition from the state t4 to the state t10 is performed at a high speed, the inspection of products can be appropriately performed at a high speed.

Next, a document retrieving apparatus of a pattern matching apparatus according to a third embodiment of the present invention is described. A finite-state machine with failure transitions FFM specialized for a pattern matching is called the pattern matching machine.

Initially, the third constructing method applied to construct a pattern matching machine according to the third embodiment is described.

Figure 26A:
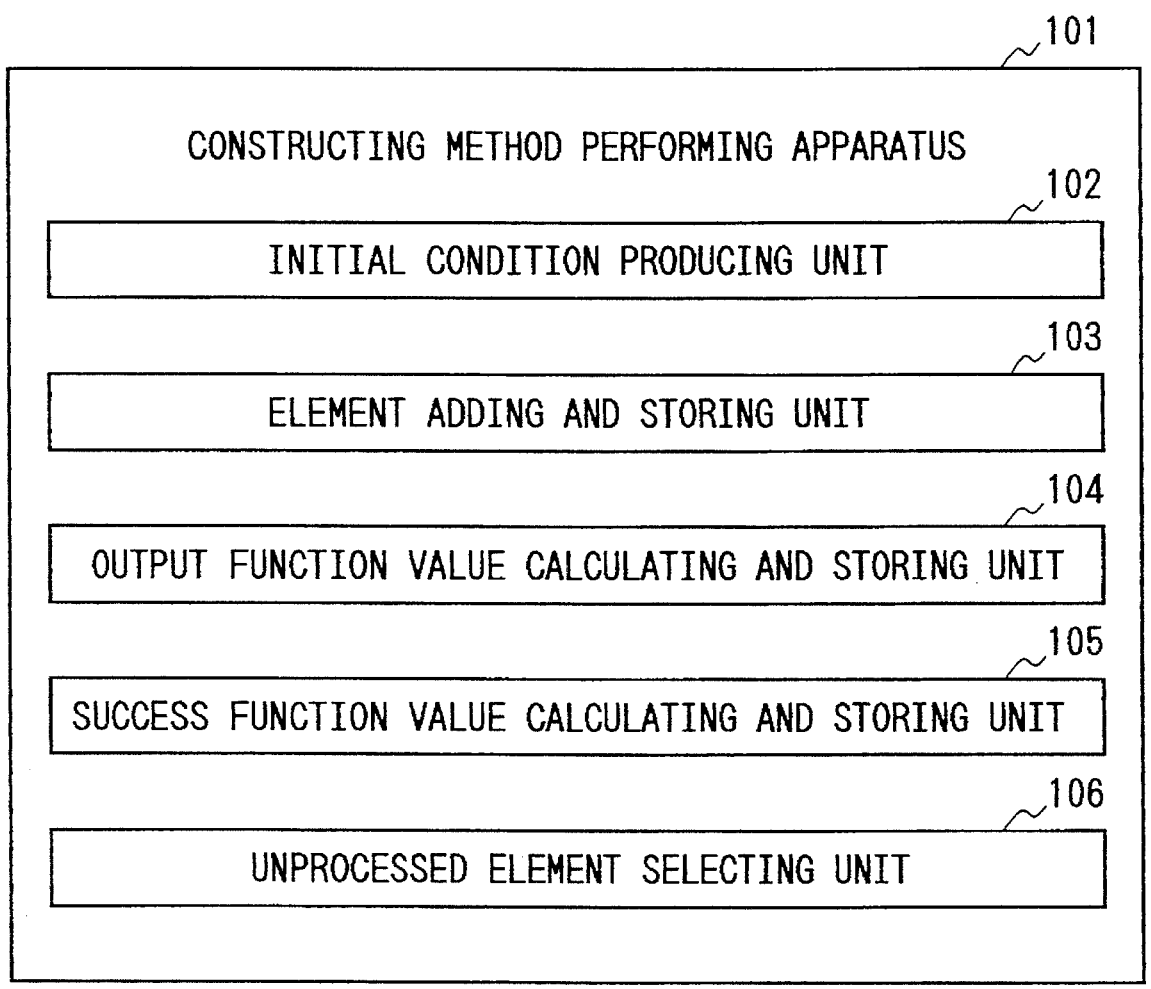
FIG. 26A is a block diagram of a constructing method performing apparatus for constructing a pattern maching machine according to a third constructing method.
Figure 26B:
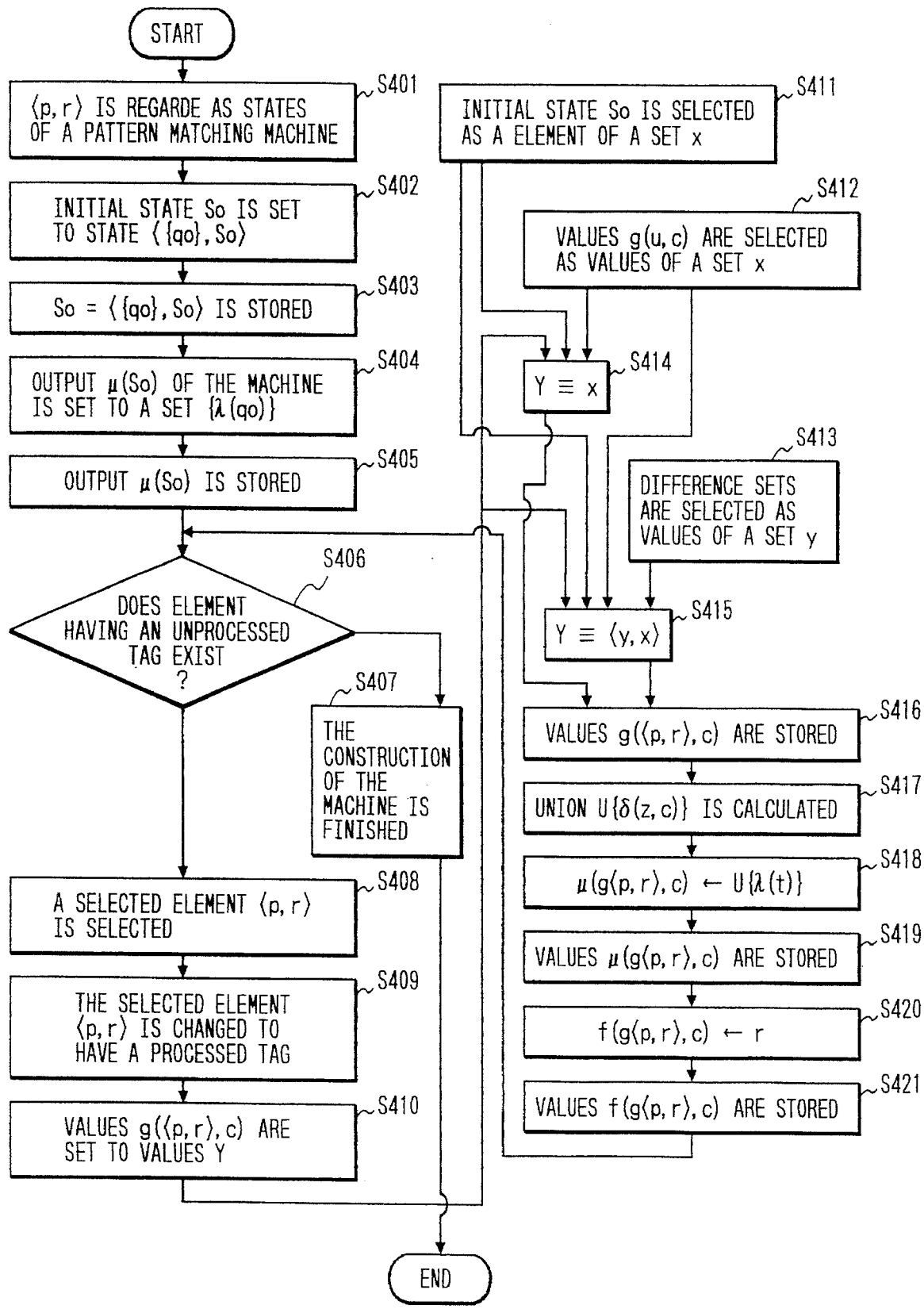
FIG. 26B is a flow chart of the third constructing method performed in the constructing method performing apparatus shown in FIG. 26A.

FIG. 26A is a block diagram of a constructing method performing apparatus for constructing a pattern matching machine according to the third constructing method. FIG. 26B is a flow chart of the third constructing method performed in the constructing method performing apparatus shown in FIG. 26A.

In cases where a pattern matching machine is constructed in a constructing method performing apparatus 101, by utilizing both a set p of states in a nondeterministic finite-state machine and a set r of states in the pattern matching machine, a combination <p,r> of the sets p and r is regarded as states of the pattern matching machine (S401 shown in FIG. 26B). Thereafter, an initial construction of the pattern matching machine is performed in a first step. In detail, by utilizing an initial state $q_0$ of the nondeterministic finite-state machine, an initial state $s_0$ of the pattern matching machine is set to a state $<\{q_0\}, s_0>$ in an initial condition producing unit 102 of the apparatus 101 (S402 shown in FIG. 26B), and the initial state $s_0 = <\{q_0\}, s_0>$ is stored in an element adding and storing unit 103 to add the initial state $s_0$ to a state set of the pattern matching machine as an element having an unprocessed tag (S403 shown in FIG. 26B). Thereafter, in the initial condition producing unit 102, an output $\mu(s_0)$ of the pattern matching machine at the initial state $s_0$ is set to be a set $\{\lambda(q_0)\}$ having an output of the nondeterministic finite-state machine at the initial state $q_0$ (S404 shown in FIG. 26B), and the output $\mu(s_0)$ is stored in an output function value calculating and storing unit 104 (S405 shown in FIG. 26B).

In a second step of the method for constructing the pattern matching machine, it is checked whether or not an element having an unprocessed tag exists in the state set of the pattern matching machine placed in the element adding and storing unit 103 (S406 shown in FIG. 26B). In cases where an element having an unprocessed tag does not exist in the state set of the pattern matching machine, no existence of an element having an unprocessed tag is detected in an unprocessed element selecting unit 106, and the construction of the pattern matching machine is finished (S407 shown in FIG. 26B). In contrast, in cases where one or more elements <p,r> respectively having an unprocessed tag exist in the state set of the pattern matching machine, an element <p,r> first added to the state set of the pattern matching machine is selected from the state set of the pattern matching machine as a selected element by the action of the unprocessed element selecting unit 106 (S408 shown in FIG. 26B), and the selected element <p,r> having an unprocessed tag stored in the element adding and storing unit 103 is changed to an selected element <p,r> respectively having a processed tag (S409 shown in FIG. 26B).

In a third step of the method for constructing the pattern matching machine, one or more values g(<p,r>,c) of the success function g for each of first referential characters c which specify next states δ(t,c) defined in the nondeterministic finite-state machine according to one of elements t of a state set p of the nondeterministic finite-state machine corresponding to a first component of the selected element <p,r> are set to values Y denoting next states defined in the pattern matching machine (S410 shown in FIG. 26B). The values Y are determined as follows. The initial state $s_0$ is selected as an element of a set x in case of <p,r>=$s_0$ (S411 shown in FIG. 26B). In case of <p,r>≠$s_0$, a first calculation r(<p,r>) for taking out a second component r of the selected state <p,r> is repeated one or more times until values g(.,c) = g(r(r(...r(<p,r>)...)),c) of a success function g are defined to obtain a state u=r(r(...r(<p,r>)...)), and values g(u,c) of the success function g for the state u and the first referential input characters c are selected as values of a set x (S412 shown in FIG. 26B). Also, a first union Uδ(t,c) of next states δ(t,c) of the nondeterministic finite-state machine for elements t of the set p of states and the first referential characters c is calculated, a second union p(x)Up(r(x))U-p(r(r(x)))U—Up(r(r(...r(x)...))) of a string of sets p(x),p(r(x-)),p(r(r(x))), - - - ,p(r(r(...r(x)...))) obtained by applying a second calculation for taking out a first component p of the selected state <p,r> of the pattern matching machine after the first calculation r(x) is repeated a zero time or more is calculated, and difference sets Uδ(t,c)–p(x)Up(r(x))U-p(r(r(x)))U—Up(r(r(...r(x)...))) of the first and second unions for the first referential characters c are selected as values of a set y (S413 shown in FIG. 26B). In cases where the set y is the empty set, the values g(<p,r>,c) of the success function g in the pattern matching machine is set to elements of the set x (Y≡x) (S414 shown in FIG. 26B). In cases where the set y is not the empty set, the values g(<p,r>,c) of the success function g in the pattern matching machine are set to states <y,x> (Y≡<y,x>) (S415 shown in FIG. 26B). Thereafter, the values g(<p,r>,c) of the success function g are stored in a success function value calculating and storing unit 105 (S416 shown in FIG. 26B).

Thereafter, in cases where the values Y of the success function g are not stored in the element adding and storing unit 103, the values Y are stored in the element adding and storing unit 103 to add the values Y to the state set of the pattern matching machine as elements respectively having an unprocessed tag. The values Y denote states defined in the pattern matching machine. Also, output values μ(Y) of the output function μ of the pattern matching machine at the states Y are calculated as follows. A third union U{δ(z,c)} of next states δ(z,c) in the nondeterministic finite-state machine for elements z of a state set p of the nondeterministic finite-state machine corresponding to a first component of the selected element <p,r> and the first referential characters c is calculated (S417 shown in FIG. 26B), and the output values μ(Y) are set to a fourth union U{λ(t)} of values λ(t) of the output function λ of the nondeterministic finite-state machine for elements t of the third union U{δ(z,c)} (S418 shown in FIG. 26B). Thereafter, the output values μ(Y)= U{λ(t)} are stored in the output function value calculating and storing unit 104 (S419 shown in FIG. 26B).

In a fourth step of the method for constructing the pattern matching machine, in cases where one or more second referential characters c which specify next states defined in the nondeterministic finite-state machine according to one of elements t of a state set p of the nondeterministic finite-state machine corresponding to a first component of the selected element <p,r> exist, values f(Y) of the failure function f at the states Y≡g(<p,r>,c) are set to elements of a state set r of the nondeterministic finite-state machine corresponding to a second component of the selected element <p,r> (S420 shown in FIG. 26B) and are stored in a calculated failure function value storing unit 107 (S421 shown in FIG. 26B).

In a fifth step of the method for constructing the pattern matching machine, the procedure for constructing the pattern matching machine returns to the second step, and the procedure from the second step to the fourth step is repeated until no existence of an element having an unprocessed tag is detected in the unprocessed element selecting unit 106 in the second step.

Accordingly, a pattern matching machine in which a table of the state transitions has a smaller size than that in a conventional deterministic finite-state machine can be constructed at a high speed.

Figure 27:
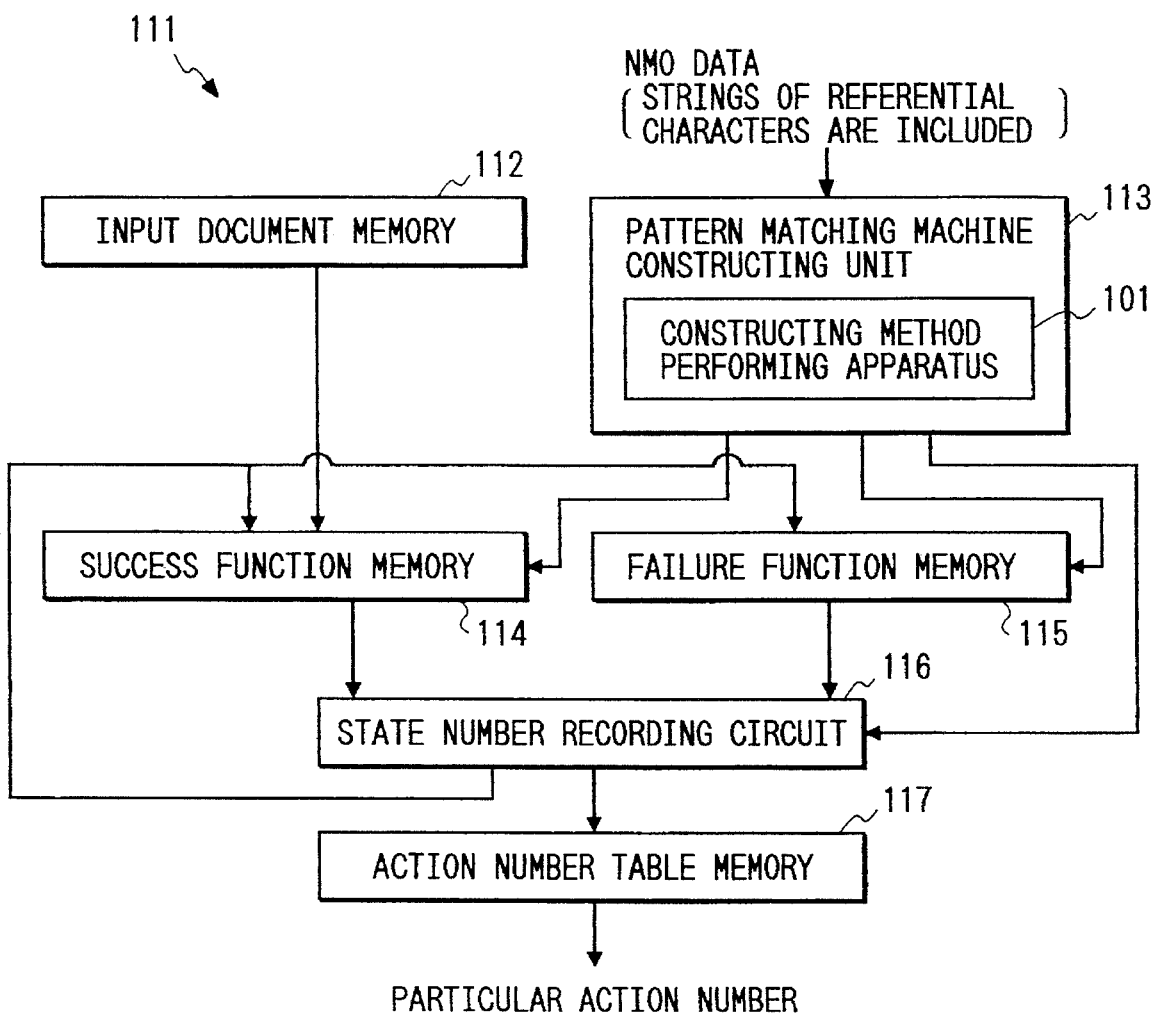
FIG. 27 is a block diagram of a document retrieving apparatus provided in a pattern matching apparatus, in which the third constructing method shown in FIG. 26B is utilized, according to a third embodiment.

FIG. 27 is a block diagram of a document retrieving apparatus of a pattern matching apparatus, in which the third constructing method performed in the constructing method performing apparatus 101 is utilized, according to the third embodiment.

As shown in FIG. 27, a document retrieving apparatus 111 comprises an input document memory 112 for storing an input document composed of a series of character numbers indicating a series of characters and outputting the character numbers one by one, a pattern matching machine constructing unit 113 having the constructing method performing apparatus 101 for producing pieces of FMO data of a pattern matching machine FMO from pieces of NMO data of a nondeterministic Moore machine and a plurality of strings of external characters input from outsides according to the third constructing method of the pattern matching machine FMO, a success function memory 114 for storing values of the success function g defined in the constructing unit 113 in a table form in which state numbers indicating states of the pattern matching machine FMO and the character numbers transferred from the input document memory 112 are listed to retrieval the values of the success function g, a failure function memory 115 for storing values of the failure function f defined in the constructing unit 113 in a table form in which state numbers indicating states of the pattern matching machine FMO are listed to retrieval the values of the failure function f, a state number recording circuit 116 for recording a particular state number output from either the success function memory 114 or the failure function memory 115 each time a state-transition of the pattern matching machine FMO constructed in the constructing unit 113 is performed according to a character number stored in the input document memory 112, and an action number table memory 117 for storing action numbers indicating types of actions defined in the constructing unit 113 and outputting a particular action number corresponding to the particular state number output from the recording circuit 116.

Figure 8:
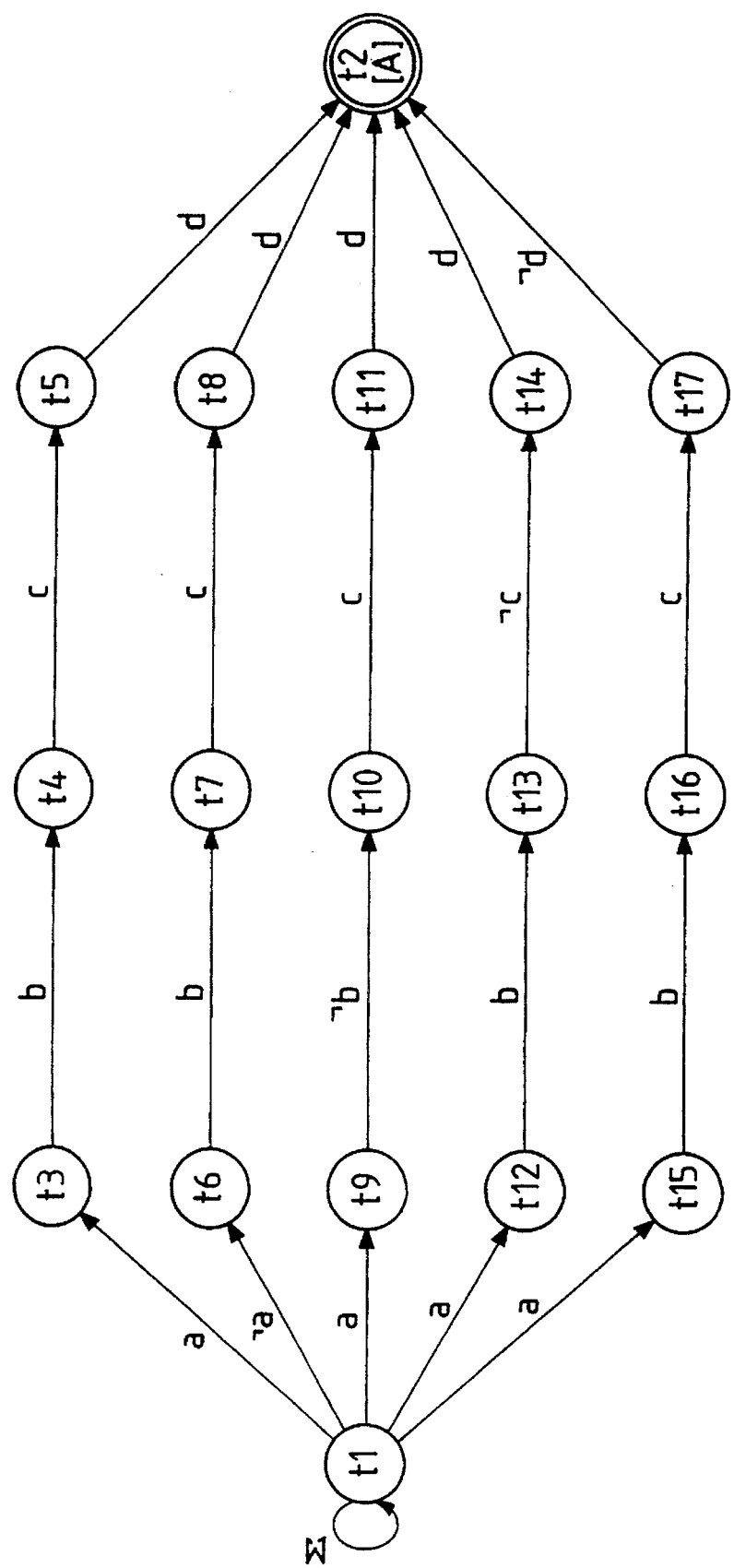
FIG. 8 is a state-transition view of the nondeterministic Moore machine constructed to satisfy the pattern matching conditions expressed in the regular expression shown in FIG. 6 according to the Robinson method.
Figure 11:
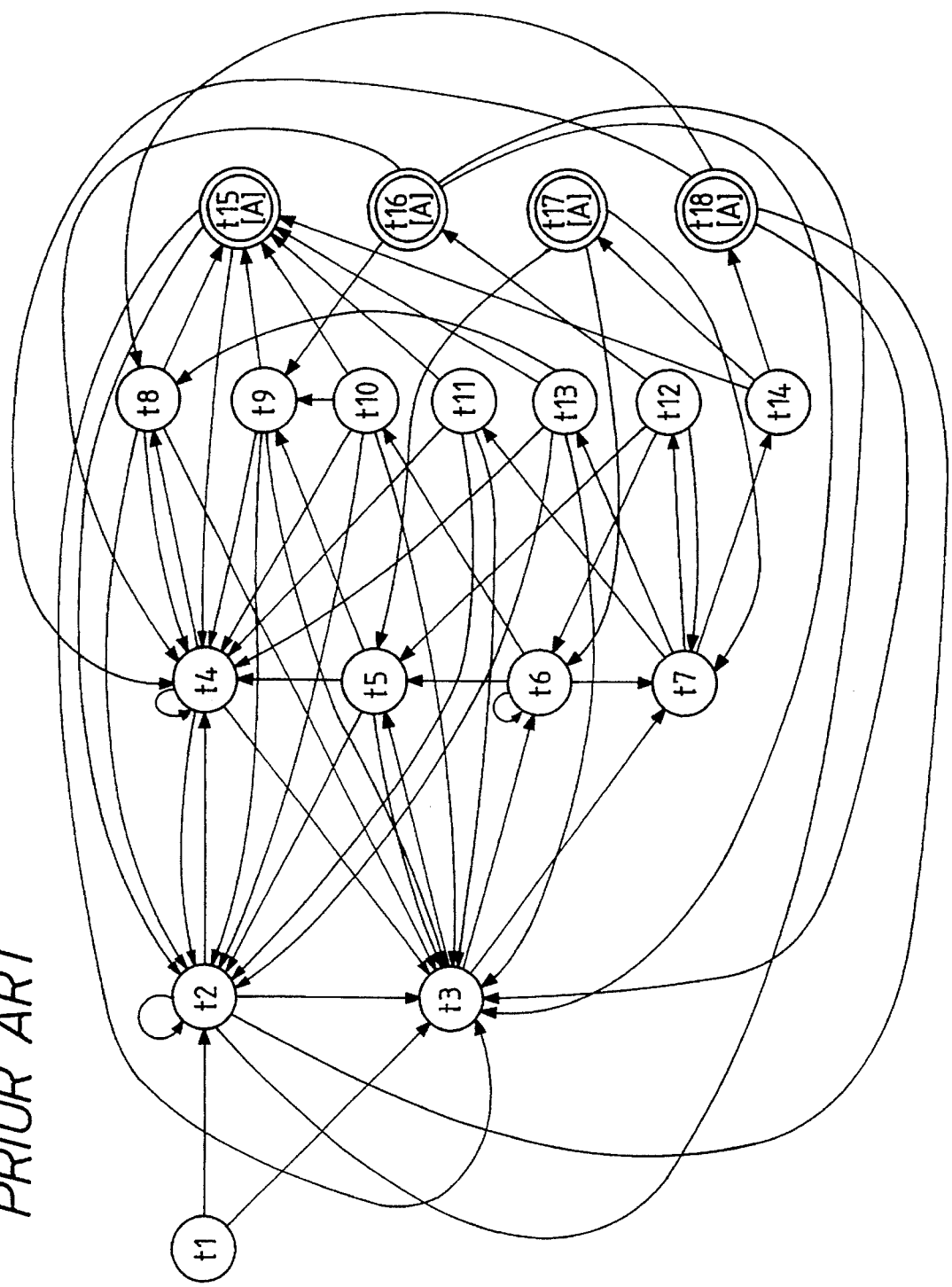
FIG. 11 is a state-transition view of the deterministic Moore machine constructed according to the process shown in FIG. 9.

For example, the state-transitions of the machine NMO shown in FIGS. 7 and 8 are input to the constructing unit 113, and the pattern matching machine FMO is constructed according to the third constructing method by utilizing a computer program shown in FIGS. 28(a), 28(b).

In FIGS. 28(a), 28(b), "FMO_state(i): <{q1,q2, - - - ,qm},s>" denotes that the i-numbered state of the pattern matching machine FMO to be constructed corresponds to a combination of a state set having states q1,q2, - - - ,qm of the nondeterministic Moore machine NMO as elements and an s-numbered state already defined in the pattern matching machine FMO. "FMO_goto (<{q1, - - - ,qm},s>,"x")=<{p1, - - - ,pn},t> (j)" denotes that the character x takes the pattern matching machine FMO from a current state <{q1, - - - ,qm},s> to a next j-numbered state <{p1, - - - ,pn},t>. "NMO_goto ({q1, - - - ,qm),"x")={p1,---,pn}" denotes that the character x takes the pattern matching machine FMO from a state set {q1, - - - ,qm} of the machine NMO to a state set {p1, - - - ,pn}. "FMO fail (<{q1, - - - ,qm},s>,"x")=<(p1,- - - ,pn),t> denotes that a value <{p1, - - - ,pn},t> of the failure function f is defined because a value of the success function g for the state <{q1, - - - ,qm},s> of the pattern matching machine FMO and the character x is not defined.

Figure 30:
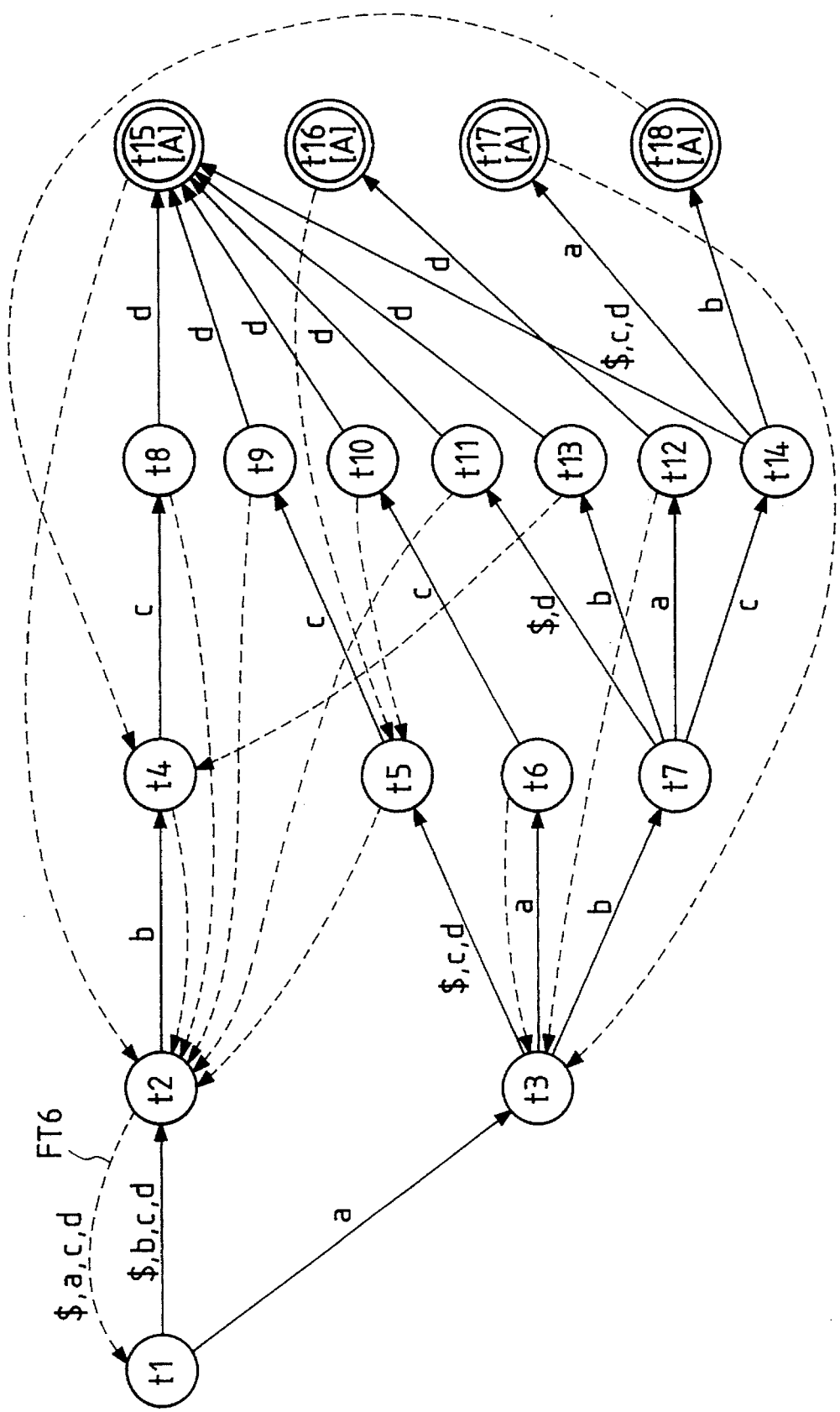
FIG. 30 shows a pattern matching machine constructed according to the third constructing method, the pattern matching machine being constructed in a pattern matching machine constructing unit shown in FIG. 27.

Also, a state-transition table of the pattern matching machine FMO which is, for example, obtained on the basis of pattern matching conditions of a string of referential characters specified by the regular transformation shown in FIG. 6 is produced in the constructing unit 113 and is stored in the success function memory 114, the failure function memory 115 and the action number table memory 117. In this case, the state-transition table of the pattern matching machine FMO produced in the constructing unit 113 is shown in FIG. 29, and the pattern matching machine FMO produced is shown in FIG. 30.

In FIG. 29, the state numbers 1 to 18 denoting the states t1 to t18 of the pattern matching machine FMO are listed in a state column, outputs A denoting an output set of the pattern matching machine FMO is listed in an output column, state numbers of next states for each of characters a, b, c and d are listed in a next state column, state numbers of next states for characters $ other than a, b, c and d are listed in the next state column, and values of the failure function f re listed in a fail column. The number of state-transitions is summed up to 44 in cases where a success transition from a current state to a next state for a character is estimated as one state-transition.

In the above configuration of the document retrieving apparatus 111 shown in FIG. 27, the operation of the apparatus 111 in which a constructing method of the pattern matching machine FMO constructed in the constructing unit 113 in a form of pieces of FMO data is applied is described.

Initially, a plurality of strings of referential characters (for example, a string of referential characters abcd) and pieces of NMO data produced by applying a regular transformation to pieces of original NMO data are input from an external input apparatus (not shown) to the constructing unit 113. Also, a plurality of actions are included in the NMO data. Thereafter, pieces of FMO data are produced in the constructing method performing apparatus 101 by utilizing the NMO data and the strings of referential characters to construct a pattern matching machine FMO according to the third constructing method described in FIG. 26. For example, the pattern matching machine shown in FIG. 30 is constructed in cases where the string of referential characters abcd is input to the constructing unit 113. Therefore, in cases where a string of characters agreeing with one of the strings of referential character is found out from the input document, the string of characters is successfully retrieved in the document retrieving apparatus 111. Also, various actions denoting outputs of states in the pattern matching machine FMO are specified according to the actions of the NMO data.

In the FMO data, values of the success function g, values of the failure function f and actions A indicated by outputs of states of the pattern matching machine FMO are included. The values of the success function g are stored in the success function memory 114, the values of the failure function f are stored in the failure function memory 115, and action numbers indicating the actions A are stored in the action number table memory 117 in connection with state numbers indicating the states.

Thereafter, the input document memory 112 is initialized, and a series of characters of an input document is input to the input document memory 112. In this case, a remarked character Cr of the input document is placed at the head of a retrieval region to start the retrieval of the input document from the remarked character Cr. Simultaneously, the state number recording circuit 116 is initialized, and a current state number of the state t1 initially stored in the recording circuit 116 is set to zero. Therefore, the initializing operation is finished, and a pattern matching operation for retrieving the characters of the input document stored in the input document memory 112 by utilizing the pattern matching machine FMO which is constructed by utilizing the strings of referential characters.

Thereafter, a value g(t1,Cr) of the success function g stored in the success function memory 194 is retrieved by referring the current state number t1 output from the recording circuit 116 and the remarked character Cr output from the input document memory 112. In cases where the value g(t1,Cr) is defined in the memory 114, the value g(t1,Cr) is recorded in the recording circuit 116 as a particular state number denoting a next state. That is, the remarked character Cr takes the pattern matching machine FMO from the remarked state t1 to the next state, and the next state is called a remarked state newly determined.

In contrast, in cases where the value g(t1,Cr) is not defined in the memory 114, a value f(t1) of the failure function f for the remarked state t1 is output from the failure function memory 115 to the recording circuit 116, and the value f(t1) is stored as a state number indicating a next state. Thereafter, a value g(f(t1),Cr) of the success function g stored in the success function memory 194 is retrieved in the same manner by referring the state number f(t1) output from the recording circuit 116 and the remarked character Cr. The retrieval is repeated without changing the remarked character Cr to another character until a value g(f(f(...f(t1)...)),Cr) defined in the memory 114 is found out. When the value g(f(f(...f(t1)...)),Cr) of the success function g defined in the success function memory 114 is found out, the value g(f(f(...f(t1)...)),Cr) is recorded in the recording circuit 116 as a particular state number denoting a next state. That is, the remarked character Cr takes the pattern matching machine FMO from the remarked state t1 to the next state g(f(f(...f(t1)...)),Cr), and the next state is called a remarked state newly determined.

Therefore, the particular state number is transferred to the action number table memory 117, and a particular action number which corresponds to a particular action denoting an output at the particular state number is output. Thereafter, the particular action for recording a position of the remarked character Cr in the input document is, for example, performed according to the particular action number in the pattern matching apparatus in which the document retrieving apparatus 111 is arranged.

Thereafter, another character subsequent to the remarked character Cr is selected as a remarked character newly determined, and an operation in which the remarked character newly determined takes the pattern matching machine FMO from the remarked state newly determined to a next state is repeated until the operation of the pattern matching machine FMO is halted according to a particular action number output from the memory 117 or the state-transition of the pattern matching machine FMO is performed for all of the characters stored in the input document memory 112. Thereafter, the pattern matching operation is finished.

The success function memory 114 is, for example, made of an associative memory. Therefore, in cases where the associative retrieval of a value of the success function g for a remarked character number and a current state number is performed by referring a combined number formed of the remarked character number and the current state number, the failure function memory 115 and the action number table memory 117 can be respectively made of an ordinary random access memory.

Figure 32:
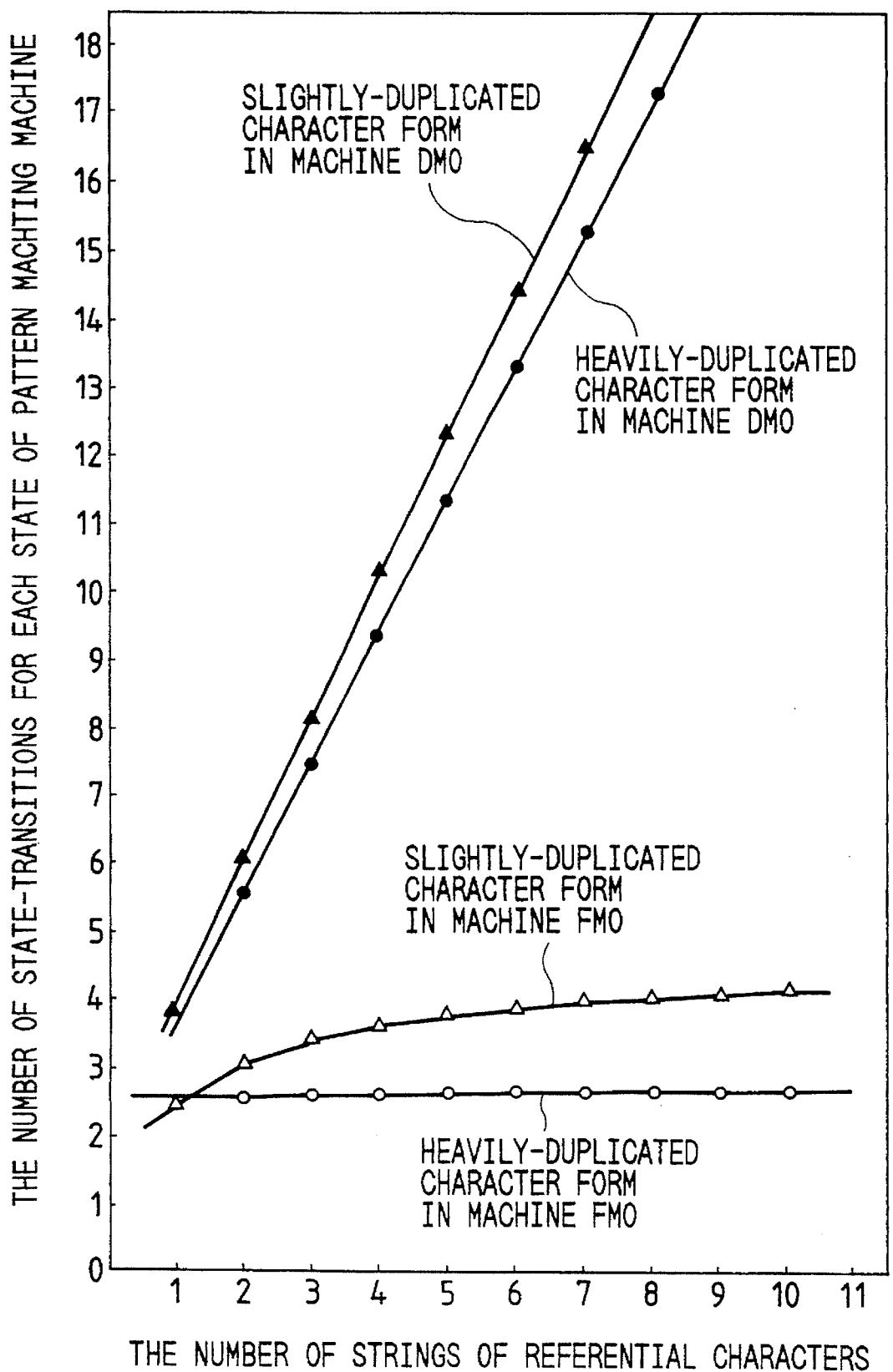
FIG. 32 shows the comparison of the number of state-transitions for one state of the pattern matching machine FMO shown in FIG. 30 and the number of state-transitions for one state of the machine DMO shown in FIG. 4, on the basis of the pattern matching conditions shown in FIG. 31.

By comparing the state-transitions shown in FIGS. 10 and 32, the number of state-transitions of the pattern matching machine FMO shown in FIG. 29 is remarkably smaller than that of the machine DMO shown in FIG. 10. Also, in cases where the pattern matching conditions specified by the regular transformation shown in FIG. 6 are changed to extended pattern matching conditions specified by the regular transformation shown in FIG. 31, the difference in the number of state-transitions between the pattern matching machine FMO and the machine DMO is enlarged. In FIG. 31, N strings of referential characters in both a heavily duplicated character form and a slightly duplicated character form are listed for each of 11 cases (a variable N ranges from 1 to 11). In the heavily duplicated character form, one or more referential characters in a string of referential characters for a case agree with those in another string of referential characters for the same case. In the slightly duplicated character case, one or more referential characters in a string of referential characters for an N-th case agree with those in another string of referential characters for the same N-th case (N ranges from 3 to 11), and any referential character in any string of referential characters for an N-th case does not agree with a referential character in another string of referential characters for the same N-th case (N ranges from 1 to 2).

FIG. 32 shows the comparison of the number of state-transitions for one state of the pattern matching machine FMO and the number of state-transitions for one state of the machine DMO, on the basis of the pattern matching conditions shown in FIG. 31.

In FIG. 32, the number of state-transitions from a current state for a plurality of characters is equal to the number of characters in the machine DMO. Also, the number of state-transitions in the pattern matching machine FMO is equal to the sum of the number of values of the success function g defined and the number of values of the failure function f defined. In cases where the pattern matching machine FMO and the machine DMO are constructed to fit the pattern matching conditions shown in FIG. 31, the number of states of the pattern matching machine FMO is the same as that of the machine DMO for an arbitrary number of referential characters. However, even though the number N of strings of referential characters is increased, the number of state-transitions for one state of the pattern matching machine FMO is slightly increased regardless of whether the pattern matching machine FMO is constructed to fit the strings of referential characters formed according to either the slightly duplicated character form or the heavily duplicated character form. For example, the number of defined values of the success function g for one state of the pattern matching machine FMO ranges from one to three. In contrast, in cases where the number N of strings of referential characters is increased in the machine DMO, the number of state-transitions for one state of the machine DMO is linearly increased for the slightly duplicated character form and the heavily duplicated character form. Therefore, the number of state-transitions for one state in the machine DMO is almost N times as much as that in the pattern matching machine FMO.

Accordingly, the pattern matching operation can be performed at a high speed by utilizing the pattern matching machine FMO constructed according to the third constructing method, as compared with the pattern matching operation performed by utilizing the machine DMO.

Also, because the number of state-transitions for one state in the machine DMO is almost N times as much as that in the pattern matching machine FMO and because a producing time required to produce a state-transition in the machine DMO is the same as that in the pattern matching machine FMO, a constructing time required to construct the machine DMO is almost N times as much as that required to construct the pattern matching machine FMO. Therefore, the pattern matching machine FMO can be constructed at a high speed as compared with the machine DMO.

Next, a document retrieving apparatus of a pattern matching apparatus according to a fourth embodiment of the present invention is described. A finite-state machine with failure transitions FFM specialized for a pattern matching is called the pattern matching machine.

Initially, the first transforming method applied to transform a pattern matching machine constructed according to the third constructing method is described with reference to FIGS. 33 and 34.

Figure 33A:
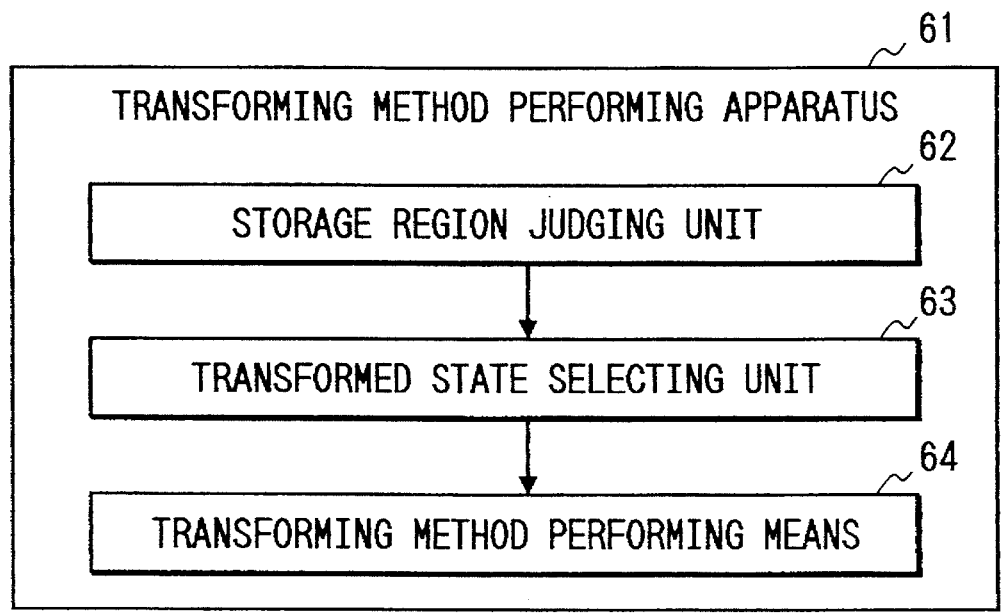
FIG. 33A is a block diagram of a transforming method performing apparatus in which a pattern matching machine constructed according to the third constructing method is transformed according to the first transforming method.
Figure 33B:
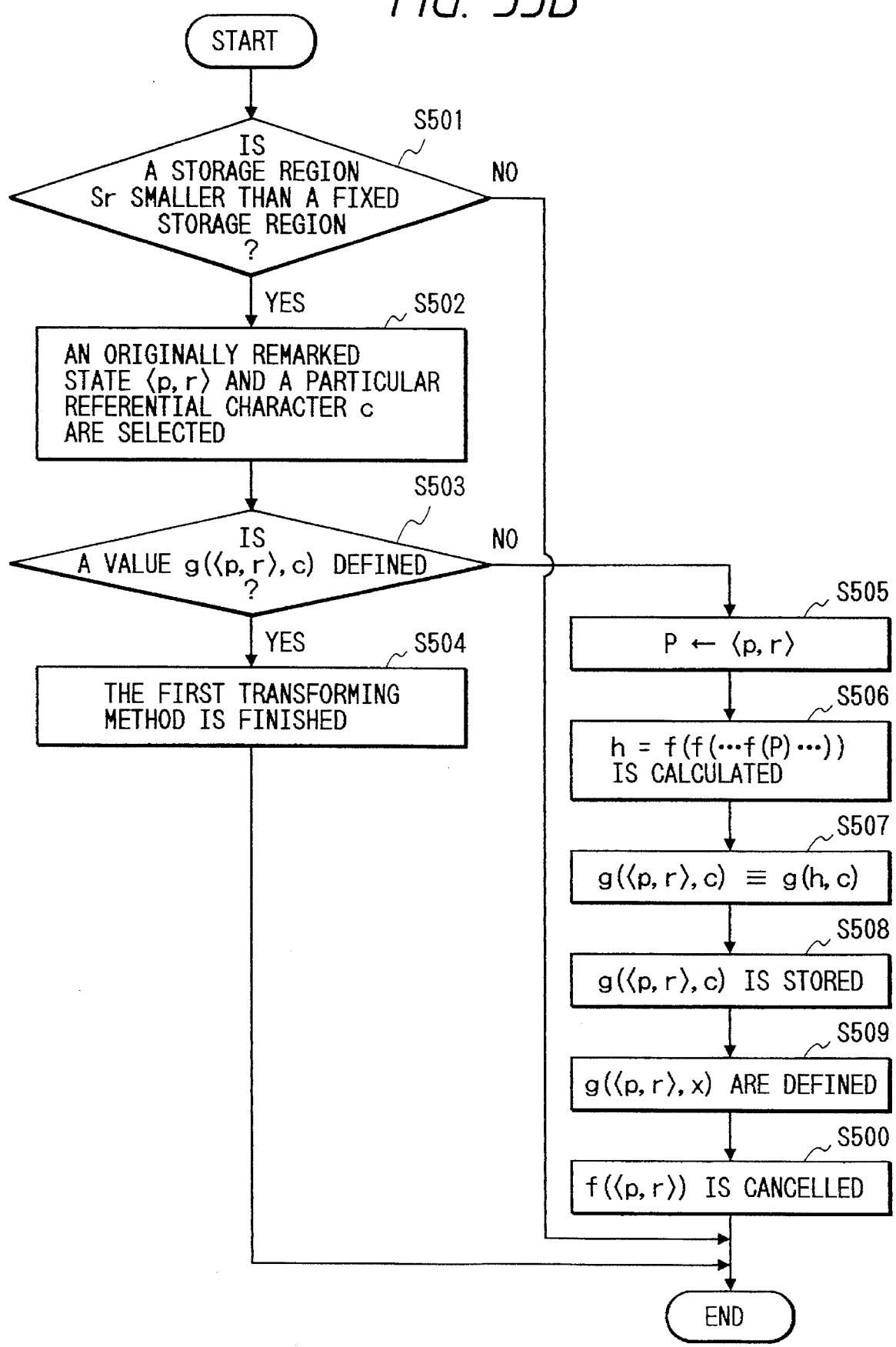
FIG. 33B is a flow chart of the first transforming method performed in the transforming method performing apparatus shown in FIG. 33A.

FIG. 33A is a block diagram of a transforming method performing apparatus in which a pattern matching machine constructed according to the third constructing method is transformed according to the first transforming method. FIG. 33B is a flow chart of the first transforming method performed in the transforming method performing apparatus 35 shown in FIG. 33A.

As shown in FIG. 33A, in cases where a pattern matching machine constructed according to the third constructing method is transformed according to the first transforming method in a transforming method performing apparatus 61, after the pattern matching machine is constructed according to the third constructing method, it is judged in a storage region judging unit 62 whether or not a storage region Sr required to store pieces of transition data relating to state-transitions of the pattern matching machine is smaller than a fixed storage region (S501 shown in FIG. 33B). In cases where the storage region Sr is smaller than the fixed storage region, a plurality of strings of failure transitions from a plurality of remarked states of the pattern matching machine are selected one after another in the order placed nearer to an initial state of the pattern matching machine in a transformed state selecting unit 63, and each of the strings of failure transitions selected is changed to a success transition for each of external characters in a transforming method performing means 64 according to the first transforming method.

Accordingly, because each of the strings of failure transitions is changed to a success transition on condition that the storage region Sr occupied by the state-transition of the pattern matching machine is smaller than the fixed storage region, the pattern matching machine in which a supreme state-transition operation is statistically performed can be constructed according to the first transforming method within the fixed storage region.

Figure 34:
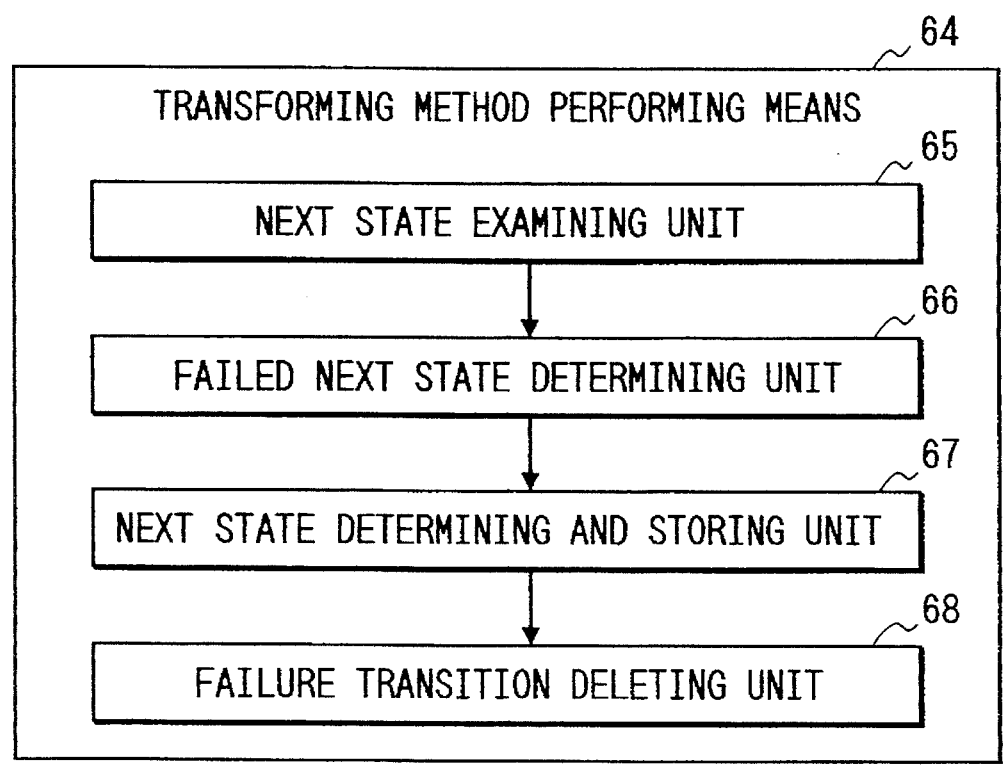
FIG. 34 is a block diagram of a transforming method performing means of the transforming method performing apparatus shown in FIG. 33A.

FIG. 34 is a block diagram of the transforming method performing means 64 of the transforming method performing apparatus 61 shown in FIG. 33A.

As shown in FIG. 34, in a first step, an originally remarked state <p,r> and a particular referential character c are selected and determined in the transformed state selecting unit 63 (S502 shown in FIG. 33B). Thereafter, it is examined in a next state examining unit 65 of the transforming method performing means 64 whether or not a value g(<p,r>),c) of the success function g is defined (S503 shown in FIG. 33B). In cases where the value g(<p,r>),c) is defined, the value g(<p,r>),c) denotes a next state in a particular success transition, and the first transforming method is finished (S504 shown in FIG. 33B). In contrast, in cases where the value g(<p,r>,c) of the success function g is not defined, the originally remarked state <p,r> is expressed by a symbol P denoting a remarked state (S505 shown in FIG. 33B).

Thereafter, in a second step of the first transforming method, a value f(P) of the failure function f is calculated in a failed next state determining unit 66 to determine a failed next state denoting a next state in the particular failure transition. In cases where a value g(f(P),c) of the success function g is not defined, the state f(P) is expressed by the symbol P denoting a remarked state P newly defined, and the calculation of the value f(P) is repeated until a value g(f(P),c) of the success function g is defined. In other words, as shown in FIG. 19, a value h=f(f(...f(P)...)) is calculated in the failed next state determining unit 66 by repeating the calculation of the failure function f until a value g(h,c) of the success function g is defined (S506 shown in FIG. 33B).

Thereafter, in a third step of the first transforming method, a value g(<p,r>,c) of the success function g is defined to g(h,c) in a next state determining (S507 shown in FIG. 33B) and is stored in a next state determining and storing unit 67 to determine a next state g(<p,r>,c)=g(h,c) for the originally remarked state <p,r> and the particular referential character c (S508 shown in FIG. 33B). Thereafter, the next state g(<p,r>,c) is stored in the next state determining and storing unit 67. In the same manner, values g(<p,r>,x) of the success function g are defined as next states for the originally remarked state <p,r> and arbitrary referential characters x, and the next states g(<p,r>,x) are stored in the next state determining and storing unit 67 (S509 shown in FIG. 33B).

Thereafter, in a fourth step of the first transforming method, the definition of the value f(<p,r>) of the failure function f is cancelled in a failure transition deleting unit 68 to delete the particular failure transition from the originally remarked state <p,r> (S510 shown in FIG. 33B).

Thereafter, in a fifth step of the first transforming method, the procedure of the first transforming method is finished.

Accordingly, because a plurality of failure transitions are changed to a success transition, a state-transition operation of the pattern matching machine transformed according to the first transforming method can be efficiently performed at a high speed.

Also, in cases where the pattern matching machine is not placed at the originally remarked state <p,r> during the operation of the pattern matching machine, the first transforming method can be performed even though the pattern matching machine is under operation.

Figure 35:
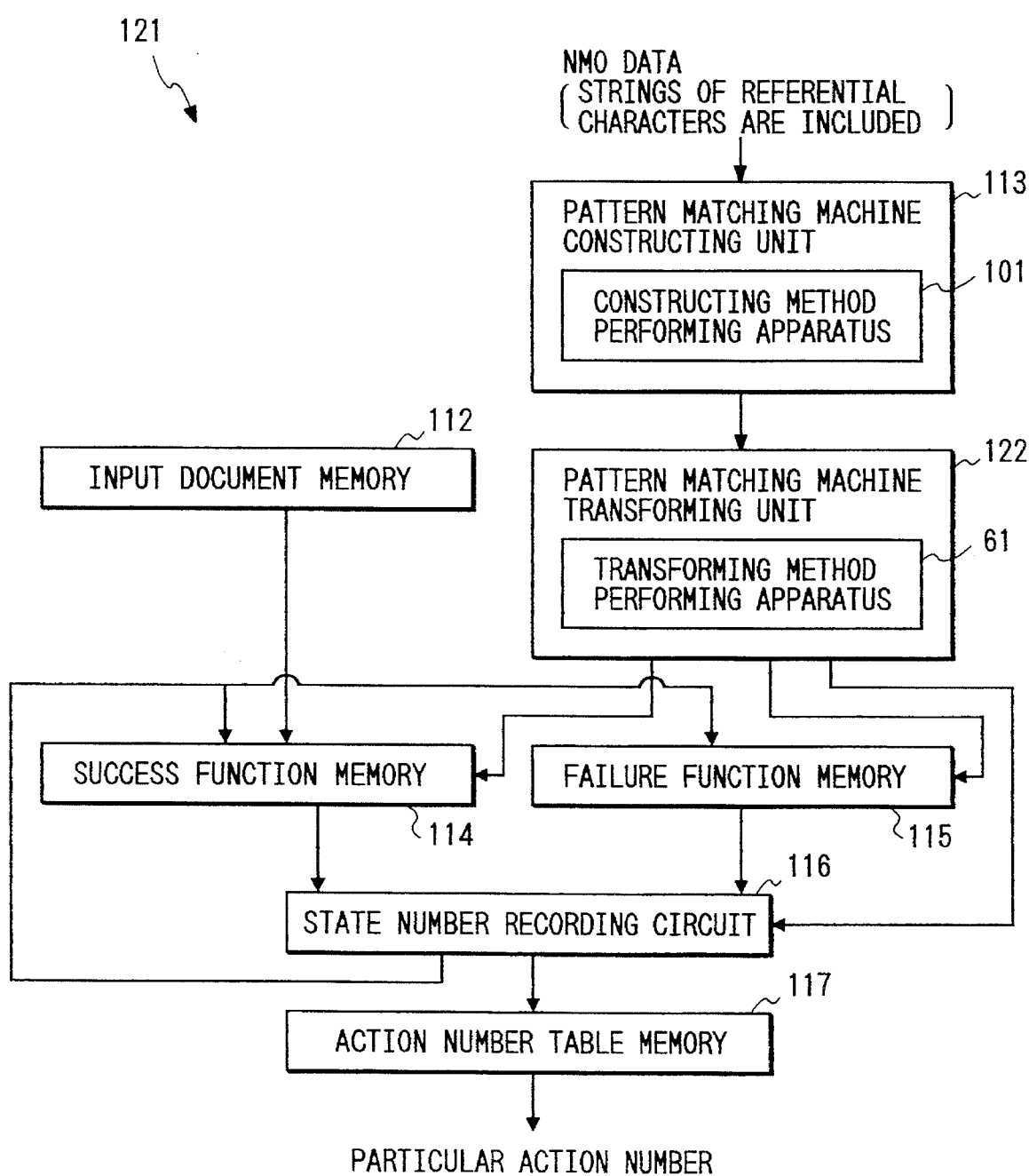
FIG. 35 is a block diagram of a document retrieving apparatus provided in a pattern matching apparatus, in which the first transforming method shown in FIG. 33B for transforming the pattern matching machine constructed according to the third constructing method is utilized, according to a fourth embodiment.

FIG. 35 is a block diagram of a document retrieving apparatus of a pattern matching apparatus, in which the first transforming method performed in the transforming method performing apparatus 61 for transforming the pattern matching machine constructed according to the third constructing method is utilized, according to a fourth embodiment.

As shown in FIG. 35, a document retrieving apparatus 121 comprises the input document memory 112, the pattern matching machine constructing unit 113 having the constructing method performing apparatus 101, the success function memory 114, the failure function memory 115, a pattern matching machine transforming unit 122 having the transforming method performing apparatus 61 for transforming the pattern matching machine FMO into a transformed pattern matching machine FMO by changing the FMO data of the pattern matching machine FMO to pieces of transformed FMO data of the transformed pattern matching machine FMO to change each of the strings of failure transitions to a success transition according to the first transforming method on condition that a storage capacity required to store values of the success function g included in the transformed FMO data is smaller than a fixed storage capacity of the success function memory 114, transferring the values of the success function g to the success function memory 114 and transferring values of the failure function f included in the transformed FMO data to the failure function memory 115, the state number recording circuit 116, and the action number table memory 117.

In the above configuration, the pattern matching machine FMO, for example, shown in FIG. 30 is transferred from the constructing unit 113 to the transforming unit 122. Also, a fixed storage capacity of a memory utilized for storing values of the success function g in the success function memory 114 is informed the transforming unit 122 in advance. In the success function memory 114, each of values of the success function g is stored in a set having three elements of a starting point (or a current state), an ending point (or a next state) and a referential character. Therefore, a storage capacity equivalent to 3 words is consumed in the success function memory 114 each time one value of the success function g is defined in the transforming unit 122. Also, the success function memory 114 has, for example, the fixed storage capacity equivalent to 100 words.

Thereafter, a storage capacity consumed to store the values of the success function g defined in the constructing unit 113 is initially calculated in the transforming unit 122. For example, in cases where the string of referential characters abcd shown in FIG. 6 is input to the constructing unit 113, the number of values of the success function g is summed up to 30 as shown in FIGS. 29 and 30. Therefore, a storage capacity equivalent to 90 words (30×3=90) is consumed in the success function memory 114, and a storage capacity equivalent to 10 words remains. Therefore, the first transforming method is performed in the transforming unit 122.

In the first transforming method, strings of failure transitions are selected one after another in the order placed nearer to an initial state t1 of the pattern matching machine FMO. Therefore, it is initially judged in the transforming unit 122 whether or not a failure transition in which a current state is equivalent to an initial state t1 exists. Because all of state-transitions from the initial state t1 are defined as the success transitions, the first transforming method described in FIGS. 33 and 34 is finished at its first step. Thereafter, a state placed nearest to the initial state t1 is selected. In other words, a state to which the transformed machine FMO reaches from the initial state t1 at the smallest state-transition times is selected. Because there are two states t2 and t3 closest to the initial state t1, the state t2 is, for example, selected.

Because a value g(t2,b) of the success function g for the selected state t1 and the referential character b is defined as shown in FIG. 30, the first transforming method performed for the referential character b is finished at its first step.

In contrast, because values g(t2,a), g(t2,c), g(t2,d) and g(t2,$) of the success function g for the selected state t2 and the referential characters a, c, d and $ are not defined, it is judged that a failure transition FT6 to be changed to one or more success transitions exists. Also, because a value f(t2) of the failure function f at the selected state t2 is t1 and because values g(t1,c), g(t1,d) and g(t1,$) of the success function g are defined, values h=f(f(...(P)...)) is equal to f(t2)=t1. Thereafter, in the third step of the first transforming method, because the values g(t1,c), g(t1,d) and g(t1,$) are t2, values g(<p,r>,c)=g(t2,c), g(t2,d) and g(t2,$) of the success function g for the selected state t2 and the referential characters c, d and $ are defined as follows.

$$g(t2,c)=t2, g(t2,d)=t2, g(t2, \$)=t2$$

Also, because the value f(t2) of the failure function f at the selected state t2 is t1 and because a value g(t1,a) of the success function g is defined, values h=f(f(...f(P)...)) is equal to f(t2)=t1. Thereafter, in the third step of the first transforming method, because the value g(t1,a) is t3, a value g(<p,r>,c)=g(t2,a) of the success function g for the selected state t2 and the referential character a is defined as follows.

$$g(t2,a)=t3$$

Figure 36:
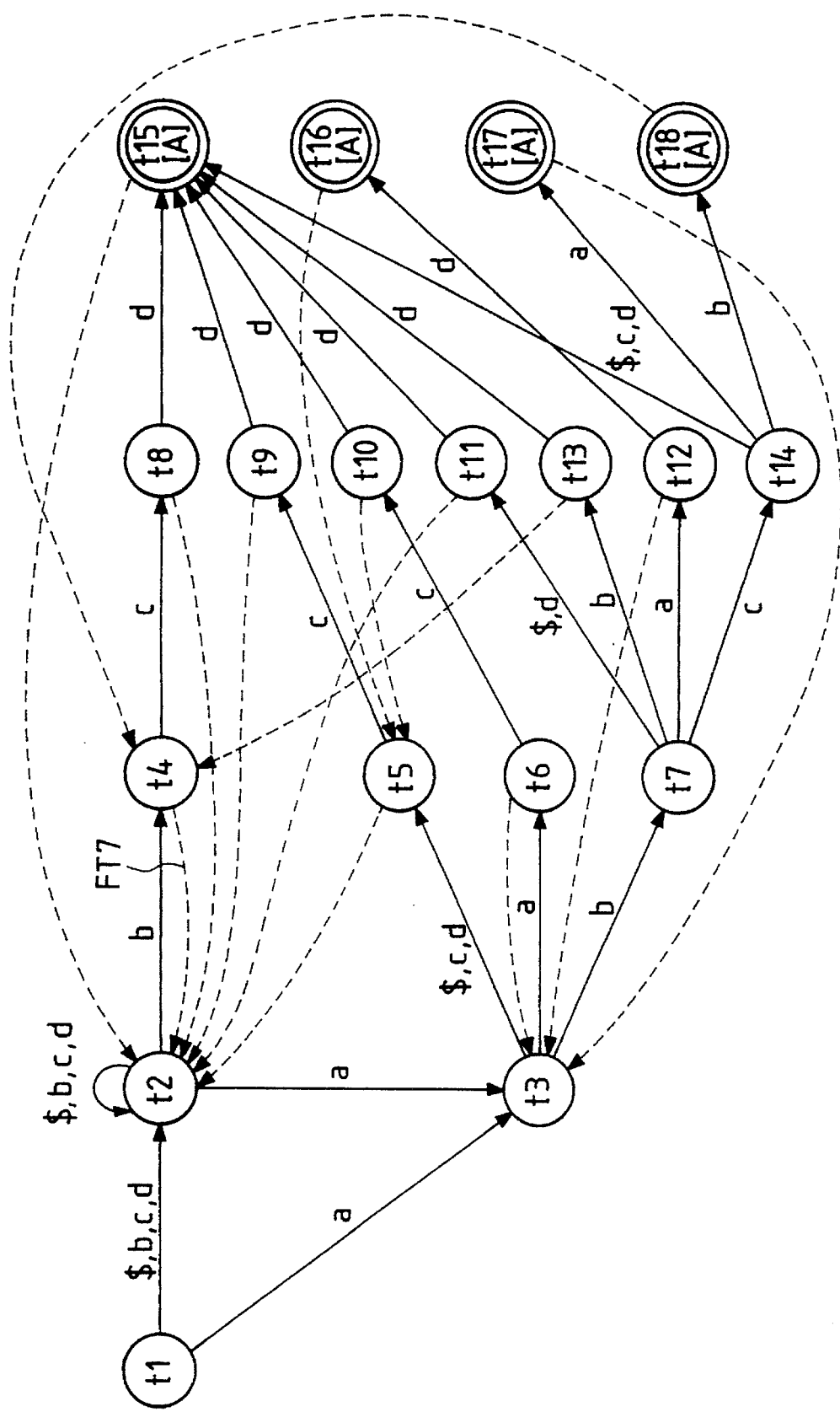
FIG. 36 shows a first-stage transformed pattern matching machine FMO obtained by transforming the pattern matching machine FMO shown in FIG. 30 according to the first transforming method shown in FIG. 33B.

Because the values of the success function g for the selected state t2 and all of the referential characters a,b,c,d and $ are defined, the definition of the value f(t2) of the failure function f is allowed to be cancelled for the purpose of constructing a first-stage transformed pattern matching machine FMO in the fourth step of the first transforming method on condition that a storage capacity required by the first-stage transformed pattern matching machine FMO is equal to or smaller than the fixed storage capacity of the success function memory 114. Because a storage capacity equivalent to 9 words (3*3=9) is additionally consumed in the success function memory 114. Therefore, a storage capacity equivalent to 1 words (10−9=1) still remains in the success function memory 114 even though the pattern matching machine FMO is transformed into the first-stage transformed machine FMO, and the transformation of the pattern matching machine FMO described above is performed to obtain the first-stage transformed pattern matching machine FMO shown in FIG. 36.

Thereafter, the state t3 is, for example, selected because the state t3 is placed nearest to the initial state t1. In this case, because values g(t3,a), g(t3,c), g(t3,d) and g(t3,S) of the success function g for the state t3 and all of the referential characters are defined as shown in FIGS. 29 and 30, the first transforming method performed for each of the referential characters is finished at the first step. That is, the first-stage transformed pattern matching machine FMO is not transformed. Thereafter, one of states t4, t5, t6 and t7 to which the first-stage transformed pattern matching machine FMO reaches in two state-transitions is selected. However, in cases where a failure transition FT7 of the state t4 is changed to a success transition, a storage capacity equivalent to 3 words is additionally required, so that a storage capacity more than the fixed storage capacity is required to transform the first-stage transformed machine FMO. Therefore, the first transforming method is finished.

Thereafter, values of the success function g of the transformed FMO data obtained in the transforming unit 122 are stored to the success function memory 114, values of the failure function f of the transformed FMO data are stored to the failure function memory 115, and action numbers indicating actions A defined as outputs from the states of the transformed pattern matching machine FMO are stored in the action number table memory 117 in connection with state numbers indicating the states. Thereafter, a pattern matching operation is started in the same manner as that in the document retrieving apparatus 111.

Accordingly, because each of the strings of failure transitions is changed to a success transition on condition that a storage capacity required by the transformed FMO data of the transformed pattern matching machine is smaller than the fixed storage capacity of the success function memory 114, the transformed pattern matching machine in which a supreme state-transition operation is statistically performed can be constructed according to the first transforming method within the fixed storage capacity.

Next, a modification of the first transforming method applied for the pattern matching machine FMO is described according to a modification of the fourth embodiment.

Initially, a modified transforming method applied to transform the pattern matching machine FMO constructed according to the third constructing method is described with reference to FIG. 37.

Figure 37A:
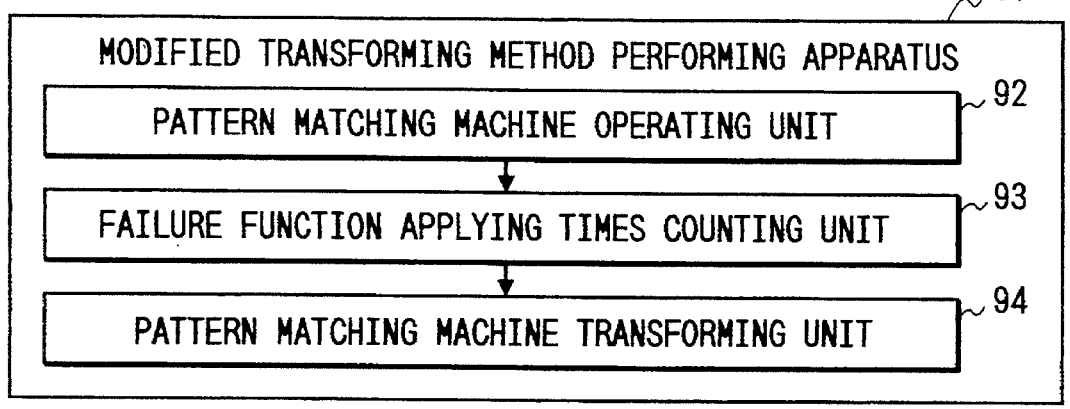
FIG. 37A is a block diagram of a transforming method performing apparatus in which a pattern matching machine constructed according to the third constructing method is transformed according to a modified transforming method.
Figure 37B:
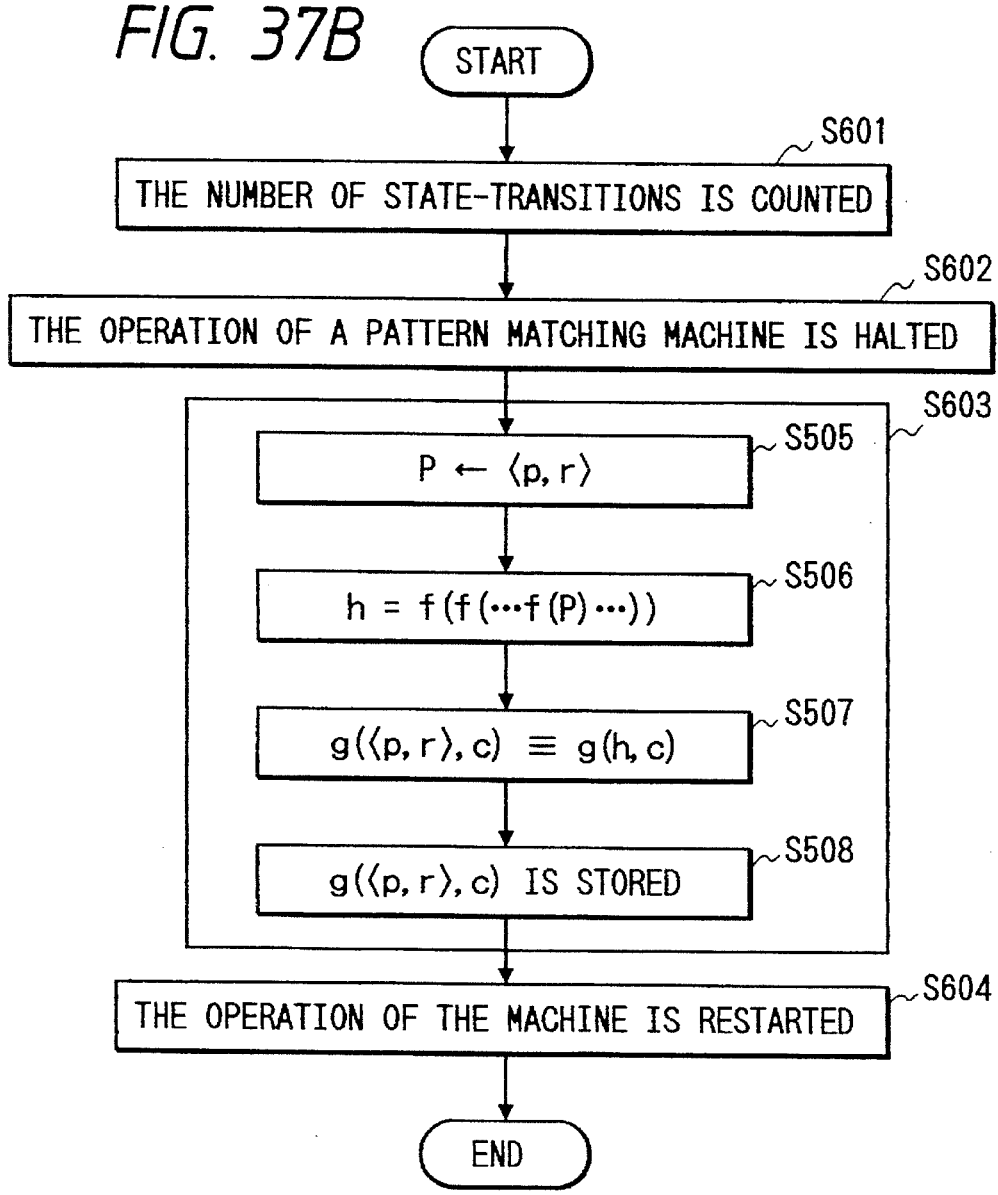
FIG. 37B is a flow chart of the modified transforming method performed in the transforming method performing apparatus shown in FIG. 37A.

FIG. 37A is a block diagram of a transforming method performing apparatus in which a pattern matching machine constructed according to the third constructing method is transformed according to a modified transforming method. FIG. 37B is a flow chart of the modified transforming method performed in the transforming method performing apparatus shown in FIG. 37A.

As shown in FIG. 37A, in eases where the number of state-transitions performed between two states not necessarily adjacent to each other is counted during the operation of the machine FFM to change a string of failure transitions actually performed at a high frequency to a success function in a modified transforming method performing apparatus 91, after the pattern matching machine is constructed according to the third constructing method in the constructing method performing apparatus 31, the pattern matching machine is operated by the action of a pattern matching machine operating unit 92 of the performing apparatus 91. Thereafter, the number of state-transitions performed by applying the failure function f to takes the pattern matching machine from each of current states to each of next states according to each of referential characters is counted in a failure function applying times counting unit 93 for each of the current states and each of the referential characters (S601 shown in FIG. 37B). Thereafter, when the number of state-transitions performed by applying the failure function f to perform a particular failure transition of the pattern matching machine from a particular current state for a particular referential character is summed up to the number of prescribed times, the operation of the pattern matching machine is halted by the action of the pattern matching machine operating unit 92 (S602 shown in FIG. 37B). Thereafter, the particular current state and the particular referential character are informed a pattern matching machine transforming unit 94, and the particular failure transition is changed to a particular success transition for the particular current state and the particular referential character according to the first transforming method to transform the pattern matching machine into a transformed pattern matching machine in the pattern matching machine transforming unit 94 (S603 shown in FIG. 37B). Thereafter, the operation of the transformed pattern matching machine is restarted by the action of the pattern matching machine operating unit 92 (S604 shown in FIG. 37B).

Accordingly, because the pattern matching machine is transformed into the transformed pattern matching machine according to the modified transforming method to be fitted for a particular type of referential characters, the transformed pattern matching machine can be appropriately operated at a high speed for each of types of referential characters.

Figure 38:
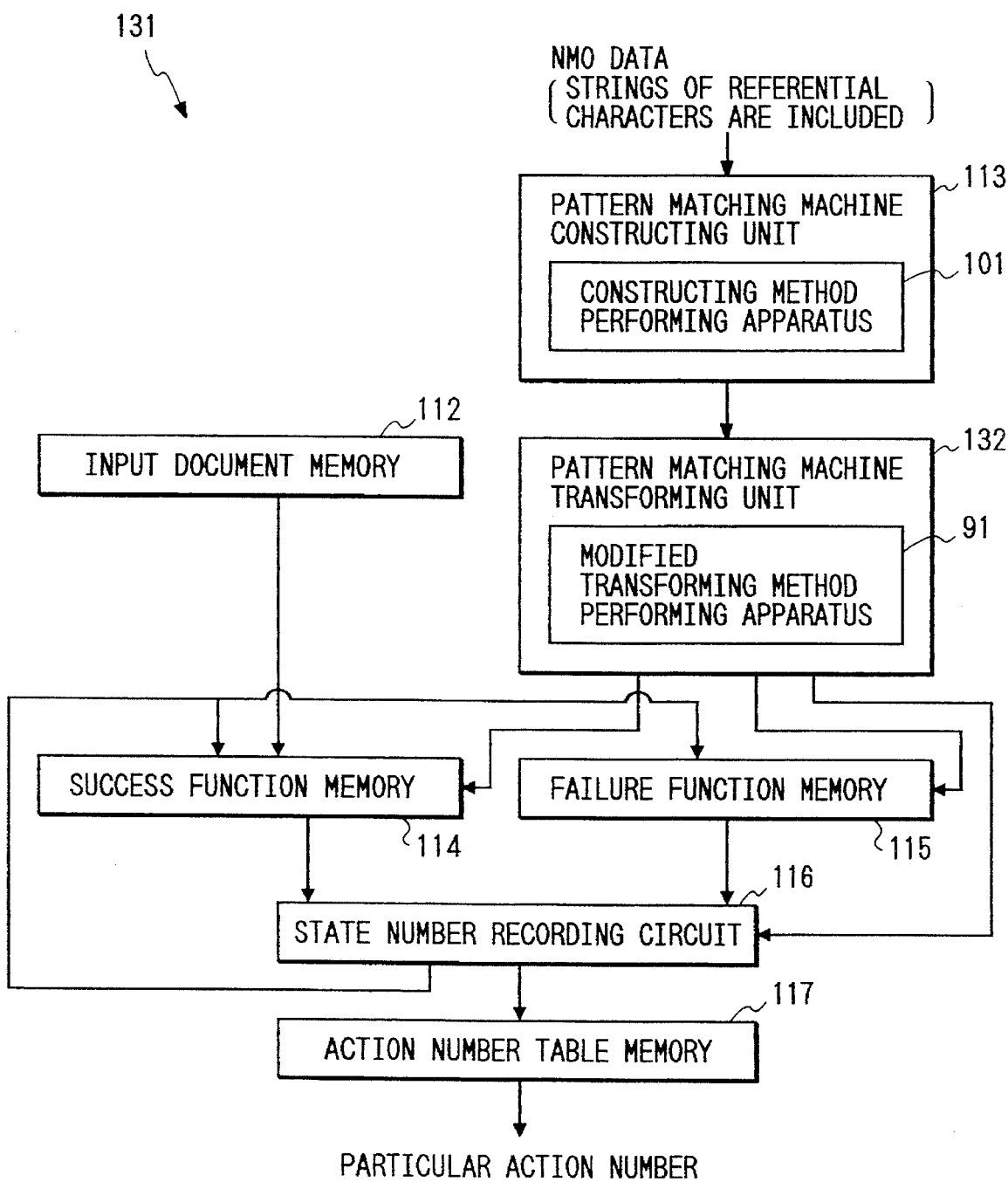
FIG. 38 is a constitutional block diagram of a document retrieving apparatus according to a modification of the fourth embodiment, the pattern matching apparatus constructed according to the third constructing method being transformed according to the modified transforming method shown in FIG. 37B.

FIG. 38 is a constitutional block diagram of a document retrieving apparatus according to the modification of the fourth embodiment, the pattern matching apparatus FMO constructed according to the third constructing method being transformed according to the modified transforming method described in FIG. 37A.

As shown in FIG. 38, a document retrieving apparatus 131 comprises the input document memory 112, the pattern matching machine constructing unit 113 having the constructing method performing apparatus 101, the success function memory 114, the failure function memory 115, a pattern matching machine transforming unit 132 having the modified transforming method performing apparatus 91 for transforming the pattern matching machine FMO into a transformed pattern matching machine FMO by changing the FMO data of the pattern matching machine FMO to pieces of transformed FMO data of the transformed pattern matching machine FMO to change a string of failure transitions to a success transition according to the modified transforming method on condition that a storage capacity required to store values of the success function g included in the transformed FHO data is smaller than a fixed storage capacity of the success function memory 114, transferring the values of the success function g to the success function memory 114 and transferring values of the failure function f included in the transformed FMO data to the failure function memory 115, the state number recording circuit 116, and the action number table memory 117.

The number of transitions changed from the strings of failure transitions to the success transitions in the pattern matching machine transforming unit 132 is determined on condition that the transformed FMO data is stored in the the success function memory 114 having the fixed storage capacity.

Three differences between the modified transforming method and the first transforming method is described.

A first difference is that phased transformations are performed according to the modified transforming method without performing serial transformations according to the first transforming method. A second difference is that a success transition from a current state for a referential character is newly defined and other success transitions from the same current state for other referential characters are not defined according to the modified transforming method. A third difference is that a string of failure transitions performed more than the number of prescribed times is selected according to the modified transforming method to be changed to a success transition.

In the above configuration, the operation of the document retrieving apparatus 131 is described.

A pattern matching operation is initially performed in the document retrieving apparatus 131 for each of remarked characters stored in the input document memory 112 according to the FMO data produced in the constructing unit 113 in the same manner as that in the automatic product inspection system 111 shown in FIG. 27. After many state-transitions of the pattern matching machine FMO, for example, shown in FIG. 30 are performed to collate many remarked characters of the input document with the strings of referential characters input to the constructing unit 113, in cases where a series of state-transitions t1→t2→t4→t4 is performed many times by receiving a string of remarked characters "bbb" many times and the number of state-transitions caused by many strings of remarked characters "bbb" reaches the number of prescribed times, the change of a failure transition from the state t4 to the state t4 selected from the series of state-transitions is performed in the transforming unit 132 to transform the machine FMO into a transformed machine FMO. In other words, a value t4 of the success function g for the state t4 and the remarked character b is additionally defined as follows.

$$g(t4,"b")\equiv t4$$

Thereafter, the value g(t4,"b") of the success function g is stored in the success function memory 114, and a pattern matching operation is performed in the document retrieving apparatus 131 for each of remarked characters stored in the input document memory 112 according to pieces of transformed FMO data of the transformed pattern matching machine produced in the transforming unit 114.

Accordingly, because the state-transition from the state t4 to the state t4 for the remarked character b is performed at a high speed, the pattern matching operation for a string of remarked characters frequently existing in the input document can be appropriately performed at a high speed.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A constructing method of a finite-state machine with failure transitions, comprising the steps of:

preparing a nondeterministic finite-state machine, an external input taking the nondeterministic finite-state machine from a current state to a plurality of next states;

producing a deterministic finite-state machine by utilizing the nondeterministic finite-state machine, an external input taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine;

regarding a combination <p,q> of state sets p and q as states of the deterministic finite-state machine, the state set q being a set of states in the nondeterministic finite-state machine, and the set p being defined as a subset of the state set q;

setting an initial state $s_0$ of the deterministic finite-state machine to a state $<\{q_0\},\{q_0\}>$, $q_0$ denoting an initial state of the nondeterministic finite-state machine;

storing the initial state $s_0<\{q_0\},\{q_0\}>$ to add the initial state $s_0$ to a state set of the deterministic finite-state machine as an element having an unprocessed tag;

setting an output $\mu(s_0)$ of the deterministic finite-state machine at the initial state $s_0$ to be a set $\{\lambda(q_0)\}$ having an output of the nondeterministic finite-state machine at the initial state $q_0$;

storing the output $\mu(s_0)$;

producing a state $<\phi,\phi>$ of the deterministic finite-state machine obtained in case of $q=\phi$;

storing the state $<\phi,\phi>$ to add the state $<\phi,\phi>$ to the state set of the deterministic finite-state machine as an element having a processed tag;

setting a value $\mu(<\phi,\phi>)$ of an output function $\mu$ of the deterministic finite-state machine at the state $<\phi,\phi>$ to be an empty set $\phi$;

storing the value $\mu(<\phi,\phi>)$;

setting values $g(<\phi,\phi>,c)$ of a success function g for arbitrary external inputs c to be the state $<\phi,\phi>$;

storing the values $g(<\phi,\phi>,c)$;

checking whether or not one or more elements respectively having an unprocessed tag exist in the state set of the deterministic finite-state machine;

selecting one of the elements <p,q> respectively having an unprocessed tag from the set of states of the deterministic finite-state machine as a selected element <p,q> in cases where one or more elements <p,q> respectively having an unprocessed tag exist in the set of states of the deterministic finite-state machine;

changing the selected element <p,q> having an unprocessed tag to a selected element <p,q> having a processed tag;

setting one or more values g(<p,q>,c) of the success function g to one or more states <x,y> of the deterministic finite-state machine for first external inputs c which specify a non-empty set of next states $\delta(t,c)$ defined in the nondeterministic finite-state machine according to one of elements t of a state set p of the nondeterministic finite-state machine corresponding to a first component of the selected state <p,q>;

selecting a union $U\delta(t,c)$ of the next states $\delta(t,c)$ of the nondeterministic finite-state machine for the first external inputs c and the elements t of the set p as values of a set y;

selecting the values of the set y or a no-empty subset of the set y as elements of a set x;

storing the values g(<p,q>,c)=<x,y>;

storing the states <x,y> to add the states <x,y> to the state set of the deterministic finite-state machine as elements respectively having an unprocessed tag in cases where the states <x,y> are not stored;

setting a union $U\{\lambda(t)\}$ of outputs $\lambda(t)$ of the nondeterministic finite-state machine for elements t of the set y as output values $\mu(<x,y>)$ of the output function $\mu$ of the deterministic finite-state machine at the states <x,y> in cases where the values $\mu(<x,y>)$ are not defined;

storing the output values $\mu(<x,y>)=U\{\lambda(t)\}$;

setting values f(<p,q>) of a failure function f not depending on any of second external inputs d to states <z,q−p> obtained by combining a difference set q−p defined by removing elements of the subset p from elements of the set q and an arbitrary subset z of the difference set q−p in cases where each of the second external inputs d does not specify any of next states g(<p,q>,d) defined in the nondeterministic finite-state machine for any of elements of the state set p of the selected element <p,q>;

storing the values f(<p,q>)=<z,q−p> stored;

setting a union $U\{\lambda(t)\}$ of outputs $\lambda(t)$ of the nondeterministic finite-state machine for elements t of the difference set q−p to output values $\mu(<z,q-p>)$ of the output function $\mu$ of the deterministic finite-state machine at the states <z,q−p> in cases where the values $\mu(<x,y>)$ of the output function $\mu$ are not defined;

storing the output values $\mu(<z,q-p>)=U\{\lambda(t)\}$;

repeating the steps of checking whether or not one or more elements, selecting one of the elements <p,q>, changing the selected element <p,q>, setting one or more values g(<p,q>,c), selecting a union Uδ(t,c), selecting the values of the set y, storing the values g(<p,q>,c)=<x,y>, storing the states <x,y>, setting a union U{λ(t)}, storing the output values μ(<x,y>), setting values f(<p,q>), storing the values f(<p,q>), setting a union U{λ(t)}, and storing the output values μ(<z,q−p>) until no existence of an element having an unprocessed tag is detected in the step of checking whether or not one or more elements; and defining the deterministic finite-state machine modified in the above steps as a finite-state machine with failure transitions, wherein the number of states <p,q> is finite, an external input c takes the finite-state machine with failure transitions from a current state s to a next state g(s,c) and an output μ(s) is output from the next state g(s,c) in cases where a value g(s,c) of the success function g is defined, and an external input c takes the finite-state machine with failure transitions from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined.

2. A constructing method according to claim 1 in which the step of selecting the values of the set y comprises the steps of:

calculating a union of sets V of next states to which the first external inputs c take the nondeterministic finite-state machine from each state in the set p;

calculating a difference set V−y defined by removing elements of the set y from elements of the set V; and setting the difference set V−y as the value of the set x.

3. A constructing method according to claim 1 in which the pattern expression in the step of preparing a deterministic finite-state machine is a regular expression or a regular transformation.

4. A transforming method of a finite-state machine with failure transitions, comprising the steps of:

preparing a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next stateg g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

selecting an originally remarked state <p,q> of the finite-state machine with failure transitions and a particular external input c, a state set q being a set of states in a nondeterministic finite-state machine, and a set p being defined as a subset of the state set q;

examining whether or not a value g(<p,q>, c) of the success function g for the originally remarked state <p,q> and the particular external input c is defined;

expressing the originally remarked state <p,q> by a symbol P denoting a remarked state in cases where the value g(<p,q>,c) of the success function g is not defined;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions;

defining a value g(<p,q>,c) of the success function g as g(h,c) to determine a next state g(<p,q>,c)=g(h,c) for the originally remarked state <p,q> and the particular external input c;

storing the next state g(<p,q>,c);

repeating the above steps of selecting an originally remarked state, examining whether or not a value, expressing the originally remarked state, obtaining a value h=f(f(...f(P)...)), defining a value g(<p,q>,c) and storing the next state by changing the particular external input to one of external inputs until the next states g(<p,q>,c) for the originally remarked state <p,q> and all of the external inputs are defined and stored; and cancelling the definition of the value f(<p,q>) of the failure function f for the originally remarked state <p,q>.

5. A transforming method according to claim 4 in which the step of selecting an originally remarked state <p,q> includes the steps of:

judging whether or not a storage region Sr required to store values g(<p,q>,c) of the success function g defined in the finite-state machine with failure transitions and values f(<p,q>) of the failure function f defined in the finite-state machine with failure transitions is smaller than a fixed storage region; and preparing the originally remarked state <p,q> on condition that the storage region Sr is smaller than the fixed storage region, and the step of defining a value g(<p,q>,c) of the success function g includes the steps of:

judging whether or not an increased storage region required to additionally store the values g(<p,q>,c) of the success function g for the remarked state <p,q> and all of the external inputs c is smaller than the fixed storage region; and defining the values g(<p,q>,c) of the success function g on condition that the increased storage region is equal to or smaller than the fixed storage region.

6. A transforming method according to claim 4 in which the step of selecting an originally remarked state <p,q> includes the step of:

selecting the originally remarked state <p,q> from the states defined in the finite-state machine with failure transitions in the order placed nearer to an initial state of the finite-state machine with failure transitions.

7. A transforming method of a finite-state machine with failure transitions, comprising the steps of:

preparing a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

counting the number of state-transitions performed by applying the failure function f for each of current states and each of external inputs while operating the finite-state machine with failure transitions, the external inputs taking the finite-state machine with failure transitions from the current states to next states;

halting the operation of the finite-state machine with failure transitions in cases where the number of state-transitions from a particular current state <p,q> to a particular next state f(<p,q>) for a particular external input c reaches a fixed number of times, a state set p being defined as a non-empty subset of a finite state set Q of a nondeterministic finite-state machine, and a set r being defined as a subset of a finite state S of the finite-state machine with failure transitions;

expressing the particular current state <p,q> by a symbol P denoting a remarked state;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions;

defining a value g(<p,q>,c) of the success function g as g(h,c) to determine a next state g(<p,q>,c)=g(h,c) for the particular current state <p,q> and the particular external input c;

storing the next state g(<p,q>,c); and restarting the operation of the finite-state machine with failure transitions.

8. A constructing method of a pattern matching machine for collating strings of external characters written in an input document with one or more strings of referential characters and finding out one or more strings of external characters respectively agreeing with one of the strings of referential characters, comprising the steps of:

preparing a nondeterministic finite-state machine, an external input taking the nondeterministic finite-state machine from a current state to a plurality of next states;

producing a deterministic finite-state machine by utilizing the nondeterministic finite-state machine, an external character taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine;

regarding a combination <p,r> of state sets p and r as states of the deterministic finite-state machine, the state set p being defined as a non-empty subset of a finite state set Q of the nondeterministic finite-state machine, and the state set r being defined as a subset of a finite state S of the deterministic finite-state machine;

setting an initial state $s_0$ of the deterministic finite-state machine to a state <{$q_0$},$s_0$>, $q_0$ denoting an initial state of the nondeterministic finite-state machine;

storing the initial state $s_0$=<{$q_0$},$s_0$> to add the initial state $s_0$ to a state set of the deterministic finite-state machine as an element having an unprocessed tag;

setting an output $\mu(s_0)$ of the deterministic finite-state machine at the initial state $s_0$ to be a set {$\lambda(q_0)$} having an output of the nondeterministic finite-state machine at the initial state $q_0$; storing the output $\mu(s_0)$;

checking whether or not one or more elements respectively having an unprocessed tag exist in the state set of the deterministic finite-state machine;

selecting an element <p,r> first added to the state set of the deterministic finite-state machine from the state set of the deterministic finite-state machine as a selected element in cases where one or more elements <p,r> respectively having an unprocessed tag exist in the state set of the deterministic finite-state machine;

changing the selected element <p,r> having an unprocessed tag to an selected element <p,r> having a processed tag;

selecting the initial state $s_0$ as an element of a set x in case of <p,r>=$s_0$;

repeating a first calculation r(<p,r>) for taking out a second component r of the selected state <p,r> one or more times until values g(.,c)=g(r(r(...r(<p,r>)...)),c) of a success function g are defined to obtain a state u=r(r(...r(<p,r>)...)) and selecting values g(u,c) of the success function g for the state u and first referential characters c as values of a set x in case of <p,r>≠$s_0$, the first referential characters c specifying a no-empty set of next states δ(t,c) defined in the nondeterministic finite-state machine according to one of elements t of a state set p of the nondeterministic finite-state machine which corresponds to a first component of the selected state <p,r>;

calculating a first union Uδ(t,c) of next states δ(t,c) of the nondeterministic finite-state machine for elements t of the state set p and the first referential characters c;

calculating a second union p(x)Up(r(x))Up(r(r(x)))U—Up(r(r(...r(x)...))) of a string of sets p(x),p(r(x)), p(r(r(x))), - - - ,p(r(r(...r(x)...))) obtained by applying a second calculation for taking out a first component p of the selected state <p,r> of the deterministic finite-state machine after the first calculation r(x) is repeated a zero time or more;

selecting difference sets Uδ(t,c)–p(x)Up(r(x))U-p(r(r(x)))U—Up(r(r(...r(x)...))) of the first and second unions for the first referential characters c as values of a set y;

setting one or more values g(<p,r>,c) of the success function g for the selected element <p,r> denoting a current state and the first referential characters c to elements of the set x in cases where the set y is the empty set;

setting the values g(<p,r>,c) of the success function g to the states <y,x> in cases where the set y is not the empty set;

storing the values g(<p,r>,c) of the success function g to add the values g(<p,r>,c) to the state set of the deterministic finite-state machine as elements respectively having an unprocessed tag in cases where the values g(<p,r>,c) are not stored;

calculating a third union U{δ(z,c)} of next states δ(z,c) in the nondeterministic finite-state machine for elements z of a state set p of the nondeterministic finite-state machine corresponding to a first component of the selected element <p,r> and the first referential characters c;

setting output values μ(g(<p,r>,c)) of an output function of the deterministic finite-state machine at the states g(<p,r>,c) to a fourth union U{λ(t)} of values λ(t) of an output function λ of the nondeterministic finite-state machine for elements t of the third union U{δ(z,c)};

storing the output values μ(g(<p,r>,c))=U{λ(t)};

setting values f(g(<p,r>,c)) of the failure function f at the states g(<p,r>,c) to elements of a state set r of the nondeterministic finite-state machine corresponding to a second component of the selected element <p,r> in cases where one or more second referential characters c which specify next states δ(t,c) defined in the nondeterministic finite-state machine according to one of elements t of a state set p of the nondeterministic finite-state machine corresponding to a first component of the selected element <p,r> exist;

storing the values f(g(<p,r>,c))=r;

repeating the steps of checking whether or not one or more elements, selecting an element <p,r>, changing the selected element, selecting the initial states, repeating a first calculation, calculating a first union, calculating a second union, selecting difference sets, setting one or more values, setting the values g(<p,r>,c), storing the values g(<p,r>,c), calculating a third union, setting output values, storing the output values, and setting values f(g(<p,r>,c)), storing the values f(g(<p,r>,c)) until no existence of an element having an unprocessed tag is detected in the step of checking whether or not one or more elements; and defining the deterministic finite-state machine modified in the above steps as a pattern matching machine, wherein the number of states <p,r> is finite, a referential character c takes the pattern matching machine from a current state s to a next state g(s,c) and an output μ(s) is output from the next state g(s,c) in cases where a value g(s,c) of the success function g is defined, and a referential character c takes the pattern matching machine from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined.

9. A constructing method according to claim 8 in which the pattern expression in the step of preparing a deterministic finite-state machine is a regular expression or a regular transformation.

10. A transforming method of a pattern matching machine for collating strings of external characters written in an input document with one or more strings of referential characters and finding out one or more strings of external characters respectively agreeing with one of the strings of referential characters, comprising the steps of:

preparing a pattern matching machine in which the number of states <p,r> is finite, a referential character c takes the pattern matching machine from a current state s to a next state g(s,c) and an output μ(s) is output from the next state g(s,c) in cases where a value g(s,c) of a success function g is defined, and a referential character c takes the pattern matching machine from the current state s to a next state h=f(f(...f(s)...)) determined by repeating a process that a value f(s) of a failure function f is calculated and the value f(s) is rewritten to the symbol s until a value g(h,c) of the success function g is defined in cases where a value g(s,c) of the success function g is not defined;

selecting an originally remarked state <p,r> of the pattern matching machine and a particular referential character c, a state set p being defined as a non-empty subset of a finite state set Q of a nondeterministic finite-state machine, and a set r being defined as a subset of a finite state S of the pattern matching machine;

examining whether or not a value g(<p,r>, c) of the success function g for the originally remarked state <p,r> and the particular referential character c is defined;

expressing the originally remarked state <p,r> by a symbol P denoting a remarked state in cases where the value g(<p,r>,c) of the success function g is not defined;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine;

defining a value g(<p,r>,c) of the success function g as g(h,c) to determine a next state g(<p,r>,c)=g(h,c) for the originally remarked state <p,r> and the particular referential character c;

storing the next state g(<p,r>,c);

repeating the above steps of selecting an originally remarked state, examining whether or not a value, expressing the originally remarked state, obtaining a value h=f(f(...f(P)...)), defining a value g(<p,r>,c) and storing the next state by changing the particular referential character to one of referential characters until the next states g(<p,r>,c) for the originally remarked state <p,r> and all of the referential characters are defined and stored; and cancelling the definition of the value f(<p,r>) of the failure function f for the originally remarked state <p,r>.

11. A transforming method according to claim 10 in which the step of selecting an originally remarked state <p,r> includes the steps of:

judging whether or not a storage region Sr required to store values g(<p,r>,c) of the success function g defined in the pattern matching machine and values f(<p,r>) of the failure function f defined in the pattern matching machine is smaller than a fixed storage region; and preparing the originally remarked state <p,r> on condition that the storage region Sr is smaller than the fixed storage region, and the step of defining a value g(<p,r>,c) of the success function g includes the steps of:

judging whether or not an increased storage region required to additionally store the values g(<p,r>,c) of the success function g for the remarked state <p,r> and all of the referential characters c is smaller than the fixed storage region; and defining the values g(<p,r>,c) of the success function g on condition that the increased storage region is equal to or smaller than the fixed storage region.

12. A transforming method according to claim 10 in which the step of selecting an originally remarked state <p,r> includes the step of:

selecting the originally remarked state <p,r> from the states defined in the pattern matching machine in the order placed nearer to an initial state of the pattern matching machine.

13. A transforming method of a pattern matching machine for collating strings of external characters written in an input document with one or more strings of referential characters and finding out one or more strings of external characters respectively agreeing with one of the strings of referential characters, comprising the steps of:

preparing a pattern matching machine in which the number of states <p,r> is finite, a referential characters c takes the pattern matching machine from a current state s to a next state g(s,c) and an output μ(s) is output from the next state g(s,c) in cases where a value g(s,c) of a success function g is defined, and a referential characters c takes the pattern matching machine from the current state s to a next state g(h,c) (where h=f(f(...f(s)...))) determined by repeating a process that a value f(s) of a failure function f is calculated and the value f(s) is rewritten to the symbol s until a value g(h,c) of the success function g is defined in cases where a value g(s,c) of the success function g is not defined;

counting the number of state-transitions performed by applying the failure function f for each of current states and each of referential characters while operating the pattern matching machine, the referential characters taking the pattern matching machine from the current states to next states;

halting the operation of the pattern matching machine in cases where the number of state-transitions from a particular current state <p,r> to a particular next state f(<p,r>) for a particular referential characters c reaches a fixed number of times, a state set p being defined as a non-empty subset of a finite state set Q of a nondeterministic finite-state machine, and a set r being defined as a subset of a finite state S of the pattern matching machine;

expressing the particular current state <p,r> by a symbol P denoting a remarked state;

obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine;

defining a value g(<p,r>,c) of the success function g as g(h,c) to determine a next state g(<p,r>,c)=g(h,c) for the particular current state <p,r> and the particular referential characters c;

storing the next state g(<p,r>,c); and restarting the operation of the pattern matching machine.

14. An automatic product inspection system, comprising:

finite-state machine with failure transitions constructing means for constructing a finite-state machine with failure transitions from a nondeterministic finite-state machine according to a constructing method, the constructing method comprising the steps of preparing the nondeterministic finite-state machine, an external input taking the nondeterministic finite-state machine from a current state to a plurality of next states, producing a deterministic finite-state machine by utilizing the nondeterministic finite-state machine, an external input taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine, regarding a combination <p,q> of state sets p and q as states of the deterministic finite-state machine, the state set q being a set of states in the nondeterministic finite-state machine, and the set p being defined as a subset of the state set q, setting an initial state $s_0$ of the deterministic finite-state machine to a state <{$q_0$},{$q_0$}>, $q_0$ denoting an initial state of the nondeterministic finite-state machine, storing the initial state $s_0$=<{$q_0$},{$q_0$}> to add the initial state $s_0$ to a state set of the deterministic finite-state machine as an element having an unprocessed tag, setting an output μ($s_0$) of the deterministic finite-state machine at the initial state $s_0$ to be a set {λ($q_0$)) having an output of the nondeterministic finite-state machine at the initial state $q_0$, storing the output μ($s_0$), producing a state <φ,φ> of the deterministic finite-state machine obtained in case of q=φ, storing the state <φ,φ> to add the state <φ,φ> to the state set of the deterministic finite-state machine as an element having a processed tag, setting a value μ(<φ,φ>) of an output function μ of the deterministic finite-state machine at the state <φ,φ> to be an empty set φ, storing the value μ(<φ,φ>), setting values g(<φ,φ>,c) of a success function g for arbitrary external inputs c to be the state <φ,φ>, storing the values g(<φ,φ>,c), checking whether or not one or more elements respectively having an unprocessed tag exist in the state set of the deterministic finite-state machine, selecting one of the elements <p,q> respectively having an unprocessed tag from the set of states of the deterministic finite-state machine as a selected element <p,q> in cases where one or more elements <p,q> respectively having an unprocessed tag exist in the set of states of the deterministic finite-state machine, changing the selected element <p,q> having an unprocessed tag to a selected element <p,q> having a processed tag, setting one or more values g(<p,q>,c) of the success function g to one or more states <x,y> of the deterministic finite-state machine for first external inputs c which specify a non-empty set of next states δ(t,c) defined in the nondeterministic finite-state machine according to one of elements t of a state set p of the nondeterministic finite-state machine corresponding to a first component of the selected state <p,q>, selecting a union Uδ(t,c) of the next states δ(t,c) of the nondeterministic finite-state machine for the first external inputs c and the elements t of the set p as values of a set y, selecting the values of the set y or a no-empty subset of the set y as elements of a set x, storing the values g(<p,q>,c)=<x,y>, storing the states <x,y> to add the states <x,y> to the state set of the deterministic finite-state machine as elements respectively having an unprocessed tag in cases where the states <x,y> are not stored, setting a union U{λ(t)} of outputs λ(t) of the nondeterministic finite-state machine for elements t of the set y as output values μ(<x,y>) of the output function μ of the deterministic finite-state machine at the states <x,y> in cases where the values μ(<x,y>) are not defined, storing the output values μ(<x,y>)=U{λ(t)}, setting values f(<p,q>) of a failure function f not depending on any of second external inputs d to states <z,q–p> obtained by combining a difference set q–p defined by removing elements of the subset p from elements of the set q and an arbitrary subset z of the difference set q–p in cases where each of the second external inputs d does not specify any of next states g(<p,q>,d) defined in the nondeterministic finite-state machine for any of elements of the state set p of the selected element <p,q>, storing the values f(<p,q>)=<z,q–p> stored, setting a union U{λ(t)} of outputs λ(t) of the nondeterministic finite-state machine for elements t of the difference set q–p to output values μ(<z,q–p>) of the output function μ of the deterministic finite-state machine at the states <z,q–p> in cases where the values μ(<x,y>) of the output function μ are not defined, storing the output values μ(<z,q–p>)=U{λ(t)}, repeating the steps of checking whether or not one or more elements, selecting one of the elements <p,q>, changing the selected element <p,q>, setting one or more values g(<p,q>,c), selecting a union Uδ(t,c), selecting the values of the set y, storing the values g(<p,q>,c)=<x,y>, storing the states <x,y>, setting a union U{λ(t)}, storing the output values μ(<x,y>), setting values f(<p,q>), storing the values f(<p,q>), setting a union U{λ(t)}, and storing the output values μ(<z,q–p>) until no existence of an element having an unprocessed tag is detected in the step of checking whether or not one or more elements, and defining the deterministic finite-state machine modified in the above steps as a finite-state machine with failure transitions, wherein the number of states <p,q> is finite, an external input c takes the finite-state machine with failure transitions from a current state s to a next state g(s,c) and an output μ(s) is output from the next state g(s,c) in cases where a value g(s,c) of the success function g is defined, and an external input c takes the finite-state machine with failure transitions from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions constructed in the finite-state machine with failure transitions constructing means by utilizing the string of inspecting values Iv produced in the detecting means, each of the inspecting values Iv taking the finite-state machine with failure transitions from a current state s to a next state g(s,Iv) and an output μ(s) being output from the next state g(s,Iv) in cases where a value g(s,Iv) of the success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs μ(s) produced in the control means.

15. An automatic product inspection system, comprising:

finite-state machine with failure transitions transforming means for transforming, according to a transforming method, a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined, the transforming method comprising the steps of selecting an originally remarked state <p,q> of the finite-state machine with failure transitions and a particular external input c, a state set q being a set of states in a nondeterministic finite-state machine, and a set p being defined as a subset of the state set q, examining whether or not a value g(<p,q>, c) of the success function g for the originally remarked state <p,q> and the particular external input c is defined, expressing the originally remarked state <p,q> by a symbol P denoting a remarked state in cases where the value g(<p,q>,c) of the success function g is not defined, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions, defining a value g(<p,q>,c) of the success function g as g(h,c) to determine a next state g(<p,q>,c)=g(h,c) for the originally remarked state <p,q> and the particular external input c, storing the next state g(<p,q>,c), repeating the above steps of selecting an originally remarked state, examining whether or not a value, expressing the originally remarked state, obtaining a value h=f(f(...f(P)...)), defining a value g(<p,q>,c) and storing the next state by changing the particular external input to one of external inputs until the next states g(<p,q>,c) for the originally remarked state <p,q> and all of the external inputs are defined and stored, and cancelling the definition of the value f(<p,q>) of the failure function f for the originally remarked state <p,q>;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions transformed in the finite-state machine with failure transitions transforming means by utilizing the string of inspecting values Iv produced in the detecting means, each of the inspecting values Iv taking the finite-state machine with failure transitions from a current state s to a next state g(s,Iv) and an output μ(s) being output from the next state g(s,Iv) in cases where a value g(s,Iv) of the success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs μ(s) produced in the control means.

16. A system according to claim 15 in which the step of selecting an originally remarked state <p,q> in the finite-state machine with failure transitions transforming means includes the steps of:

judging whether or not a storage region Sr required to store values g(<p,q>,c) of the success function g defined in the finite-state machine with failure transitions and values f(<p,q>) of the failure function f defined in the finite-state machine with failure transitions is smaller than a fixed storage region; and preparing the originally remarked state <p,q> on condition that the storage region Sr is smaller than the fixed storage region, and the step of defining a value g(<p,q>,c) of the success function g includes the steps of:

judging whether or not an increased storage region required to additionally store the values g(<p,q>,c) of the success function g for the remarked state <p,q> and all of the external inputs c is smaller than the fixed storage region; and defining the values g(<p,q>,c) of the success function g on condition that the increased storage region is equal to or smaller than the fixed storage region.

17. An automatic product inspection system, comprising:

finite-state machine with failure transitions transforming means for transforming, according to a transforming method, a finite-state machine with failure transitions in which the number of states <p,q> is finite, an external input c takes the finite-state machine with failure transitions from a current state s to a next state g(s,c) and an output μ(s) is output from the next state g(s,c) in cases where a value g(s,c) of a success function g is defined, and an external input c takes the finite-state machine with failure transitions from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined, the transforming method comprising the steps of counting the number of state-transitions performed by applying the failure function f for each of current states and each of external inputs while operating the finite-state machine with failure transitions, the external inputs taking the finite-state machine with failure transitions from the current states to next states, halting the operation of the finite-state machine with failure transitions in cases where the number of state-transitions from a particular current state <p,q> to a particular next state f(<p,q>) for a particular external input c reaches a fixed number of times, a state set p being defined as a non-empty subset of a finite state set Q of a nondeterministic finite-state machine, and a set r being defined as a subset of a finite state S of the finite-state machine with failure transitions, expressing the particular current state <p,q> by a symbol P denoting a remarked state, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the finite-state machine with failure transitions, defining a value g(<p,q>,c) of the success function g as g(h,c) to determine a next state g(<p,q>,c)=g(h,c) for the particular current state <p,q> and the particular external input c, storing the next state g(<p,q>,c), and restarting the operation of the finite-state machine with failure transitions;

detecting means for detecting a plurality of types of features of a product at one time every prescribed time and outputting time-sequentially a string of inspecting values Iv, each of the inspecting values Iv indicating particular types of features of the product detected at one time;

control means for performing state-transitions of the finite-state machine with failure transitions transformed in the finite-state machine with failure transitions transforming means by utilizing the string of inspecting values Iv produced in the detecting means, each of the inspecting values Iv taking the finite-state machine with failure transitions from a current state s to a next state g(s,Iv) and an output μ(s) being output from the next state g(s,Iv) in cases where a value g(s,Iv) of tile success function g is defined, and each of the inspecting values Iv taking the finite-state machine with failure transitions from the current state s to a next state f(s) determined by a value f(s) of the failure function f in cases where the value g(s,Iv) of the success function g is not defined; and action means for processing the product according to the outputs μ(s) produced in the control means.

18. A document retrieving apparatus for collating strings of external characters written in an input document with one or more strings of referential characters and finding out one or more strings of external characters respectively agreeing with one of the strings of referential characters, comprising:

pattern matching machine constructing means for constructing a pattern matching machine from a nondeterministic finite-state machine according to a constructing method, the constructing method comprising the steps of preparing the nondeterministic finite-state machine, an external input taking the nondeterministic finite-state machine from a current state to a plurality of next states, producing a deterministic finite-state machine by utilizing the nondeterministic finite-state machine, an external character taking the deterministic finite-state machine from a current state to a next state and specifying an output at the next state, a form for specifying the next state and the output in the deterministic finite-state machine being the same as that in the nondeterministic finite-state machine or being expressed according to a pattern expression in which the form is equivalent to that in the nondeterministic finite-state machine and is convertible into that in the nondeterministic finite-state machine, regarding a combination $<p,r>$ of state sets p and r as states of the deterministic finite-state machine, the state set p being defined as a non-empty subset of a finite state set Q of the nondeterministic finite-state machine, and the state set r being defined as a subset of a finite state S of the deterministic finite-state machine, setting an initial state $s_0$ of the deterministic finite-state machine to a state $<\{q_0\},s_0>$, $q_0$ denoting an initial state of the nondeterministic finite-state machine, storing the initial state $s_0=<(q_0),s_0>$ to add the initial state $s_0$ to a state set of the deterministic finite-state machine as an element having an unprocessed tag, setting an output $\mu(s_0)$ of the deterministic finite-state machine at the initial state $s_0$ to be a set $\{\lambda(q_0)\}$ having an output of the nondeterministic finite-state machine at the initial state $q_0$, storing the output $\mu(s_0)$, checking whether or not one or more elements respectively having an unprocessed tag exist in the state set of the deterministic finite-state machine, selecting an element $<p,r>$ first added to the state set of the deterministic finite-state machine from the state set of the deterministic finite-state machine as a selected element in cases where one or more elements $<p,r>$ respectively having an unprocessed tag exist in the state set of the deterministic finite-state machine, changing the selected element $<p,r>$ having an unprocessed tag to an selected element $<p,r>$ having a processed tag, selecting the initial state $s_0$ as an element of a set x in case of $<p,r>=s_0$, repeating a first calculation $r(<p,r>)$ for taking out a second component r of the selected state $<p,r>$ one or more times until values $g(.,c)=g(r(r(...r(<p,r>)...)),c)$ of a success function g are defined to obtain a state $u=r(r(...r(<p,r>)...))$ and selecting values $g(u,c)$ of the success function g for the state u and first referential characters c as values of a set x in case of $<p,r> \neq s_0$, the first referential characters c specifying a no-empty set of next states $\delta(t,c)$ defined in the nondeterministic finite-state machine according to one of elements t of a state set p of the nondeterministic finite-state machine which corresponds to a first component of the selected state $<p,r>$, calculating a first union $U\delta(t,c)$ of next states $\delta(t,c)$ of the nondeterministic finite-state machine for elements t of the state set p and the first referential characters c;

calculating a second union $p(x)Up(r(x))Up(r(r(x)))U—Up(r(r(...r(x)...)))$ of a string of sets $p(x),p(r(x)),p(r(r(x))), - - - ,p(r(r(...r(x)...)))$ obtained by applying a second calculation for taking out a first component p of the selected state $<p,r>$ of the deterministic finite-state machine after the first calculation r(x) is repeated a zero time or more, selecting difference sets $U\delta(t,c)-p(x)Up(r(x))U-p(r(r(x)))U—Up(r(r(...r(x)...)))$ of the first and second unions for the first referential characters c as values of a set y, setting one or more values $g(<p,r>,c)$ of the success function g for the selected element $<p,r>$ denoting a current state and the first referential characters c to elements of the set x in cases where the set y is the empty set, setting the values $g(<p,r>,c)$ of the success function g to the states $<y,x>$ in cases where the set y is not the empty set, storing the values $g(<p,r>,c)$ of the success function g to add the values $g(<p,r>,c)$ to the state set of the deterministic finite-state machine as elements respectively having an unprocessed tag in cases where the values $g(<p,r>,c)$ are not stored, calculating a third union $U\{\delta(z,c)\}$ of next states $\delta(z,c)$ in the nondeterministic finite-state machine for elements z of a state set p of the nondeterministic finite-state machine corresponding to a first component of the selected element $<p,r>$ and the first referential characters c, setting output values $\mu(g(<p,r>,c))$ of an output function $\mu$ of the deterministic finite-state machine at the states $g(<p,r>,c)$ to a fourth union $U\{\lambda(t)\}$ of values $\lambda(t)$ of an output function $\lambda$ of the nondeterministic finite-state machine for elements t of the third union $U\{\delta(z,c)\}$, storing the output values $\mu(g(<p,r>,c))=U\{\lambda(t)\}$, setting values $f(g(<p,r>,c))$ of the failure function f at the states $g(<p,r>,c)$ to elements of a state set r of the nondeterministic finite-state machine corresponding to a second component of the selected element $<p,r>$ in cases where one or more second referential characters c which specify next states $\delta(t,c)$ defined in the nondeterministic finite-state machine according to one of elements t of a state set p of the nondeterministic finite-state machine corresponding to a first component of the selected element $<p,r>$ exist, storing the values $f(g(<p,r>,c))=r$, repeating the steps of checking whether or not one or more elements, selecting an element $<p,r>$, changing the selected element, selecting the initial states, repeating a first calculation, calculating a first union, calculating a second union, selecting difference sets, setting one or more values, setting the values $g(<p,r>,c)$, storing the values $g(<p,r>,c)$, calculating a third union, setting output values, storing the output values, and setting values $f(g(<p,r>,c))$, storing the values $f(g(<p,r>,c))$ until no existence of an element having an unprocessed tag is detected in the step of checking whether or not one or more elements, and defining the deterministic finite-state machine modified in the above steps as the pattern matching machine, wherein the number of states $<p,r>$ is finite, a referential character c takes the pattern matching machine from a current state s to a next state g(s,c) and an output $\mu(s)$ is output from the next state g(s,c) in cases where a value g(s,c) of the success function g is defined, and a referential character c takes the pattern matching machine from a current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where a value g(s,c) of the success function g is not defined;

input document storing means for storing a plurality of strings of external characters written in an input document and outputting time-sequentially remarked characters Cr selected from the external characters one by one;

success function storing means for storing values of the success function g defined in the pattern matching machine constructing means;

failure function storing means for storing values of the failure function g defined in the pattern matching machine constructing means;

state recording means for recording a particular state g(t1,Cr) denoting a next state in cases where a value g(t1,Cr) of the success function g for a current state t1 of the pattern matching machine and a remarked character Cr output from the input document storing means is defined in the success function storing means, and recording a particular state g(h,Cr) (where h=f(f(...f(t1)...))) as a next state determined by repeating a process that a value f(t1) of the failure function f is calculated and the value f(t1) is rewritten to the symbol t1 newly defined until a value g(h,Cr) of the success function defined is found out in the success function storing means in cases where a value g(t1,Cr) of the success function g for a current state t1 of the pattern matching machine and a remarked character Cr output from the input document storing means is not defined in the success function storing means; and action storing means for storing actions denoting outputs at the states of the pattern matching machine produced in the pattern matching machine constructing means and outputting particular actions corresponding to particular states St time-sequentially transferred from the state recording means, the particular actions being used to judge whether or not a string of remarked characters Cr relating to the particular states St is pattern-matched with one of the strings of referential characters.

19. A document retrieving apparatus for collating strings of external characters written in an input document with one or more strings of referential characters and finding out one or more strings of external characters respectively agreeing with one of the strings of referential characters, comprising:

pattern matching machine transforming means for transforming, according to a transforming method, a pattern matching machine in which the number of states <p,r> is finite, a referential character c takes the pattern matching machine from a current state s to a next state g(s,c) and an output μ(s) is output from the next state g(s,c) in cases where a value g(s,c) of a success function g is defined, and a referential character c takes the pattern matching machine from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where the value g(s,c) of the success function g is not defined, the transforming method comprising the steps of selecting an originally remarked state <p,r> of the pattern matching machine and a particular referential character c, a state set p being defined as a non-empty subset of a finite state set Q of a nondeterministic finite-state machine, and a set r being defined as a subset of a finite state S of the pattern matching machine, examining whether or not a value g(<p,r>, c) of the success function g for the originally remarked state <p,r> and the particular referential character c is defined, expressing the originally remarked state <p,r> by a symbol P denoting a remarked state in cases where the value g(<p,r>,c) of the success function g is not defined, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine, defining a value g(<p,r>,c) of the success function g as g(h,c) to determine a next state g(<p,r>,c)=g(h,c) for the originally remarked state <p,r> and the particular referential character c, storing the next state g(<p,r>,c), repeating the above steps of selecting an originally remarked state, examining whether or not a value, expressing the originally remarked state, obtaining a value h=f(f(...f(P)...)), defining a value g(<p,r>,c) and storing the next state by changing the particular referential character to one of referential characters until the next states g(<p,r>,c) for the originally remarked state <p,r> and all of the referential characters are defined and stored, and cancelling the definition of the value f(<p,r>) of the failure function f for the originally remarked state <p,r>;

input document storing means for storing a plurality of strings of external characters written in an input document and outputting time-sequentially remarked characters Cr selected from the external characters one by one;

success function storing means for storing values of the success function g defined in the pattern matching machine transforming means;

failure function storing means for storing values of the failure function g defined in the pattern matching machine transforming means;

state recording means for recording a particular state St=g(t1,Cr) denoting a next state in cases where a value g(t1,Cr) of the success function g for a current state t1 of the pattern matching machine and a remarked character Cr output from the input document storing means is defined in the success function storing means, and recording a particular state St=g(f(f(...f(t1)...)),Cr) denoting a next state in cases where a value g(t1,Cr) of the success function g for a current state t1 of the pattern matching machine and a remarked character Cr output from the input document storing means is not defined in the success function storing means, a value f(f(...f(t1)...)) being obtained by repeatedly finding out a value f(P) of the failure function g for a calculated result P while rewriting the value f(P) to the calculated result P in the failure function storing means until a value g(f(f(...f(t1)...)),Cr) of the success function g for the value f(f(...f(t1)...)) is found out in the success function storing means, and the value g(f(f(...f(t1)...)), Cr) found out in the success function storing means being transferred to the state recording means; and action storing means for storing actions denoting outputs at the states of the pattern matching machine produced in the pattern matching machine constructing means and outputting particular actions corresponding to particular states St time-sequentially transferred from the state recording means, the particular actions being used to judge whether or not a string of remarked characters Cr relating to the particular states St is pattern-matched with one of the strings of referential characters.

20. A system according to claim 19 in which the step of selecting an originally remarked state <p,r> in the pattern matching machine transforming means includes the steps of:

judging whether or not a storage region Sr required to store values g(<p,r>,c) of the success function g defined in the pattern matching machine and values f(<p,r>) of the failure function f defined in the pattern matching machine is smaller than a fixed storage region; and preparing the originally remarked state <p,r> on condition that the storage region Sr is smaller than the fixed storage region, and the step of defining a value g(<p,r>,c) of the success function g includes the steps of:

judging whether or not an increased storage region required to additionally store the values g(<p,r>,c) of the success function g for the remarked state <p,r> and all of the referential characters c is smaller than the fixed storage region; and defining the values g(<p,r>,c) of the success function g on condition that the increased storage region is equal to or smaller than the fixed storage region.

21. A document retrieving apparatus for collating strings of external characters written in an input document with one or more strings of referential characters and finding out one or more strings of external characters respectively agreeing with one of the strings of referential characters, comprising:

pattern matching machine transforming means for transforming, according to a transforming method, a pattern matching machine in which the number of states <p,r> is finite, a referential characters c takes the pattern matching machine from a current state s to a next state g(s,c) and an output μ(s) is output from the next state g(s,c) in cases where a value g(s,c) of a success function g is defined, and a referential characters c takes the pattern matching machine from the current state s to a next state g(h,c) (where h=f(f(...f(s)...))) determined by repeating a process that a value f(s) of the failure function f is calculated and the value f(s) is rewritten to the symbol s until a value g(h,c) of the success function g is defined in cases where the value g(s,c) of the success function g is not defined, the transforming method comprising the steps of counting the number of state-transitions performed by applying the failure function f for each of current states and each of referential characters while operating the pattern matching machine, the referential characters taking the pattern matching machine from the current states to next states, halting the operation of the pattern matching machine in cases where the number of state-transitions from a particular current state <p,r> to a particular next state f(<p,r>) for a particular referential characters c reaches a fixed number of times, a state set p being defined as a non-empty subset of a finite state set Q of a nondeterministic finite-state machine, and a set r being defined as a subset of a finite state S of the pattern matching machine, expressing the particular current state <p,r> by a symbol P denoting a remarked state, obtaining a value h=f(f(...f(P)...)) by repeating a process that a value f(P) of the failure function f for the remarked state P is calculated and the value f(P) is rewritten to the symbol P denoting a remarked state newly defined until a value g(h,c) of the success function g is defined in the pattern matching machine, defining a value g(<p,r>,c) of the success function g as g(h,c) to determine a next state g(<p,r>,c)=g(h,c) for the particular current state <p,r> and the particular referential characters c, storing the next state g(<p,r>,c), and restarting the operation of the pattern matching machine;

input document storing means for storing a plurality of strings of external characters written in an input document and outputting time-sequentially remarked characters Cr selected from the external characters one by one;

success function storing means for storing values of the success function g defined in the pattern matching machine transforming means;

failure function storing means for storing values of the failure function g defined in the pattern matching machine transforming means;

state recording means for recording a particular state St=g(t1,Cr) denoting a next state in cases where a value g(t1,Cr) of the success function g for a current state t1 of the pattern matching machine and a remarked character Cr output from the input document storing means is defined in the success function storing means, and recording a particular state St=g(f(f(...f(t1)...)),Cr) denoting a next state in cases where a value g(t1,Cr) of the success function g for a current state t1 of the pattern matching machine and a remarked character Cr output from the input document storing means is not defined in the success function storing means, a value f(f(...f(t1)...)) being obtained by repeatedly finding out a value f(P) of the failure function g for a calculated result P while rewriting the value f(P) to the calculated result P in the failure function storing means until a value g(f(f(...f(t1)...)),Cr) of the success function g for the value f(f.(...f(t1)...)) is found out in the success function storing means, and the value g(f(f(...f(t1)...)), Cr) found out in the success function storing means being transferred to the state recording means; and action storing means for storing actions denoting outputs at the states of the pattern matching machine produced in the pattern matching machine constructing means and outputting particular actions corresponding to particular states St time-sequentially transferred from the state recording means, the particular actions being used to judge whether or not a string of remarked characters Cr relating to the particular states St is pattern-matched with one of the strings of referential characters.

* * * * *